United States Patent [19]

Kodosky et al.

[11] Patent Number: 4,901,221
[45] Date of Patent: Feb. 13, 1990

[54] GRAPHICAL SYSTEM FOR MODELLING A PROCESS AND ASSOCIATED METHOD

[75] Inventors: Jeffrey L. Kodosky; James J. Truchard, both of Austin, Tex.; John E. MacCrisken, Palo Alto, Calif.

[73] Assignee: National Instruments, Inc., Austin, Tex.

[21] Appl. No.: 851,569

[22] Filed: Apr. 14, 1986

[51] Int. Cl.$^4$ .................. G06F 3/00; G06F 15/60; G06G 7/48
[52] U.S. Cl. .................. 364/200; 364/300; 364/578; 364/221.2; 364/275; 364/237.5; 364/232.3; 340/734
[58] Field of Search ............. 364/200 MS File, 300, 364/900 MS File, 578; 340/721, 734

[56] References Cited

U.S. PATENT DOCUMENTS

| | | | |
|---|---|---|---|
| 4,064,394 | 12/1977 | Allen | 364/300 X |
| 4,315,315 | 2/1982 | Kossiakoff | 364/300 |
| 4,455,619 | 6/1984 | Masui et al. | 364/900 |
| 4,546,435 | 10/1985 | Herbert et al. | 364/300 |
| 4,656,603 | 4/1987 | Duhn | 364/900 |
| 4,663,704 | 5/1987 | Jones et al. | 364/138 X |
| 4,677,587 | 6/1987 | Zemany, Jr. | 364/900 |
| 4,695,968 | 9/1987 | Sullivan, II et al. | 364/578 |
| 4,725,970 | 2/1988 | Burrows et al. | 364/578 |
| 4,813,013 | 3/1989 | Dunn | 364/900 |

OTHER PUBLICATIONS

Sharp, J. A., *Data Flow Computing*, Ellis Horwood Limited, Chicester, England, 1985.
Martin, James and Carma McClure, *Diagramming Techniques for Analysts and Programmers*, Prentice-Hall, Inc., N.J., 1985, pp. 93–108 and 327–348.
Agerwala, Tilak and Arvind, "Data Flow Systems," *Computer*, Feb. 1982, pp. 10–13.
Ackerman, William B., "Data Flow Languages," *Computer*, Feb. 1982, pp. 15–25.
Davis, Alan L. and Robert M. Keller, "Data Flow Program Graphs," *Computer*, Feb. 1982, pp. 26–41.
Arvind and Kim P. Gostelow, "The U-Interpreter," *Computer*, Feb. 1982, pp. 42–49.
Watson, Ian and John Gurd, "A Practical Data Flow Computer," *Computer*, Feb. 1982, pp. 51–57.
Gajsku, D. D., D. A. Padua, D. J. Kuck, and R. H. Kuhn, "A Second Opinion on Data Flow Machines and Languages," *Computer*, Feb. 1982, pp. 58–69.

*Primary Examiner*—Raulfe B. Zache
*Assistant Examiner*—Florin Munteanu-Ramnic
*Attorney, Agent, or Firm*—Flehr, Hohbach, Test, Albritton & Herbert

[57] ABSTRACT

A method for programming a computer system having a display console for displaying images to control at least one of a virtual instrument and an instrument by the steps of displaying on the screen at least one first function-icon that references at least one first control module for controlling at least one first function; displaying on the screen at least one iteration-icon that references iteration control module for controlling multiple iterations of data flow; displaying on the screen at least one first input variable-icon that references at least one first input variable; displaying on the screen at least one first output variable-icon that references at least one first output variable; and assembling on the screen a first acyclic data flow diagram including the at least one first function-icon and the at least one iteration-icon and the at least one first input variable-icon and the at least one first output variable-icon, such that the diagram displays a first procedure for producing at least one value for the at least one first output variable-icon from at least one value for the at least one first input variable-icon, and such that the at least one iteration-icon in the diagram indicates multiple iterations of the at least one first function in the course of the first procedure.

125 Claims, 49 Drawing Sheets

FIG.—3

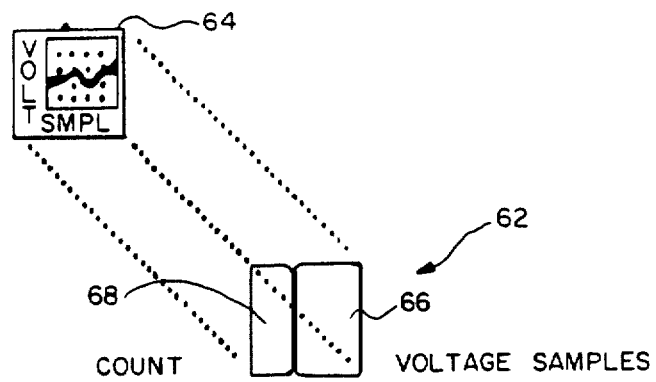
FIG.—6
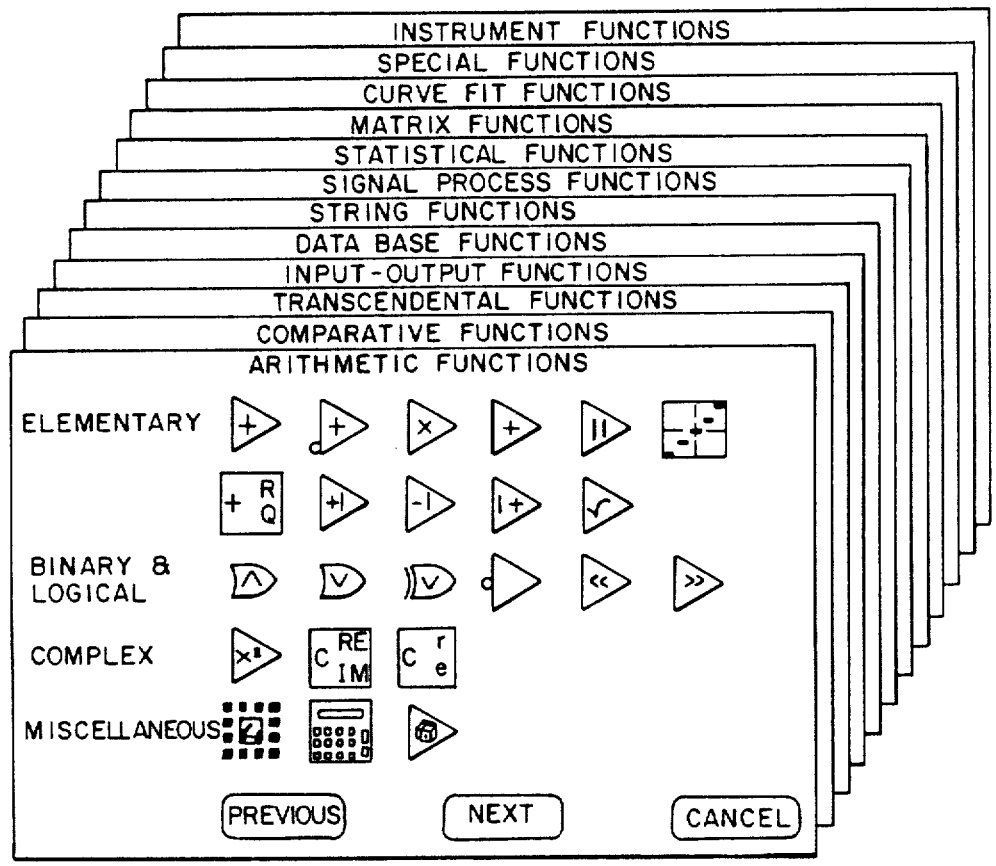
FIG.—7

SEQUENCE STRUCTURE

CONDITIONAL STRUCTURE

ITERATIVE LOOP STRUCTURE

INDEFINITE LOOP STRUCTURE

SHIFT REGISTER ON EACH LOOP STRUCTURE

LEGEND:

SYSTEM OBJECT ☐

SYSTEM CLASS ▨

ONE-TO-MANY ─────▶
(SOURCE CONTAINS ZERO OR MORE DESTINATION OBJECTS)

ONE-TO-ONE ─ ─ ─ ─▶
(SOURCE REFERENCES ZERO OR ONE DESTINATION OBJECTS)

FIG.–20A
BLOCK DIAGRAM
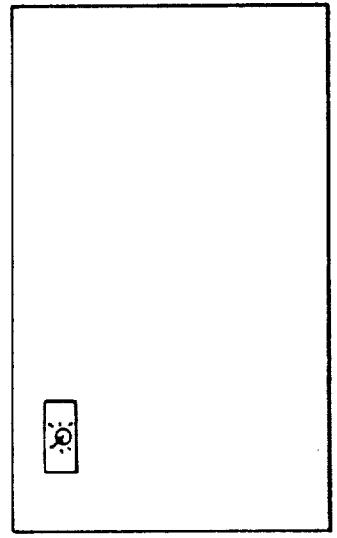
FRONT PANEL
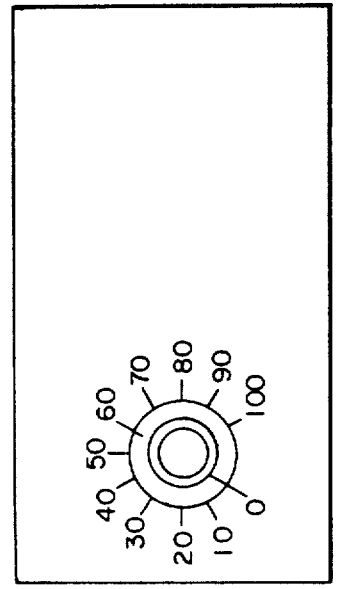
FIG.–20B
BLOCK DIAGRAM
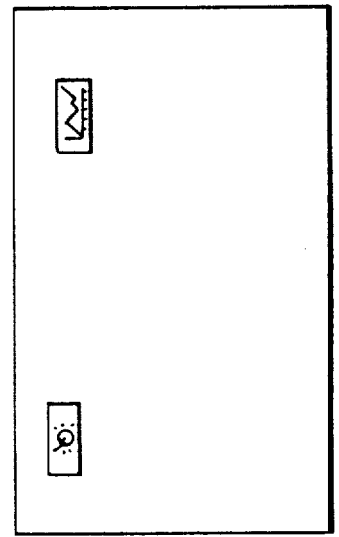
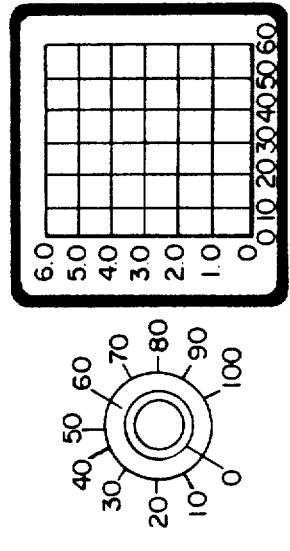

FIG.—20C
FIG.—20D
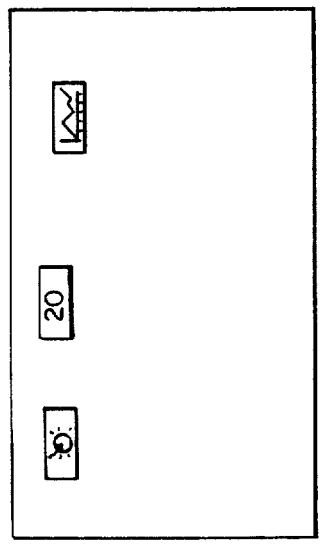
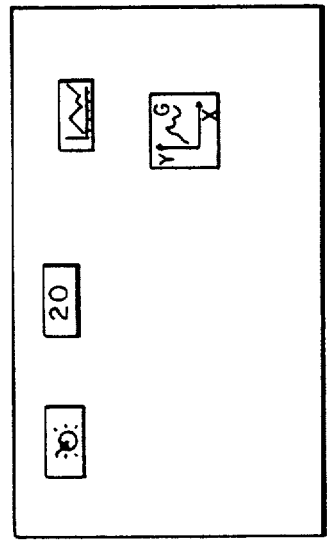
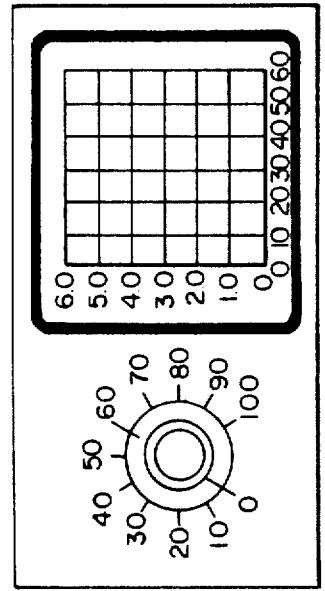
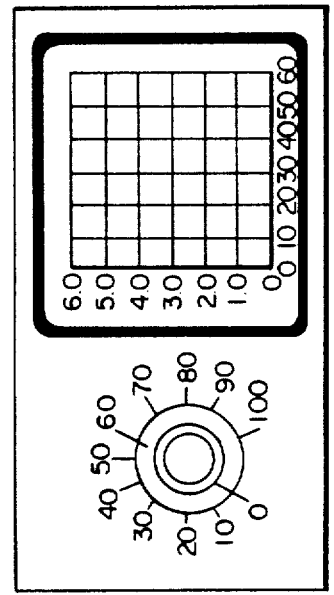

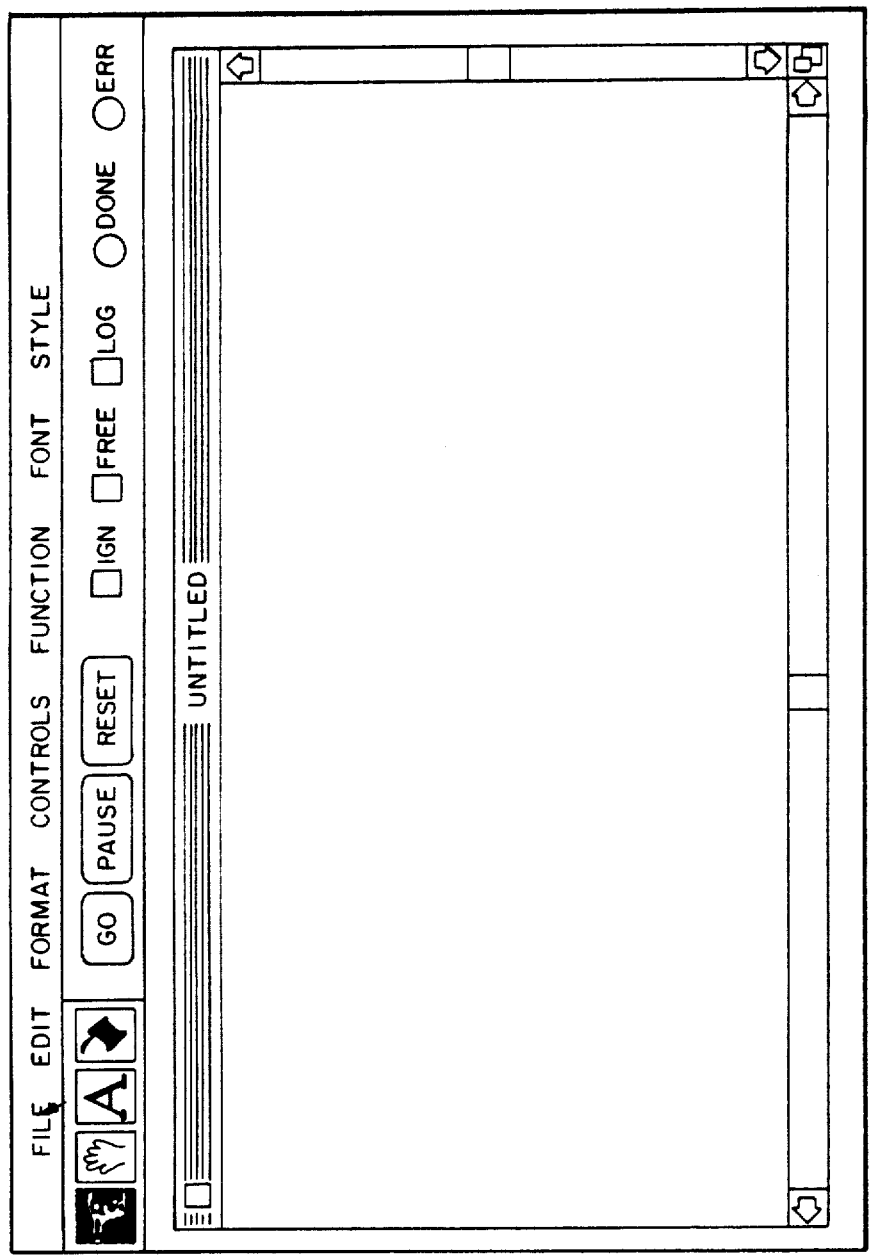
FIG.-23A
FIG.-23B

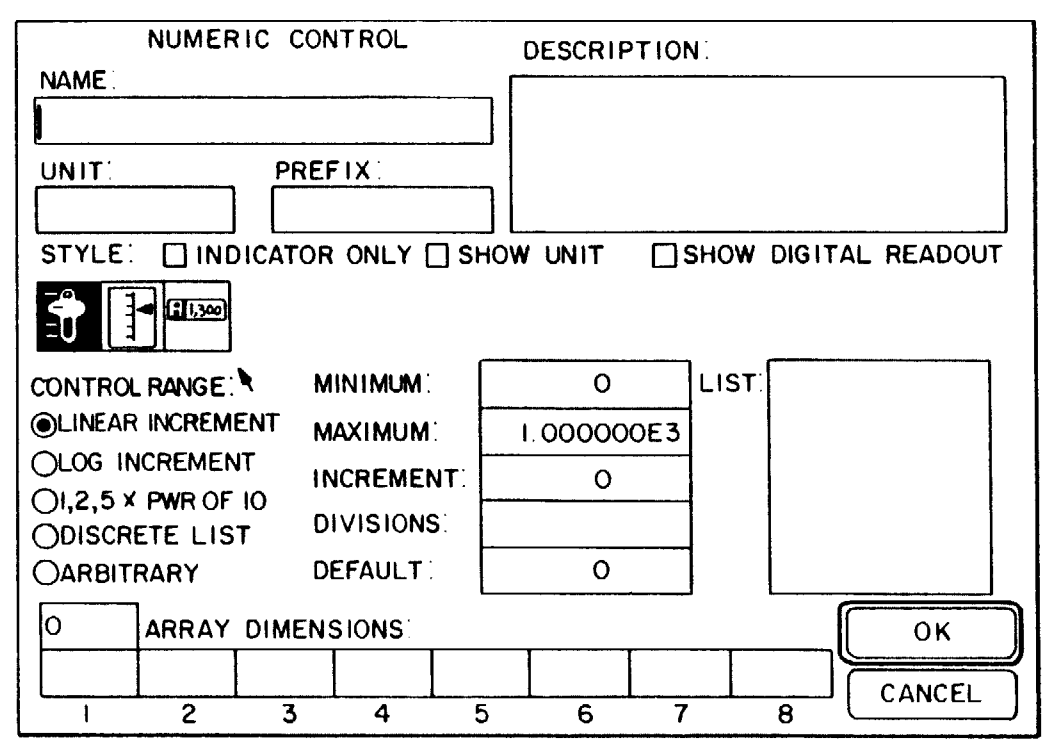

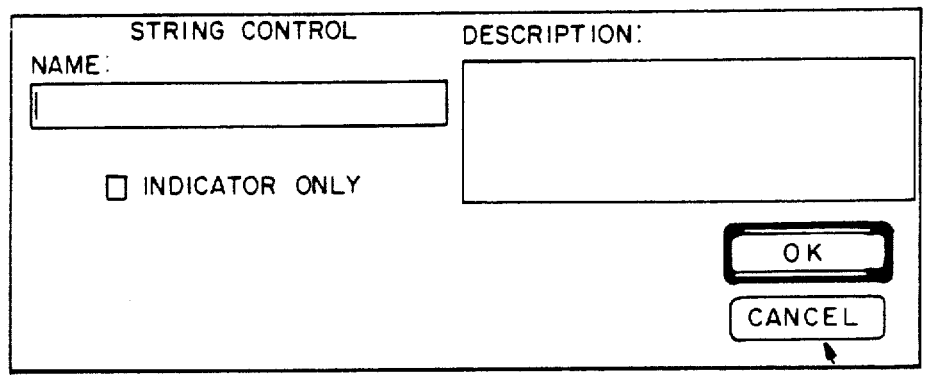
FIG.—29
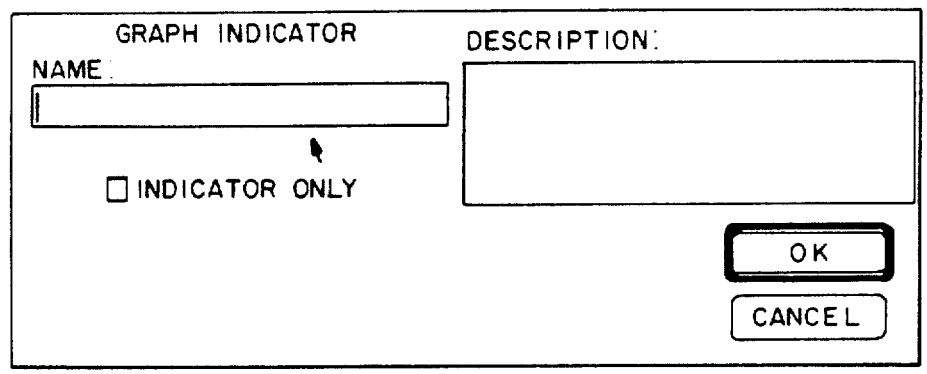
FIG.—30

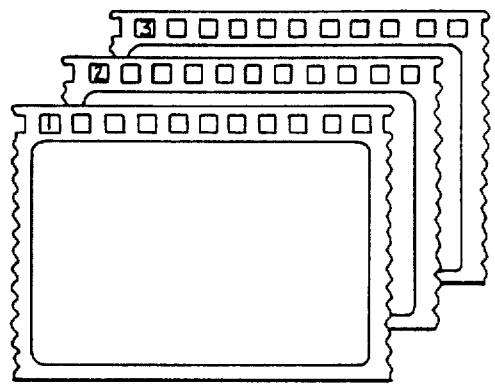
FIG.-33
FIG.-34
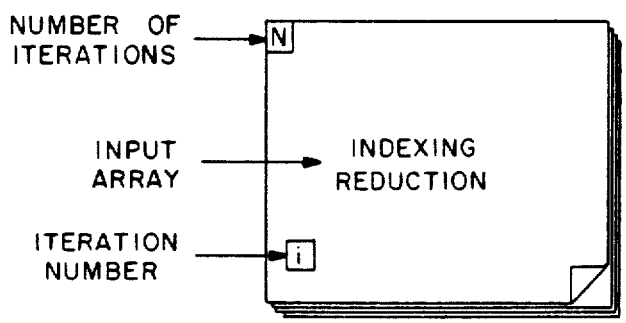
FIG.-35
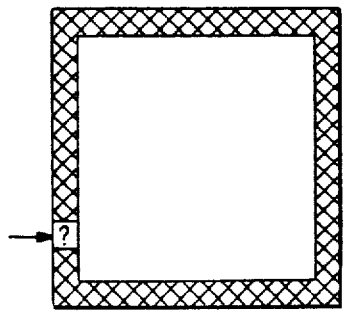
FIG.-36

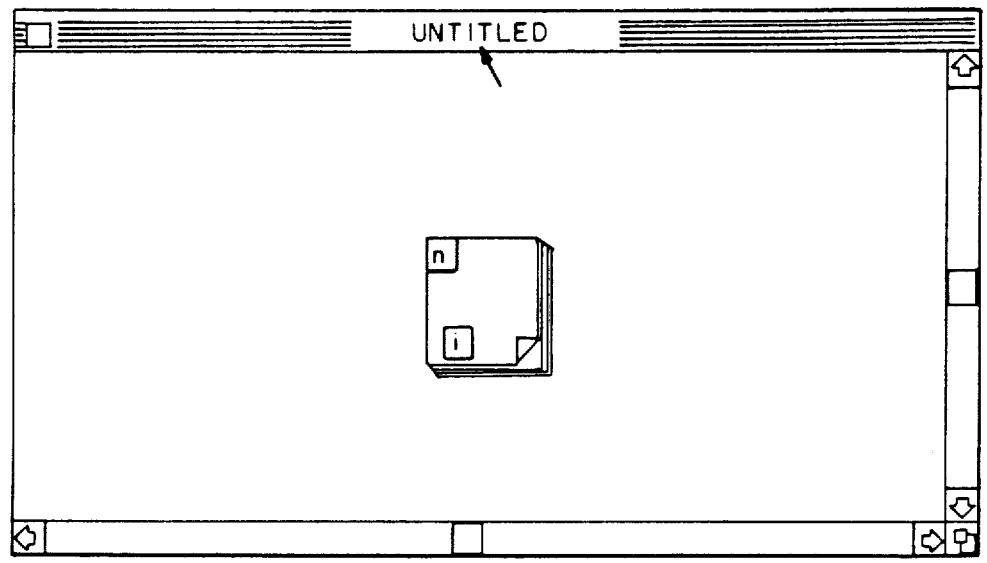
FIG.—40
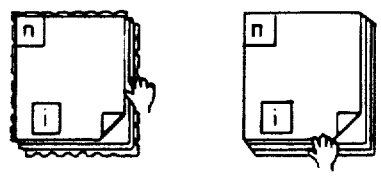
FIG.—41
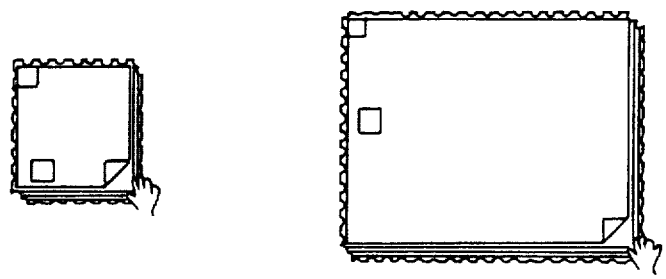
FIG.—42

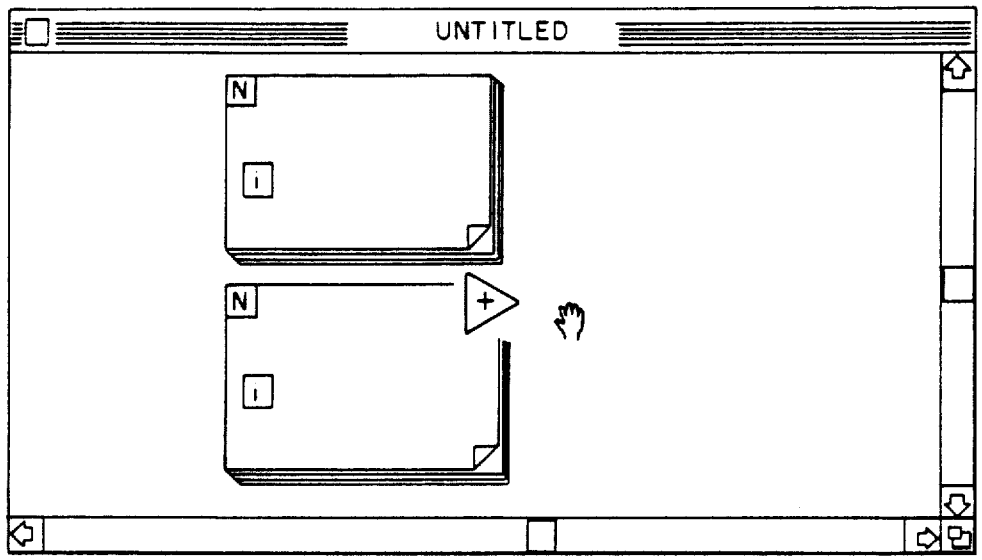
FIG.—45
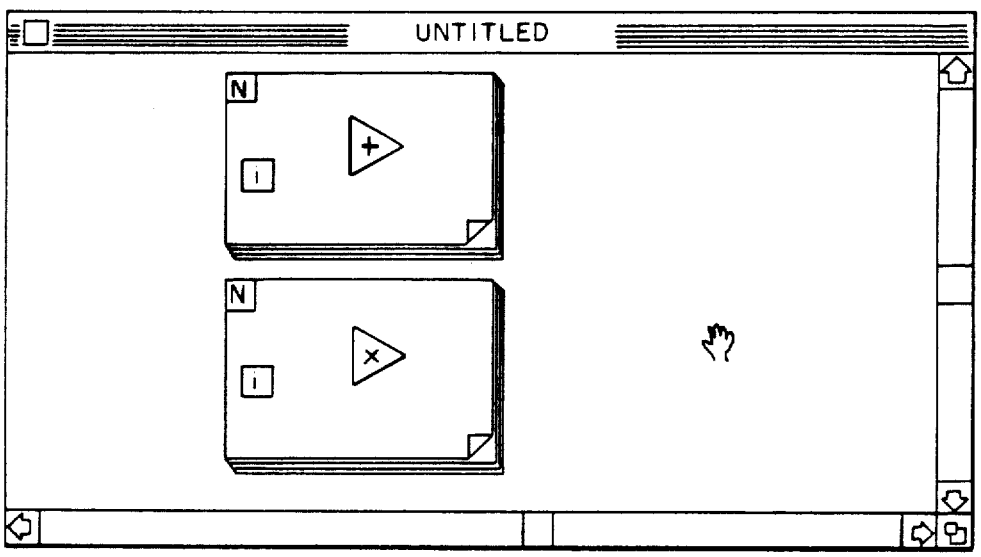
FIG.—46

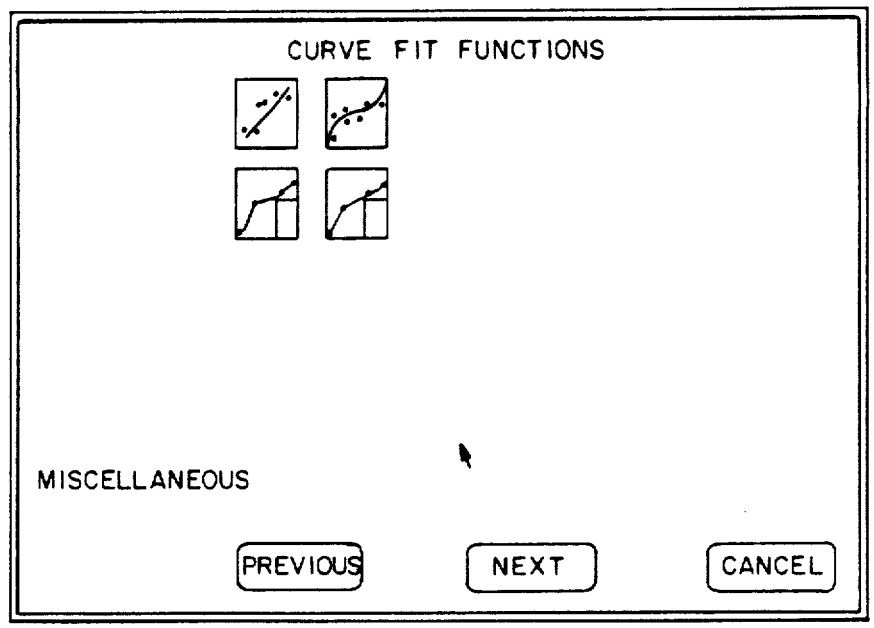
FIG.—47
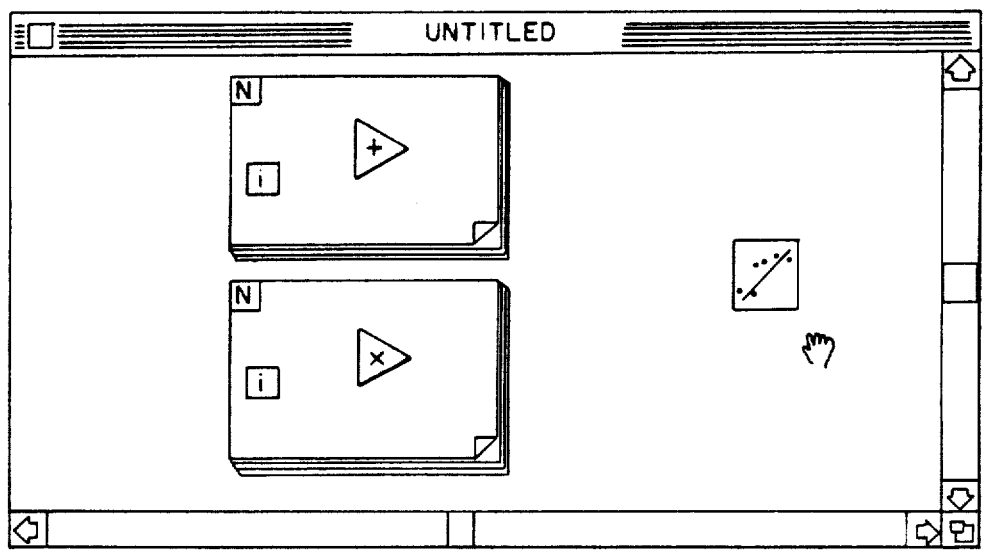
FIG.—48

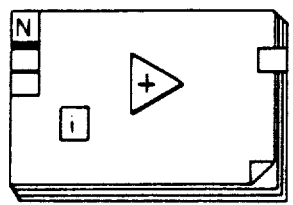
FIG.—49
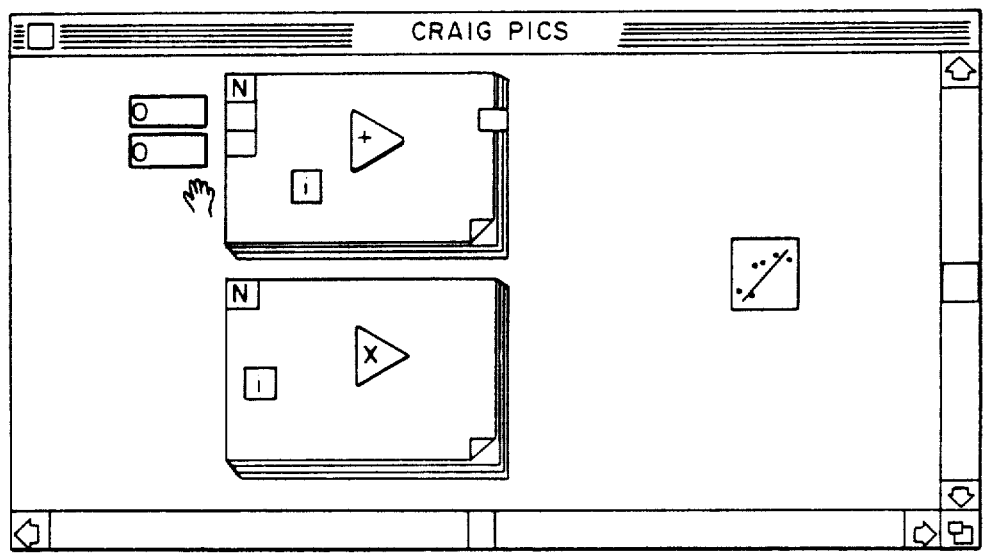
FIG.—50

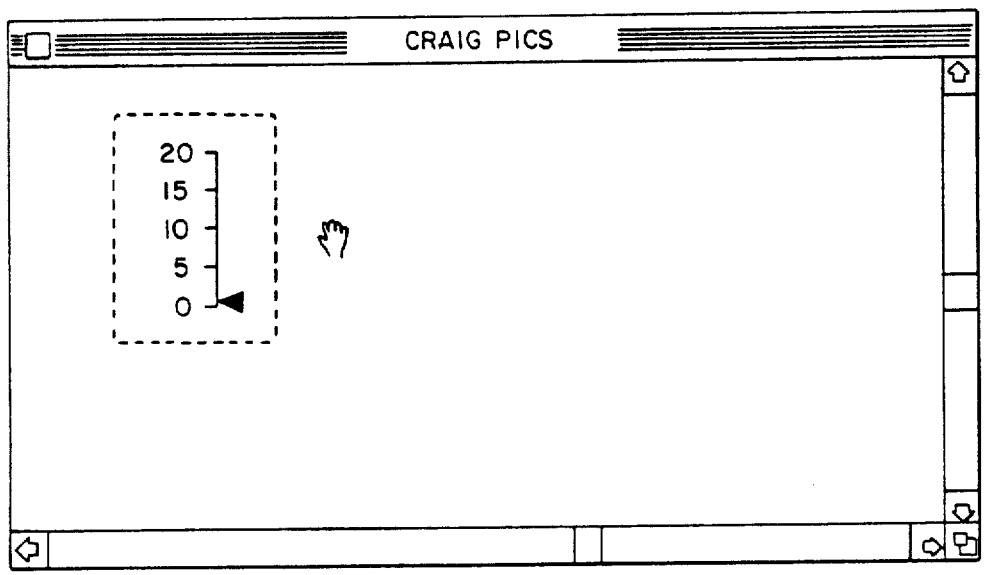
FIG.—51
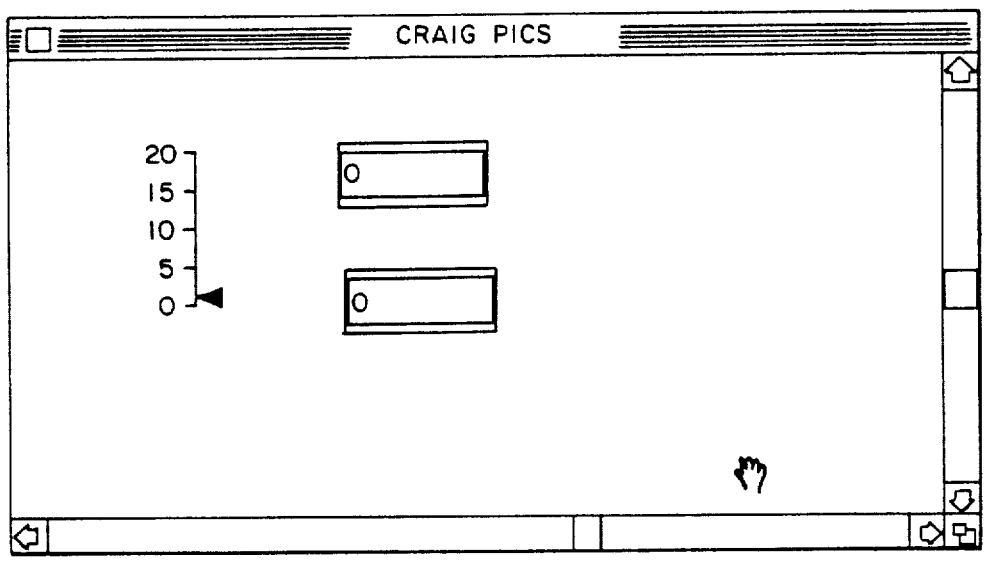
FIG.—52

ARITHMETIC FUNCTIONS

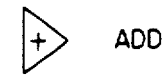 ADD

 SUBTRACT

 MULTIPLY

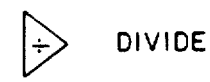 DIVIDE

c = a op b

COMPARATIVE FUNCTIONS

 EQUAL

 GREATER-THAN

 LESS-THAN

c = a op b

INPUT OUTPUT FUNCTIONS

 GPIB READ

 DUMMY INPUT STRING | NUMERIC OUTPUT

 GPIB WRITE

 COMMAND STRING ADDRESS STRING | DUMMY OUTPUT STRING

OTHER FUNCTIONS

 STRING BUILDSTRING

 FREQUENCY AMPLITUDE | POWER SUPPLY COMMAND STRING

 SIGNAL PROCESS RAMP GENERATOR

 STEPS | RAMP

 CURVE FIT LINEAR FIT

 y-ARRAY x-ARRAY | LINEAR FIT GRAPH

FIG.—56

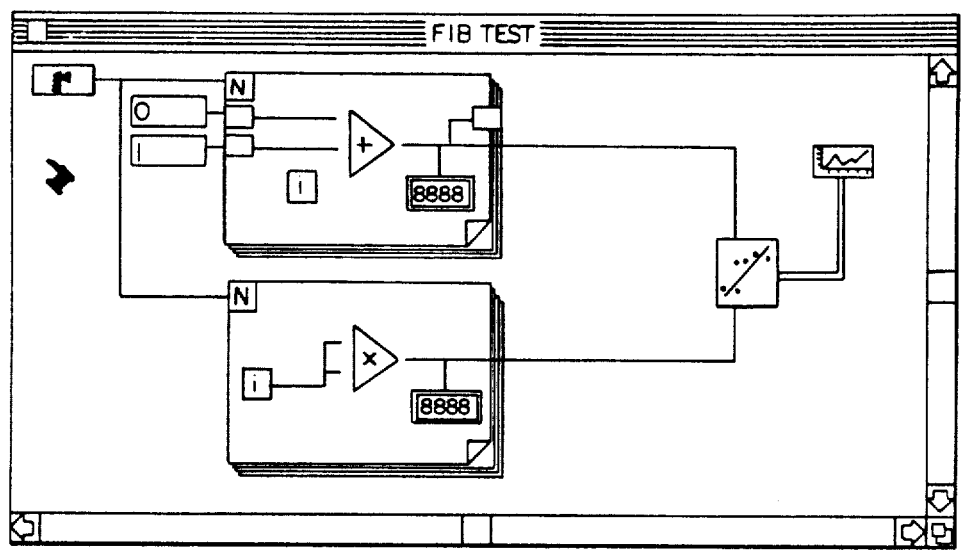
FIG.—57
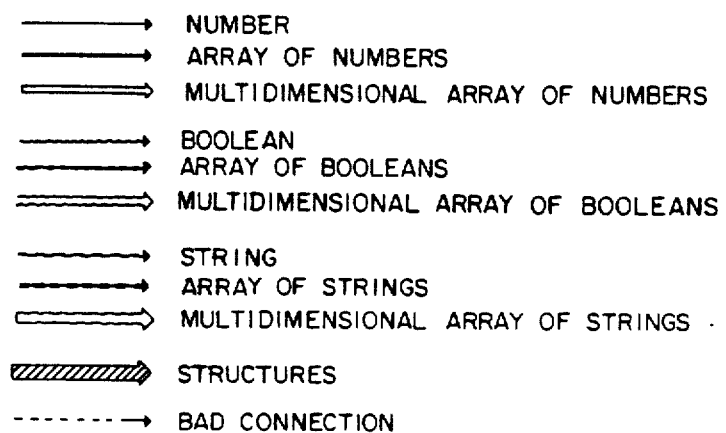
FIG.—58

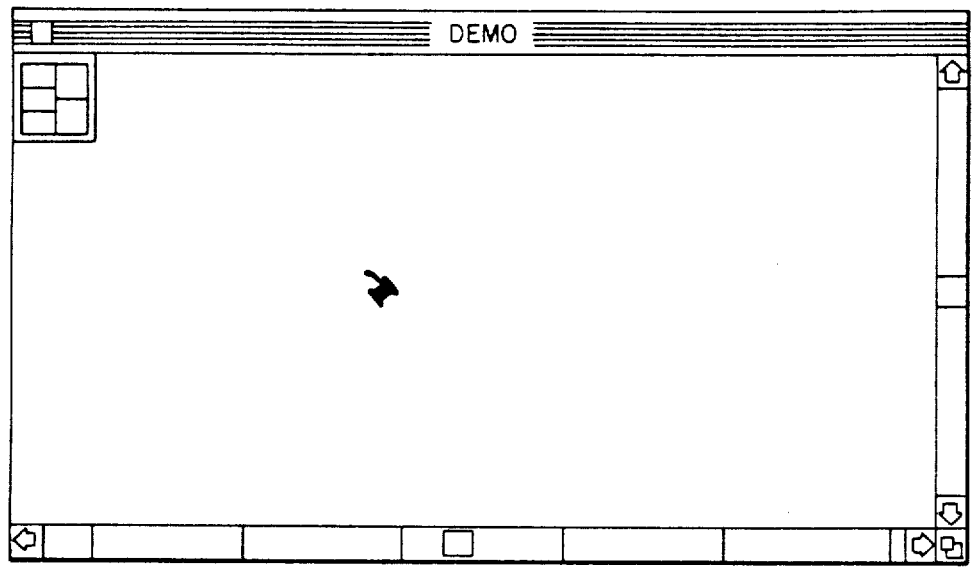
FIG. —63
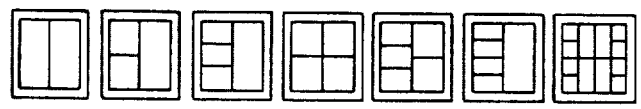
FIG. —64

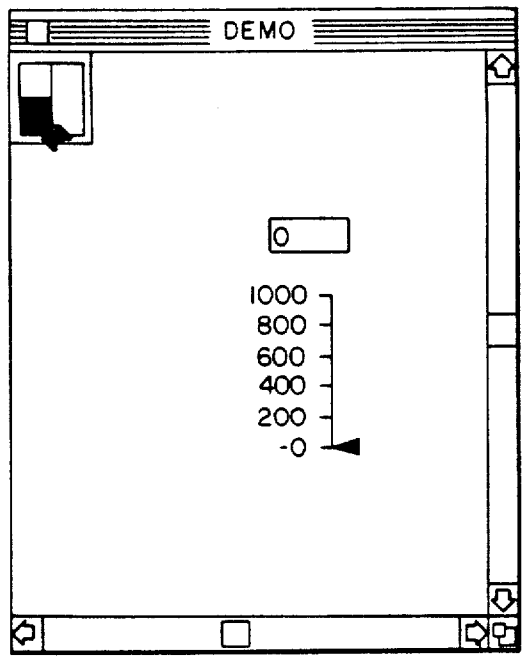
FIG.—65A
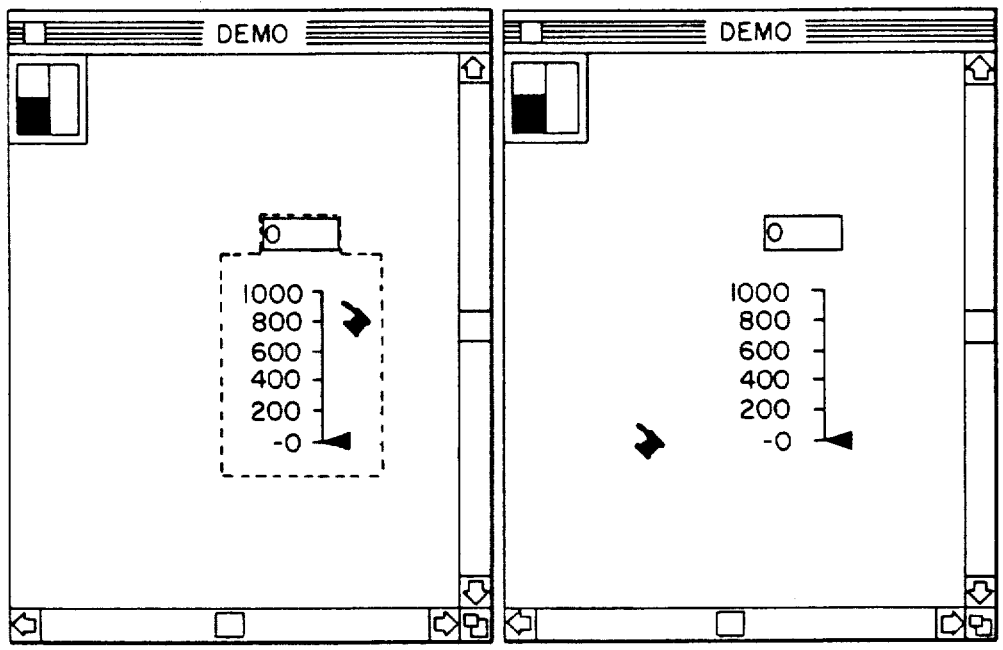
FIG.—65B FIG.—65C

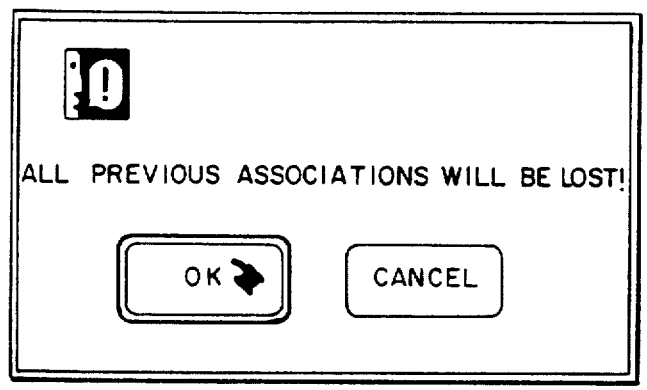
FIG.—66
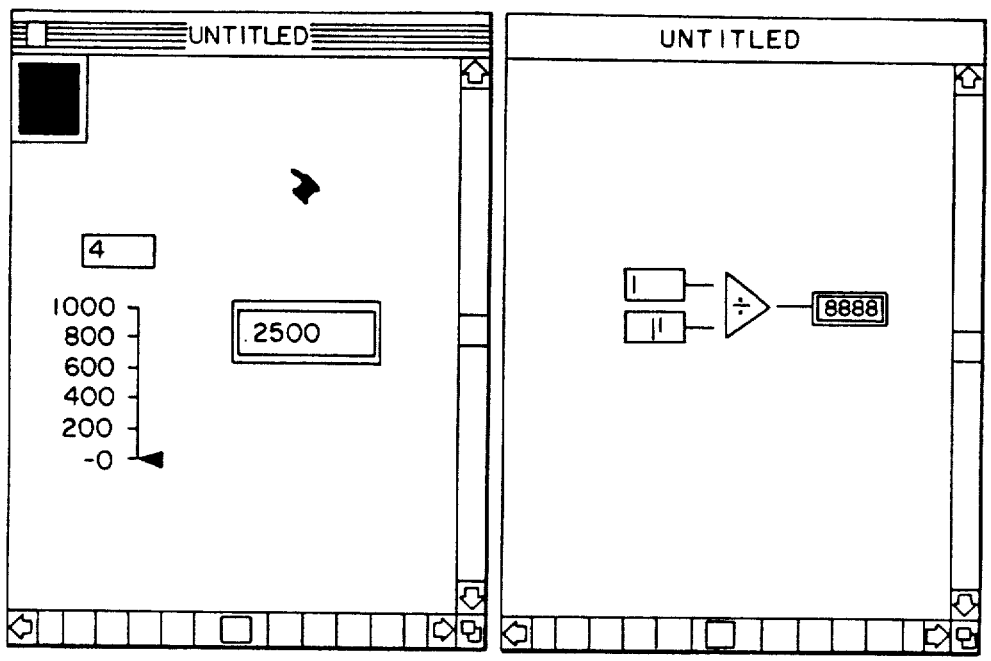
FIG.—67  FIG.—68

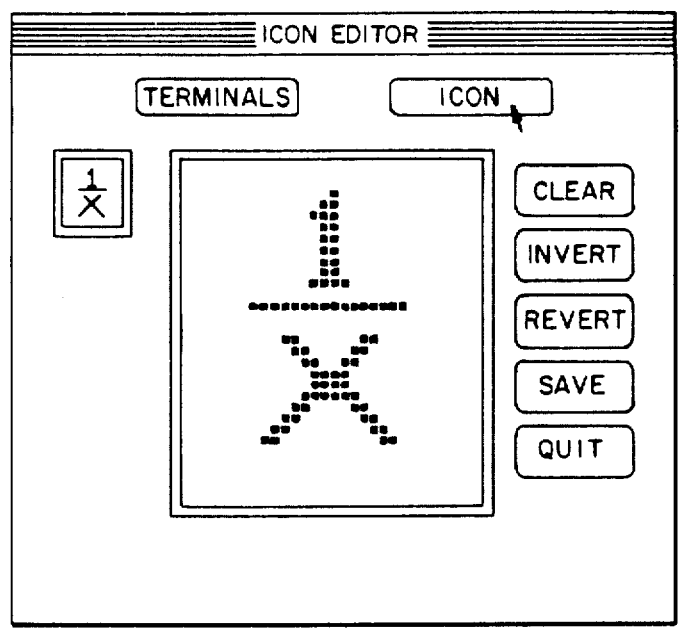
FIG.—69
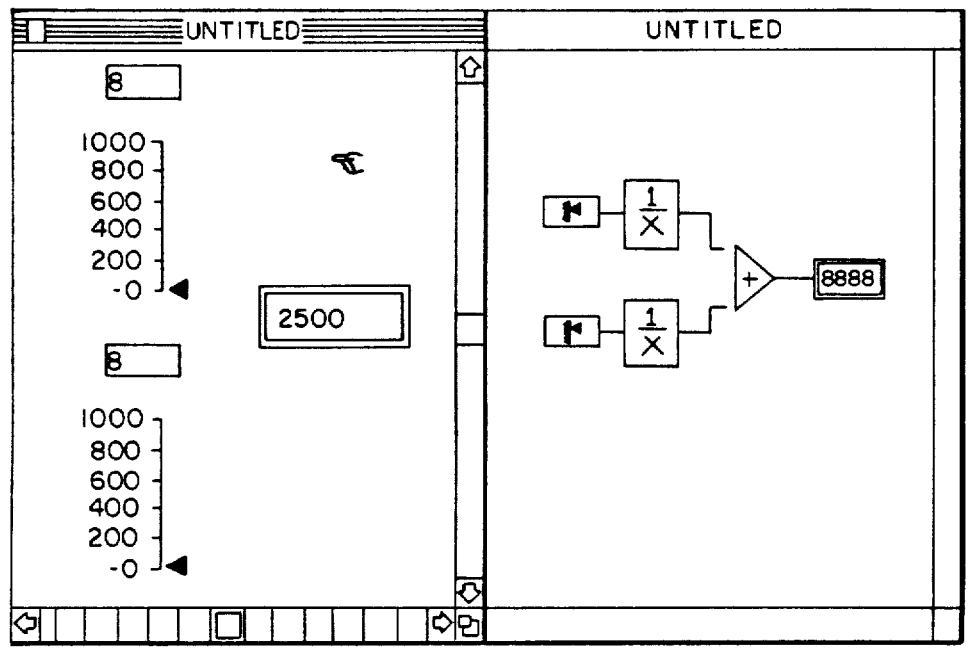
FIG.—70

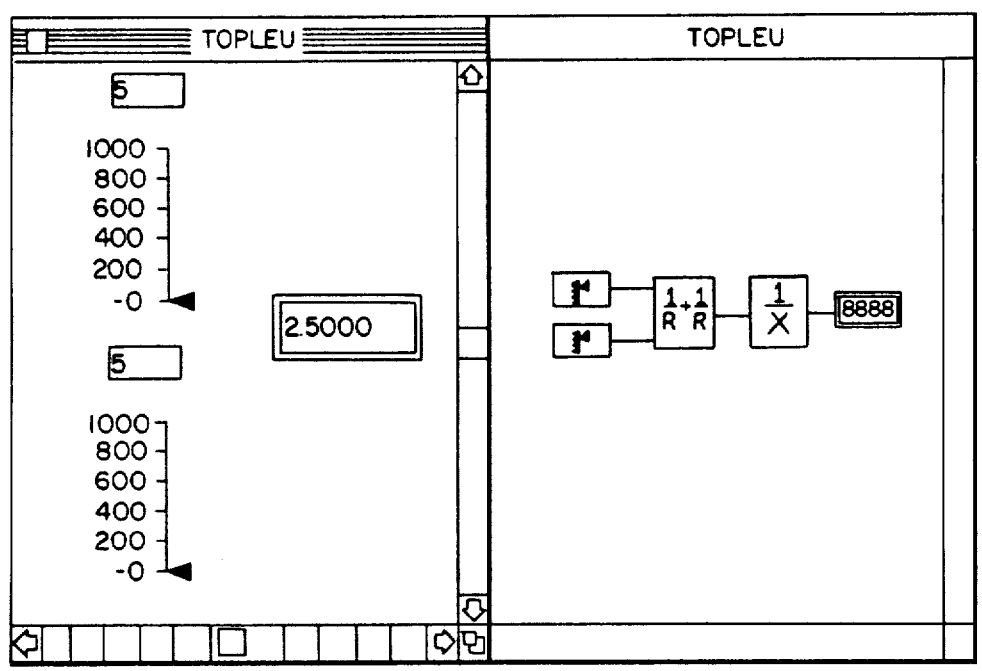
FIG.—74
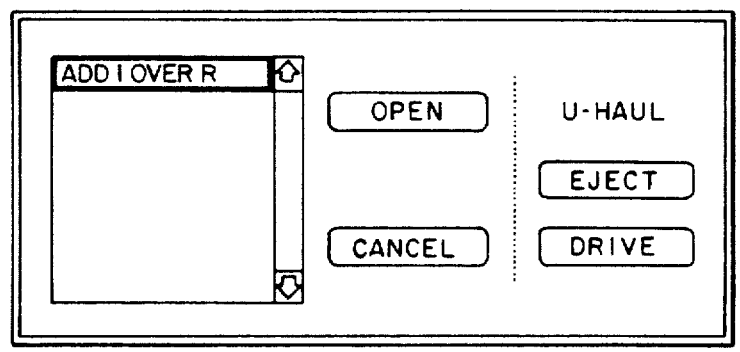
FIG.—75

GRAPHICAL SYSTEM FOR MODELLING A PROCESS AND ASSOCIATED METHOD

RESERVATION OF COPYRIGHT

A portion of the disclosure of this patent document contains material to which a claim of copyright protection is made. The copyright owner has no objection to the facsimile reproduction by anyone of the patent document or the patent disclosure, as it appears in the Patent and Trademark Office patent file or records, but reserves all other rights whatsoever.

BACKGROUND OF THE INVENTION

1. Field of the Invention

The present invention relates to systems for modeling processes and more particularly to computer systems for modeling processes.

2. Description of the Related Art

Currently there is a strong movement toward very high level programming languages which can enhance programmer productivity by making a programming task more understandable and intuitive. The increasing use of computers by users who are not highly trained in computer programming techniques has lead to a situation in which the user's programming skills and ability to interact with a computer system often become a limiting factor in the achievement of optimal utilization of the computer system.

There are numerous subtle complexities which a user often must master before she can efficiently program a computer system. For example, typical earlier computer systems generally comprise software subsystems which include multiple programs, and such programs often utilize one or more subroutines. Software systems typically coordinate activity between multiple programs, and each program typically coordinates activity between multiple subroutines. However, techniques for coordinating multiple programs generally differ from techniques for coordinating multiple subroutines. Furthermore, since programs ordinarily can stand alone while subroutines usually cannot, techniques for linking programs to a software system generally differ from techniques for linking subroutines to a program. Complexities such as these often make it difficult for a user, who although she may be a specialist in her field is not a specialist in the computer field, to efficiently make use of powerful computer systems which are available for her use.

The task of programming a computer system to model a process often is further complicated by the fact that a sequence of mathematical formulas, mathematical steps or other procedures customarily used to conceptually model such a process often does not closely correspond to the traditional programming techniques used to program a computer system to model such a process. For example, a user of a computer system frequently develops a conceptual model for a physical system which can be partitioned into functional blocks, each of which corresponds to actual systems or subsystems. Computer systems, however, ordinarily do not actually compute in accordance with such conceptualized functional blocks. Instead, they often utilize calls to various subroutines and retrievals of data from different memory storage locations to implement a procedure which could be conceptualized by a user in terms of a functional block. Thus, a user often must substantially master different skills in order to both conceptually model a system and then to cause a computer system to model that system. Since a user often is not fully proficient in techniques for causing a computer system to implement her model, the efficiency with which the computer system can be utilized to perform such modelling often is reduced.

One particular field in which computer systems are employed to model physical systems is the field of instrumentation. An instrument typically collects information from an environment. Some of the types of information which might be collected by respective instruments, for example, include: voltage, distance, velocity, pressure, frequency of oscillation, humidity or temperature. An instrumentation system ordinarily controls its constituent instruments from which it acquires data which it analyzes, stores and presents to a user of the system. Computer control of instrumentation has become increasingly desirable in view of the increasing complexity and variety of instruments available for use.

In recent years, increasing effort has been directed toward providing more efficient means for implementing instrumentation systems. The task has been complicated by the fact that such systems include arbitrary combinations of hardware instruments and software components. The need for more efficient means of implementation has been prompted by increasing demands for automated instrumentation systems and an increasing variety of hardware and software combinations in use.

In the past, many instrumentation systems comprised individual instruments physically interconnected. Each instrument typically included a physical front panel with its own peculiar combination of indicators, knobs, or switches. A user generally had to understand and manipulate individual controls for each instrument and record readings from an array of indicators. Acquisition and analysis of data in such instrumentation systems was tedious and error prone. An incremental improvement in user interface was made with the introduction of centralized control panels. In these improved systems, individual instruments were wired to a control panel and the individual knobs, indicators or switches of each front panel were either preset or were selected to be presented on a common front panel.

Another significant advance occurred with the introduction of computers to provide more flexible means for interfacing instruments with a user. In such computerized instrumentation systems the user interacted with a software program of the computer system through a terminal rather than through a manually operated front panel. These earlier improved instrumentation systems provided significant performance efficiencies over earlier systems for linking and controlling test instruments.

Additional problems soon developed, however. Computer programs used to control such improved instrumentation systems had to be written in conventional textual programming language such as, for example, machine code, FORTRAN, BASIC, Pascal, or ATLAS. Traditional users of instrumentation systems, however, often were not highly trained in programming techniques and, therefore, implementation of such systems frequently required the involvement of a programmer to write software for control and analysis of instrumention data. Thus, development and maintenance of the software elements in these instrumentation systems often proved to be difficult.

Some reasons for the difficulties associated with earlier computerized instrumentation systems included, for example: (1) textual programming languages were nonintuitive and unfamiliar to the instrumentation system user; (2) traditional programming languages did not readily support the parallel activity of multiple individual instruments; (3) concepts embodied in a computer program often were significantly different from concepts embodied in an instrumentation system's instrument hardware; (4) computer program software modules often did not match an instrumentation system's hardware modularity making interchangeability of software and hardware difficult; and (5) techniques for designing, constructing, and modifying computer software were significantly different from corresponding techniques for developing an instrument hardware system.

A general type of program design technique involves data flow diagramming. Data flow diagramming typically involves an ordering of operations which is not specifically specified by a user but which is implied by data interdependencies. An advantage of data flow diagramming is that it introduces parallelism into a computer system which, of course, usually increases the speed and efficiency of the system. However as a designs technique, data flow diagramming has had difficulty representing conditional or iterative functions. Thus, designing using data flow techniques has been difficult.

Current attempts to develop text based flow software systems generally have been unsuccessful. This lack of success may be due to difficulties in perceiving parallels between text based software and actual data flow, and it may be due to the fact that the text form of data flow generally suffered from the same difficulties in representing conditional and iterative functions as did the diagram form of data flow.

Thus, there exists a need for a system which can be relatively easily programmed for use in modelling a process. Furthermore, there exists a need for an instrumentation system utilizing such a system. There exists a need for such a system which employs data flow techniques and overcomes the difficulties in representing conditional and iterative functions. The present invention meets these needs. Finally, there exists a need for such a system which represents data flow graphically rather than textually.

SUMMARY OF THE INVENTION

The present invention provides a system for modelling a process. A process typically can be characterized by one or more input variables and one or more output variables. The system includes a computer. It also includes an editor for displaying at least one diagram and for constructing execution instructions. The diagram graphically displays a procedure by which the one or more input variables can produce the one or more output variables. It also results in the construction of execution instructions which characterize an execution procedure which substantially corresponds to the displayed procedure. The system also includes an execution subsystem for assigning respective values for the one or more input variables and for executing the execution instructions to produce respective values for the one or more output variables.

The invention also provides a method for electronically modelling a process. A process typically can be characterized by a reception of one or more input variables and a provision of one or more output variables. The method includes the step of electronically constructing at least one diagram display such that the diagram display graphically displays a procedure by which the one or more input variables can produce the one or more output variables. In response to the step of electronically constructing the diagram display, execution instructions are electronically constructed which characterize an execution procedure which substantially corresponds to the displayed procedure. Respective values are assigned for the respective input variables. The execution instructions are electronically executed to produce respective values for respective output variables.

These and other features and advantages of the present invention will become more apparent from the following detailed description of exemplary embodiments thereof, as illustrated in the accompanying drawings.

BRIEF DESCRIPTION OF THE DRAWINGS

The purpose and advantages of the present invention will be apparent to those skilled in the art from the following detailed description in conjunction with the appended drawings in which:

FIG. 6 shows an illustrative icon produced using the icon editor of the instrumentation system of FIG. 4;

FIG. 7 shows an illustrative representation of an icon library which can be stored in a memory and used to construct a block diagram using the block diagram editor of the instrumentation system of FIG. 4;

FIG. 19a illustrates a virtual instrument data structure diagram used by the first system of FIG. 1, the second system of FIG. 2 and the instrumentation system of FIG. 4;

FIG. 19b shows a legend applicable to the illustration of FIG. 19a;

FIGS. 20a-l illustrate computer terminal displays during each successive step in a construction of an exemplary block diagram using the block diagram editor of FIGS. 2 or 4;

FIG. 23a shows the PROTO icon;

FIG. 23b illustrates the startup screen with empty front panel window;

FIG. 28 illustrates the NUMERIC control dialog box;

FIG. 29 is an illustration of the STRING control dialog box;

FIG. 30 shows the GRAPHICAL dialog box;

FIG. 33 illustrates FUNCTION menu from Block-Diagram window;

FIG. 34 shows a graphical representation of a sequence structure;

FIG. 35 shows a graphical representation of a for loop structure;

FIG. 36 shows a graphical representation of a case selection structure;

FIG. 40 illustrates a "for" loop structure layed down in the active block diagram window by selecting a glyph from the dialog box shown in FIG. 39;

FIG. 41 illustrates selection regions on structure glyphs (Moving dashed box encircles a glyph when it is selected);

FIG. 42 illustrates that the the left side shows the proper position for placement of the grabber tool for resizing the structure glyph (Click-dragging produces the result shown in the right side of the figure. Release the mouse button and the enlarged structure will remain in place);

FIG. 45 shows a block diagram window after addition function was chosen from dialog box show in FIG. 44;

FIG. 46 shows a block diagram window with addition and multiplication functions placed inside loop structures;

FIG. 47 shows a dialog box obtained by choosing CURVE FIT from the FUNCTIONS menu.

FIG. 48 shows a block diagram window with CURVE-FIT object in place;

FIG. 49 illustrates loop structure with shift register installed;

FIG. 50 is an illustration of the final positions of constant objects alongside the inputs to the shift register;

FIG. 51 shows a pointer control in the front panel window obtained from the dialog box displayed by choosing the NUMERIC option from the CONTROLS menu;

FIG. 52 shows the front panel window with one pointer control and two indicator controls;

FIG. 56 illustrates "hot spots" for available functions;

FIG. 57 is an illustration of the wired Fibonacci virtual instrument block diagram;

FIG. 58 is an illustration of examples of data types and their block diagrams representations;

FIG. 63 shows a terminal connector pane displayed in the upper left-had corner of the active window by choosing CONNECTOR PANE option from the FORMAT menu;

FIG. 64 is an illustration of available arrangements of connector terminals;

FIG. 65a is an illustration of the front panel window with selected terminal in connector pane;

FIG. 65b is an illustration of the highlighted terminal and control to be connected;

FIG. 65c is an illustration of the connection between the established terminal and control;

FIG. 66 is an illustration of the dialog box warning of consequences of clearing associations between controls and terminals;

FIG. 67 (left) is an illustration of the virtual instrument to invert value set by control and display result on indicator;

FIG. 68 (right) is an illustration of a diagram for a reciprocal virtual instrument;

FIG. 69 is an illustration of an icon for the reciprocal instrument;

FIG. 70 is an illustration of an instrument for taking reciprocal of and then adding two numbers;

FIG. 74 is an example solution for adding two resistances in parallel using two low-level, user-created virtual instruments in a hierarchical virtual instrument; and FIG. 75 is an illustration of an dialog box from INSTRUMENTS option in the FUNCTIONS menu displaying two user-created virtual instruments.

DESCRIPTION OF THE PREFERRED EMBODIMENTS

The present invention comprises a novel system and associated method for modelling a process. The following description is presented to enable any person skilled in the art to make and use the invention, and is provided in the context of particular applications and their requirements. Various modifications to the preferred embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
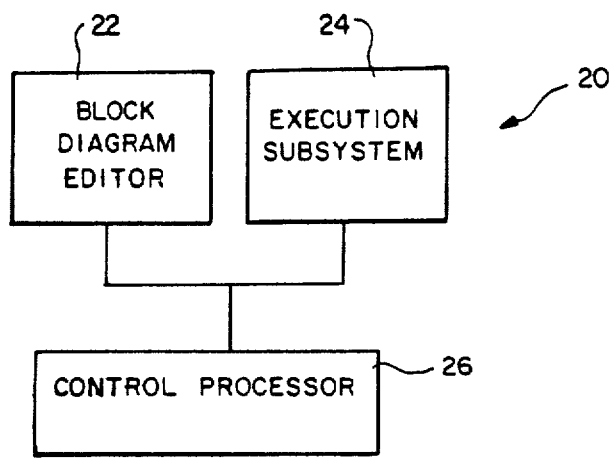
FIG. 1 shows a block diagram of a first system for modelling a process in accordance with the present invention.

Referring to the drawing of FIG. 1, there is shown a generalized block diagram 20 of a first system for modelling a process in accordance with the present invention. The first system 20 includes a block diagram editor 22, an execution subsystem 24 and a control processor 26. In the preferred embodiment, the block diagram editor 22 and the execution subsystem 24 are constructed in software.

As will be explained more fully below the block diagram editor 22 can be used to construct and to display a graphical diagram which visually and pictorially displays a procedure by which a value for an input variable can produce a value for an output variable. The procedure together with the input variable and output variable comprise a model of a process. Furthermore, the block diagram editor 22 constructs execution instructions which characterize an execution procedure which substantially corresponds to the displayed procedure. The execution subsystem 24 assigns at least one value to the input variable and executes the execution instructions to produce a value for the output variable. The control processor 26 implements the block diagram editor 22 and the execution subsystem 24 of the preferred embodiment.

Figure 2:
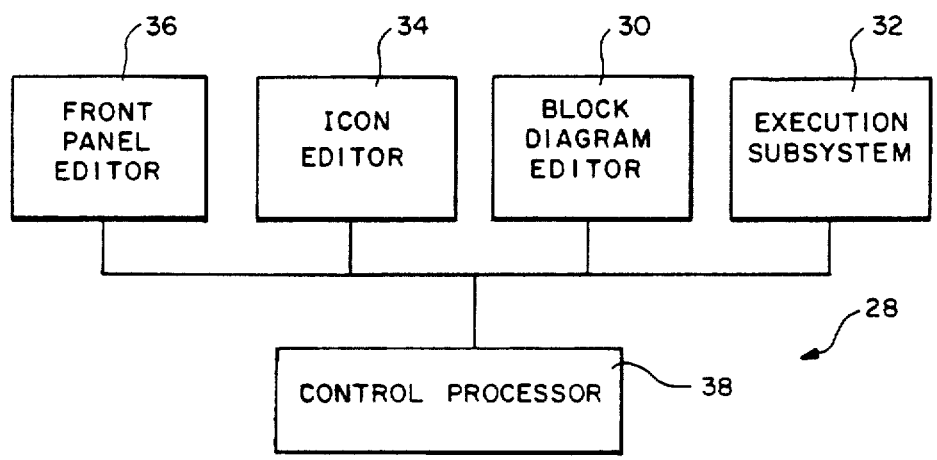
FIG. 2 shows a block diagram of a second system including the first system of FIG. 1.

The illustrative drawing of FIG. 2 shows a second system 28 for modelling a process in accordance with the present invention. The second system 28 includes a respective block diagram editor 30, and an execution subsystem 32 which are substantially identical to the block diagram editor 22 and the execution subsystem 24 of the first system 20. The second system 28 also includes an icon editor 34 and a front panel editor 36. The second system 28 also includes a control processor 38 which is substantially identical to that of the first system 20.

Figure 3:
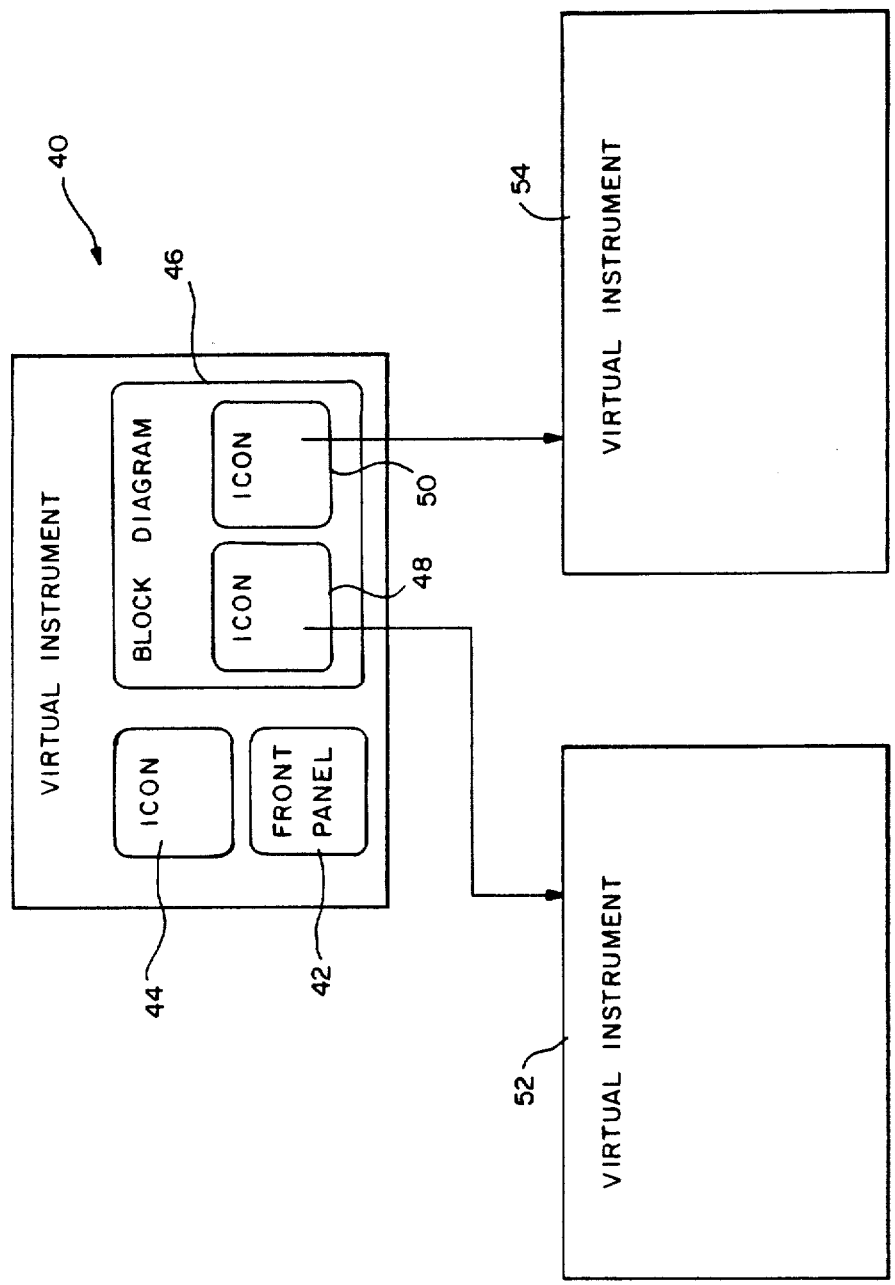
FIG. 3 is an illustrative drawing of a representation of a virtual instrument produced using the second system of FIG. 2.

The second system 28 permits a user to construct a virtual instrument 40 such as that represented in generalized form in the illustrative drawings of FIG. 3. The virtual instrument 40 includes a front panel 42 which permits interactive use of the virtual instrument 40 by a user. As will be explained more fully below, the front panel permits graphical representation of input and output variables provided to the virtual instrument 40. The virtual instrument 40 also includes an icon 44 which permits use of the virtual instrument 40 as a subunit in other virtual instruments (not shown). The virtual instrument 40 also includes a block diagram 46 which graphically provides a visual representation of a procedure by which a specified value for an input variable displayed in the front panel 42 can produce a corresponding value for an output variable in the front panel 42. The virtual instrument 40 itself is a hierarchical construction comprising within its block diagram 46 respective icons 48 and 50 referencing other virtual instruments indicated generally by respective blocks 52 and 54.

Figure 4:
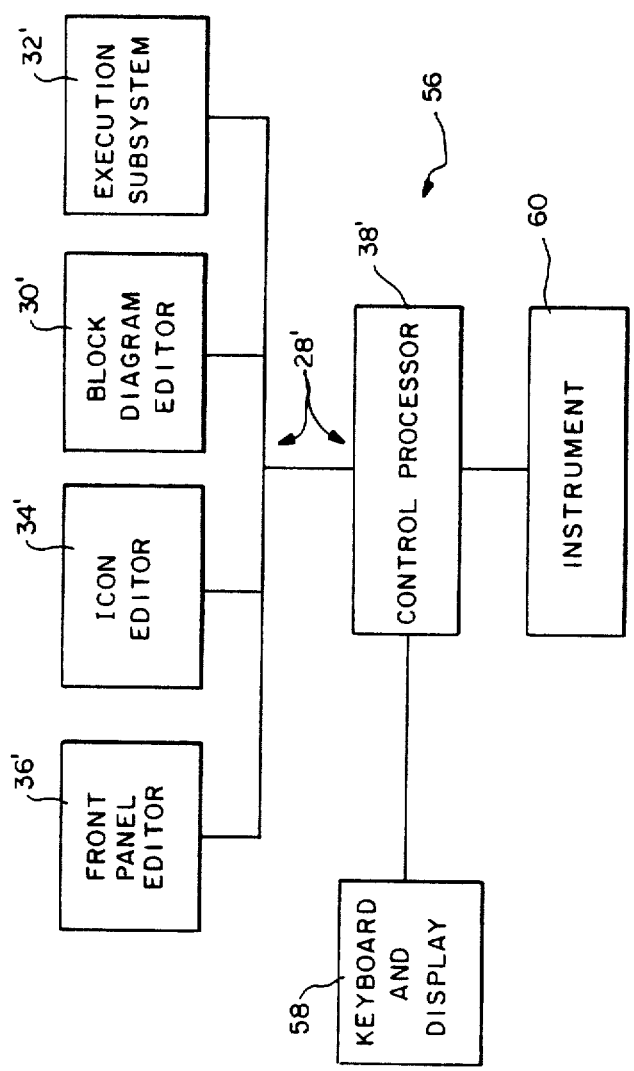
FIG. 4 shows a block diagram of an instrumentation system including the second system of FIG. 2.

The generalized block diagram of FIG. 4 shows an instrumentation system 56 incorporating the second system 28 shown in FIG. 2. Elements of the instrumentation system 56 which are substantially identical to those of the second system 28 are referenced by primed reference numerals identical to those of the second system 28. The instrumentation system 56 includes a keyboard and display 58 and an instrument 60. In a presently preferred embodiment, the control processor 38' and the keyboard and display 58 are implemented using a Macintosh Plus Computer manufactured by the Apple Computer Company of Cupertino, Calif. However, a Macintosh Computer also produced by the Apple Computer Company could be used instead.

Figure 5:
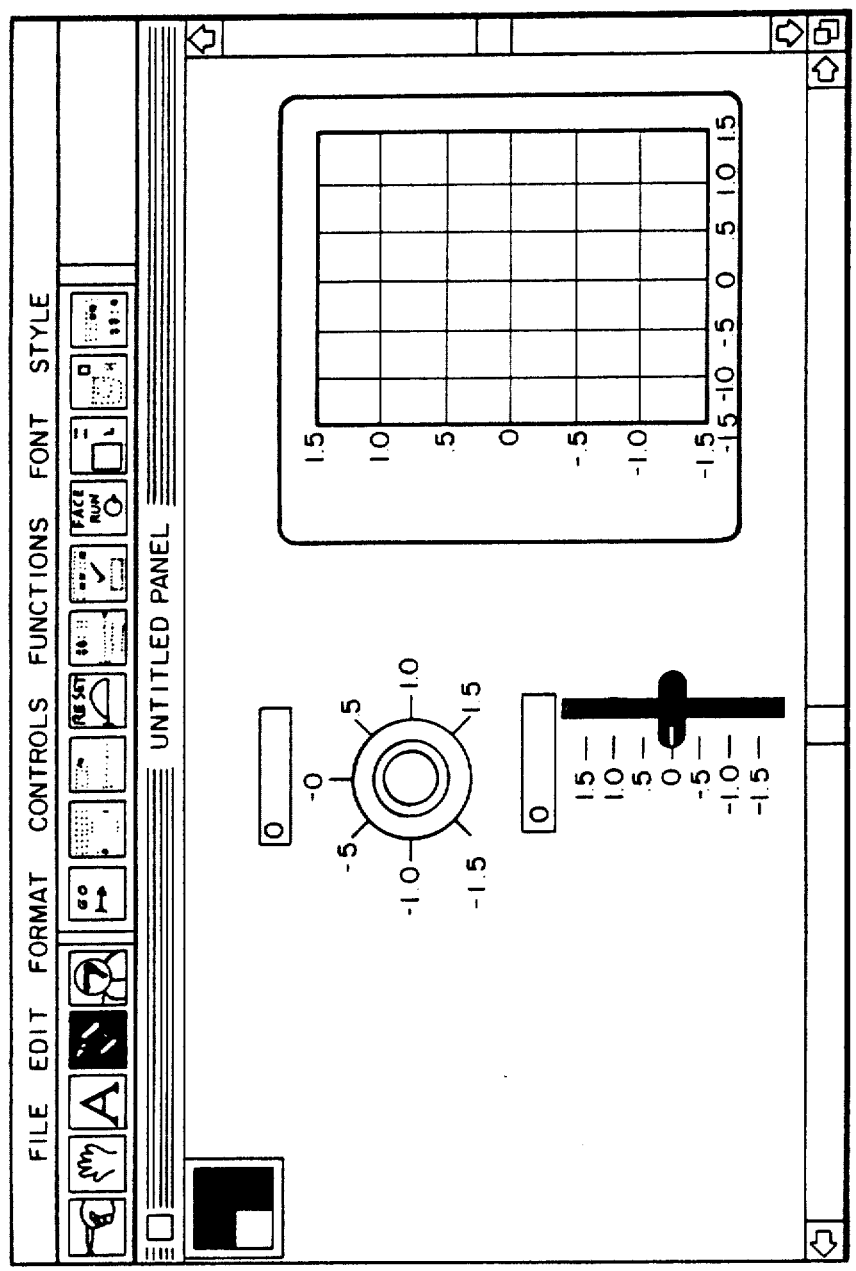
FIG. 5 shows an illustrative front panel produced using the front panel editor of the instrumentation system of FIG. 4.

The instrumentation system 56 can be used to control the instrument 60, to acquire data from the instrument 60 to analyze that data, to store that data and to present that data. FIG. 5 shows details of an illustrative front panel 62 which can be produced using the front panel editor 36' and which can be displayed using the keyboard and display 58. It will be appreciated that the illustration of FIG. 5 represents an actual graphical computer-generated display of an exemplary front panel for the instrument 60. The graphical representation of FIG. 5 illustrates physical control dials and switches for providing variable input information and illustrates a coordinate plane type indicator for displaying variable output information. More particularly, FIG. 5 shows a circular turn-dial and a slide switch for setting input variable data. The turn-dial and slide switch each correspond to respective rectangular boxes for digitally illustrating variable input data in digital form. The illustrative front panel also includes a coordinate plane display for illustrating variable output data. The graphical representations of input controls and output indicators are stored in a memory library, and a user may select from among a variety of different graphical representations of input controls and output indicators in order to construct a panel display which conforms to a user's intuitive understanding of how the instrument 60 is controlled and how it provides data.

FIG. 6 illustrates an icon 64 which can be used to reference a front panel (not shown). A visual representation of the icon 64 can be produced using the icon editor 34'. The icon 64 corresponds to a particular front panel (not shown). As will be explained more fully below, the icon 64 can be used as a building-block in a hierarchical system constructed using the block diagram editor 30'. The dashed lines of FIG. 6 indicate the one-to-one correspondence between the icon 64 and the respective two-dimensional regions (or hot spots) 66 and 68 which correspond to respective variable input data and variable output data illustrated by controls and displays of the corresponding front panel (not shown). For example, the front panel might include input data in the form a sequence of samples and might provide output data in the form of an indicator showing voltage reading per sample. The icon 64 then might be divided into two two-dimensional regions 68 and 66 which respectively correspond to the input sample count and the voltage reading for that sample count.

FIG. 7 illustrates a memory library including a plurality of software modules each representing a respective front panel and each corresponding to a respective illustrative icon which references its respective front panel. As will be explained more fully below, a user may utilize the icons of the memory library to build a block diagram; or he/she may build his/her own respective front panels and corresponding icons using the front panel editor 36' or the icon editor 34' in order to build a block diagram; or he/she may use both the icons of the icon memory library and icons which he/she produces himself/herself using the front panel editor 36' and icon editor 34' in order to build a block diagram.

Figure 8:
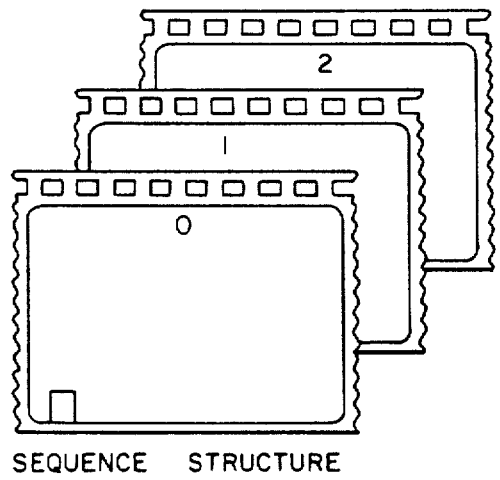
FIG. 8 shows a graphical representation of a sequence structure.
Figure 10:
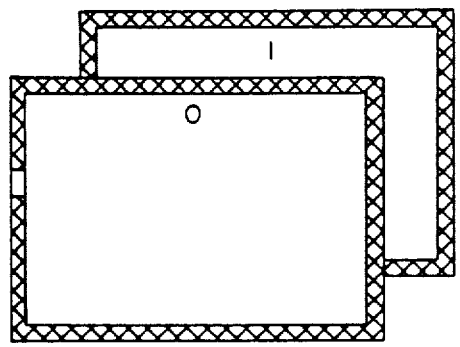
FIG. 10 shows a graphical representation of a conditional structure.
Figure 9:
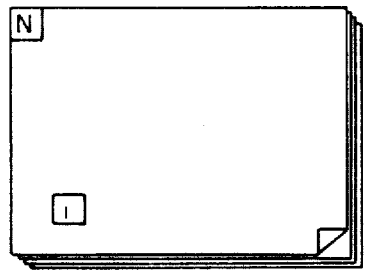
FIG. 9 shows a graphical representation of an iterative loop structure.
Figure 11:
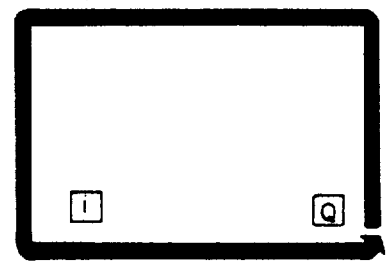
FIG. 11 shows a graphical representation of an indefinite loop structure.
Figure 12:
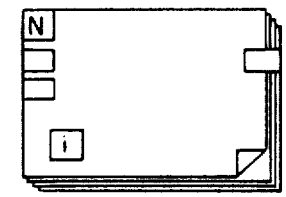
FIG. 12 shows graphical representations of shift registers on the respective iterative loop structure of FIG. 9 and indefinite loop structure of FIG. 11.

The drawings of FIGS. 8-12 show the graphical representations of structures utilized in constructing a block diagram as described below using the block diagram editor 30'. The structures represented in FIGS. 8-12 substantially facilitate the application of data flow programming techniques which are used in the preferred embodiments of the present invention. FIG. 8 illustrates a sequence structure. FIG. 9 illustrates an iterative loop structure. FIG. 10 illustrates a conditional structure. FIG. 11 illustrates an indefinite loop structure. FIG. 12 illustrates a shift register on an iterative loop structure (on the left side) and a shift register on an indefinite loop structure (on the right side).

It will be appreciated that the graphical representations of the structures illustrated in FIGS. 8-12 can be stored in a memory library as can execution instructions corresponding to the respective structures. Thus, a user can call upon a graphical structure library in order to display any one or more of the structures using the display facilities of the control processor 38' and keyboard and display 58 of the instrumentation system of FIG. 4.

The sequence structure, which has its graphical representation illustrated in FIG. 8, serves to divide a data-flow diagram into two subdiagrams, one representing an inside and another representing an outside of the sequence structure borders. The outside diagram behaves exactly as if the sequence structure and its contents were replaced by an icon with a terminal (or hot spot) for each line crossing the sequence structure border. The drawing of FIG. 8 shows a three-diagram sequence. In order to minimize space used on a computer console screen, only one diagram of the sequence structure is visible at a time. Inside the structure border, multiple diagrams (not shown) can be constructed which execute in sequence. The sequence of diagrams are indicated by the respective numbers in the respective sequence diagrams. When the first diagram (indicated by the number 0) in this sequence completes its execution, the next one begins. The process is repeated until all diagrams in the sequence have been executed.

Each diagram in the sequence uses a subset of incoming signal paths and produces a subset of outgoing signal paths (the outgoing subsets must be mutually exclusive, but the incoming subsets are arbitrary). Constants may be used with any of the diagrams without any constraints. Variables used within a diagram are strictly local to the sequence structure and may be assigned only once. Variables can be used multiple times in the diagrams following the diagram where the variable was assigned.

In accordance with data-flow principles, used in the preferred embodiments of the present invention, the sequence structure does not begin execution until all incoming signal paths have data available, and none of the outgoing signal paths produce data until all diagrams have completed execution.

Figure 13:
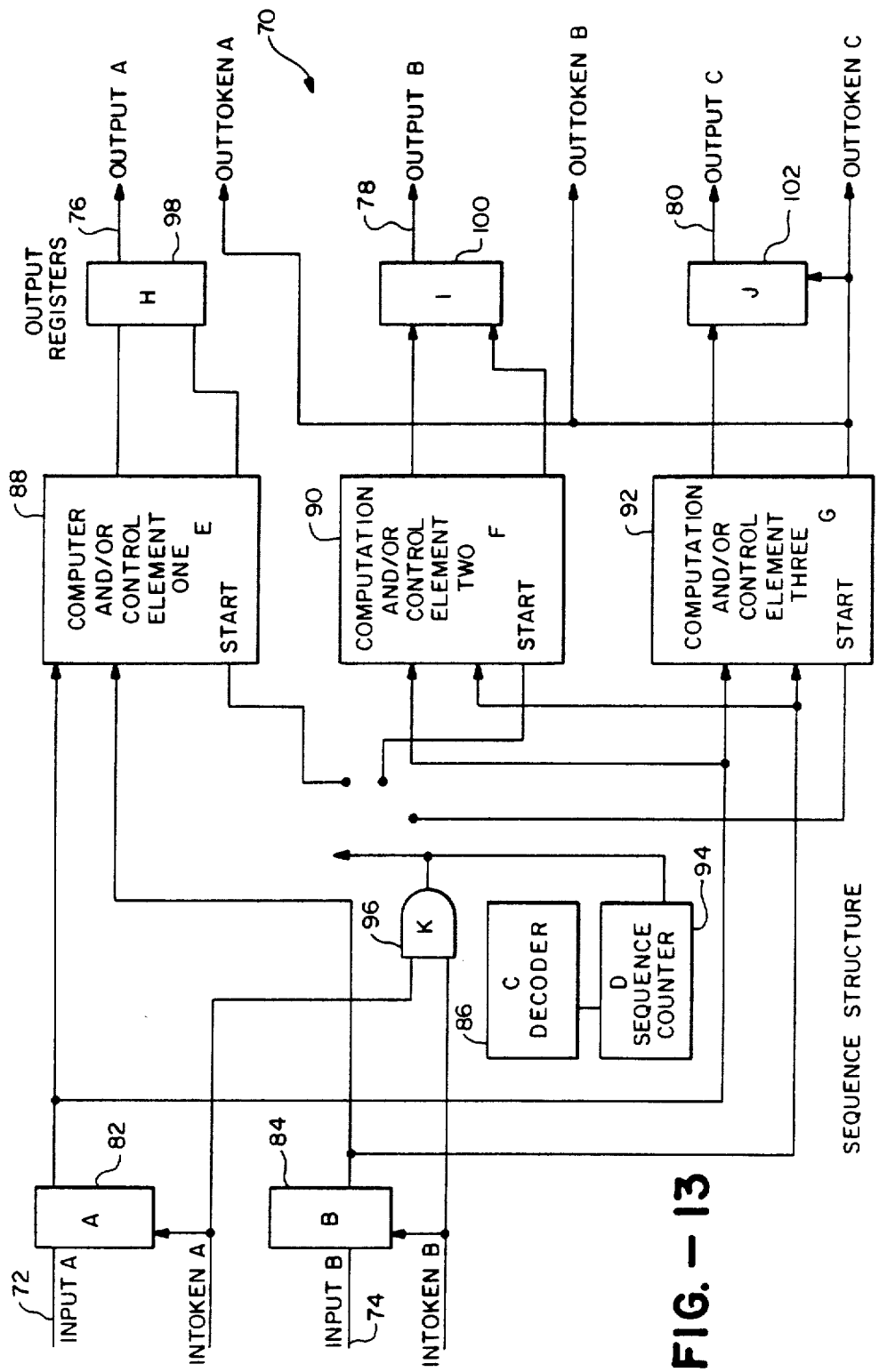
FIG. 13 shows an illustrative block diagram generally corresponding to the graphical representation of a sequence structure shown in FIG. 8.

FIG. 13 shows an illustrative block diagram 70 of a sequence structure. The sequence structure is coupled to receive input signals on respective lines 72 and 74 and to provide respective output signals on respective lines 76, 78 and 80. Input registers 82 and 84 are provided to collect input data. A decoder 86 is provided to determine which computation and/or control element 88, 90, or 92 to select, and a sequence counter 94 is included to undertake a count for sequencing between respective elements 88, 90 and 92. When all data inputs are present, an output of AND gate 96 becomes TRUE. This starts computation in computation and/or control element 88 (assuming that it is the first element selected). When the control element 88 has completed computation, its output is stored in register 98. When the first element 88 has completed computation, the sequence counter 94 is free to advance by one. The decoder 86 will select the second computation element 90. The output of AND gate 96 will become TRUE again and, computation will begin in the second element 90. The output of the second element 90 will be stored in output register 100. The sequence repeats for the third element 92, and its output is stored in output register 102. After the completion of the computation by the third element 92, the output data from all computations will be available for further computation by other instruments (not shown) of a block diagram system as will be explained more fully below.

The iterative loop structure, a graphical representation of which is shown in FIG. 9, is similar to the sequence structure in that the iterative loop structure partitions the data-flow graph into two parts. The interior diagram contains the body of the loop. Signal paths crossing the border of an iteration loop structure typically have a transformation applied. Incoming data are indexed in the most significant dimension so that the data inside the structure have dimensionality one less than outside. Outgoing data has the inverse transformation performed.

All signal paths crossing the border must have the same size for the indexed dimension. It is possible to disable the indexing on a signal path, in which case, the data behaves as if it were a constant available to each iteration. If indexing is disabled on an outgoing signal path, the data value is repeatedly overwritten and only the last value propagates out from the iteration structure.

There are two special variables which behave as constants within the body of the iterative loop structure: the number of iterations, N, and the iteration number or index, i. Usually, the number of iterations to be executed is automatically set by the size of the dimension being indexed for an incoming signal path. In the event that there are no incoming signal paths, a scaler value must be specifically connected to the variable to specify the number of iterations. The iteration number is similar to a constant within the diagram except that its value is 0 for the first iteration and increments by 1 at the end of each iteration.

Iterations are independent and can, in principle, be executed in any order or completely in parallel except in the case where a non-reentrant virtual instrument (for example, a virtual instrument which is used. In that case, the iterations would be executed strictly sequentially. In accordance with data flow principles, all inputs must be available to start execution of an iteration loop. Furthermore, all outputs are generated after execution completes.

Figure 14:
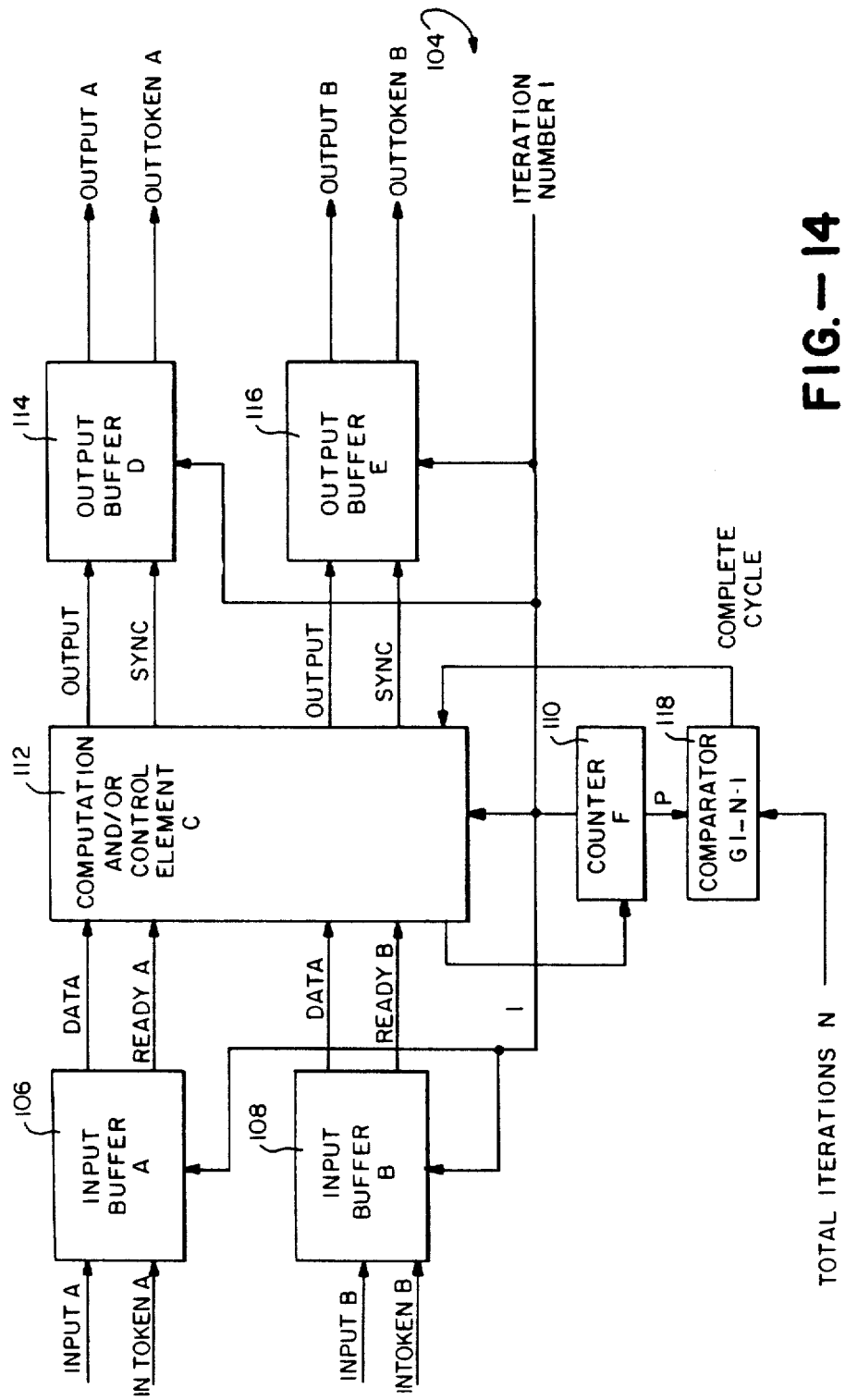
FIG. 14 shows an illustrative block diagram generally corresponding to the graphical representation of an iterative loop structure show in FIG. 9.

Referring to the illustrative drawings of FIG. 14, there is shown a block diagram 104 for an iterative loop. An iterative loop structure operates on data in an array one element at a time. The data for each element are sequentially stored in respective input buffers 106 and 108. A counter 110 begins its count at 0. When the first data elements are available for both inputs of both respective input buffers 106 and 108, computation and/or control element 112 will generate outputs to be stored in respective output buffers 114 and 116. At that time, the counter 110 will advance to 1, and the process will repeat for the second data element in the array. This process will repeat until the counter 110 reaches N−1 making a total of N computations. At that time a complete cycle signal will be generated by the comparator 118. The output signals stored in the respective output buffers 114 and 116 then will be available for use by other computation instruments (not shown).

The conditional structure, a graphical representation of which is shown in FIG. 10, is similar in appearance to the sequence structure in its use of screen space, but it differs in its handling of signal paths crossing its border in that in each case a diagram may use any subset of incoming signal paths, but must produce all outgoing signal paths. In accordance with data-flow principles, all inputs must be available in order to start execution. Furthermore, all outputs are generated after execution is completed.

There must be a signal path that terminates at the case-selection terminal on the structure border. In the simplest case, a boolean-valued scalar is connected to the selector to select between case 0 (FALSE) and case 1 (TRUE). In the general case, a scalar number is connected to the selector. A special diagram (default case) may be specified to be used in the event that the selector does not lie in the range of specified cases.

Figure 15:
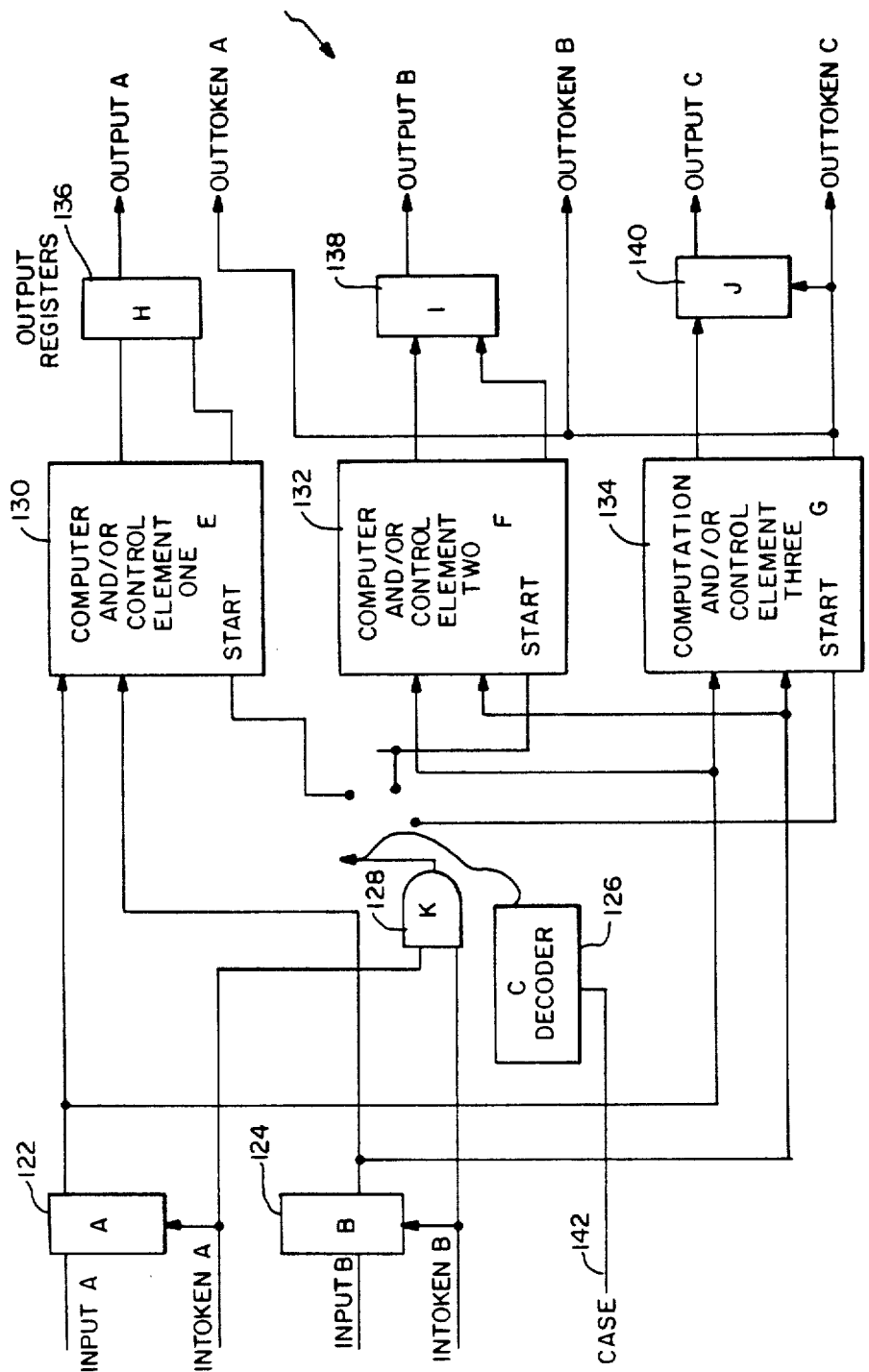
FIG. 15 shows an illustrative block diagram generally corresponding to the graphical representation of a conditional structure shown in FIG. 10.

The drawings of FIG. 15 illustrate a block diagram 120 corresponding to a conditional structure. The block diagram 120 for the conditional structure is substantially similar to that of the block diagram 70 for the sequence structure. The block diagram 120 for the conditional structure includes respective input registers 122 and 124, a decoder 126, an AND gate 128, three respective computation and/or control elements 130, 132 and 134 and three respective output registers 136, 138, and 140 all coupled as shown in the drawings of FIG. 15. In operation, the conditional structure block diagram 120 operates in a manner substantially similar to that of the sequence structure block diagram 70, except that the decoder 126 of block diagram 120 is directly controlled by the case selection input provided on line 142 to select only one diagram.

The indefinite loop structure, a graphical representation of which is shown in FIG. 11, is similar in concept to the iterative loop structure in that the interior of the structure diagram represents the body of the loop, but it differs in that signal paths crossing the border of the indefinite loop structure do not usually have an indexing transformation applied.

There are two special variables applied within the body of the indefinite loop structure: iteration number or index, i, and recirculation flag, Q. The iteration number starts at zero and increments by one at the end of each iteration. A boolean value or expression is connected to the recirculation flag. A value of TRUE means that another iteration will be performed. If the recirculation flag is left unconnected, it is equivalent to connecting a TRUE constant. In accordance with data-flow principles applied in the preferred embodiments, all inputs must be available in order to start execution. Furthermore, outputs are generated after execution is complete.

Figure 16:
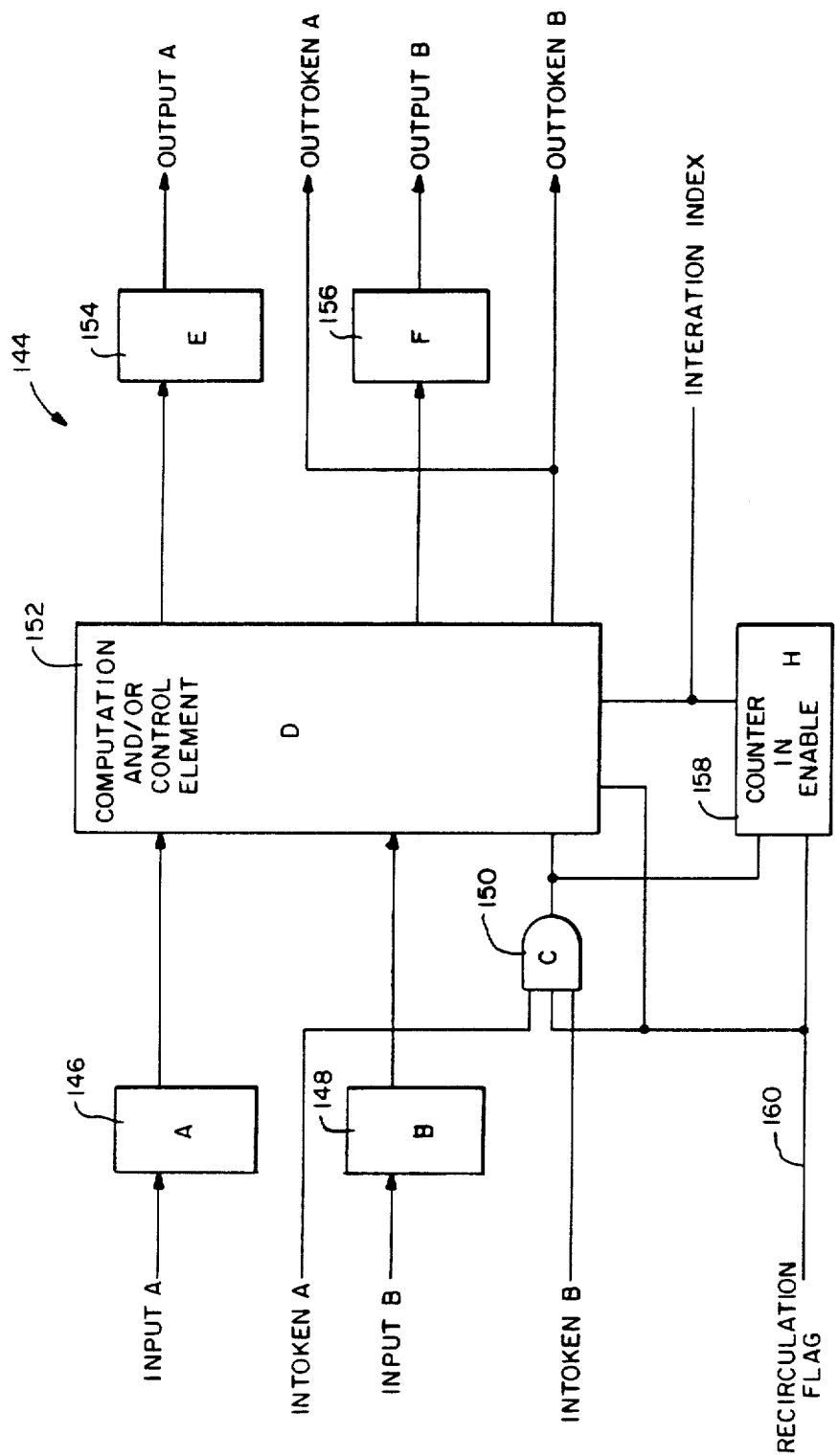
FIG. 16 shows an illustrative block diagram generally corresponding to the graphical representation of an indefinite loop structure shown in FIG. 11.

The illustrative drawings of FIG. 16 shows a block diagram 144 which corresponds to the graphical representation of an indefinite loop structure shown in FIG. 11. In operation, when data inputs are available on both respective input registers 146 and 148, an output of AND gate 150 will become TRUE to enable computation and/or control element 152. After computation is complete, output data are stored in respective output registers 154 and 156. After completion of the first loop, counter 158 increments, and the cycle begins again. This process continues until a recirculation flag provided on line 160 goes FALSE. The output data are present after each cycle.

A special construction available for use only within the respective loop structures is the shift register. A graphical representation of each respective loop structure type incorporating a shift register is show in FIG. 12. The shift register eliminates the need for cycles in a data-flow graph making the result easier to comprehend and to prove correct. The shift register behaves as if it were an ordered set of two or more variables, all of the same type and dimensionality.

The first variable in a set is an output of the loop-body diagram and is located on the right border of the loop structure. The other variables of the set are inputs to the loop-body diagram and are located on the left border of the structure at the same elevation.

At the conclusion of each loop iteration, the data from the shift register output variable are shifted into the first input variable, and the previous value of the first input variable is shifted into the second input variable.

Figure 17:
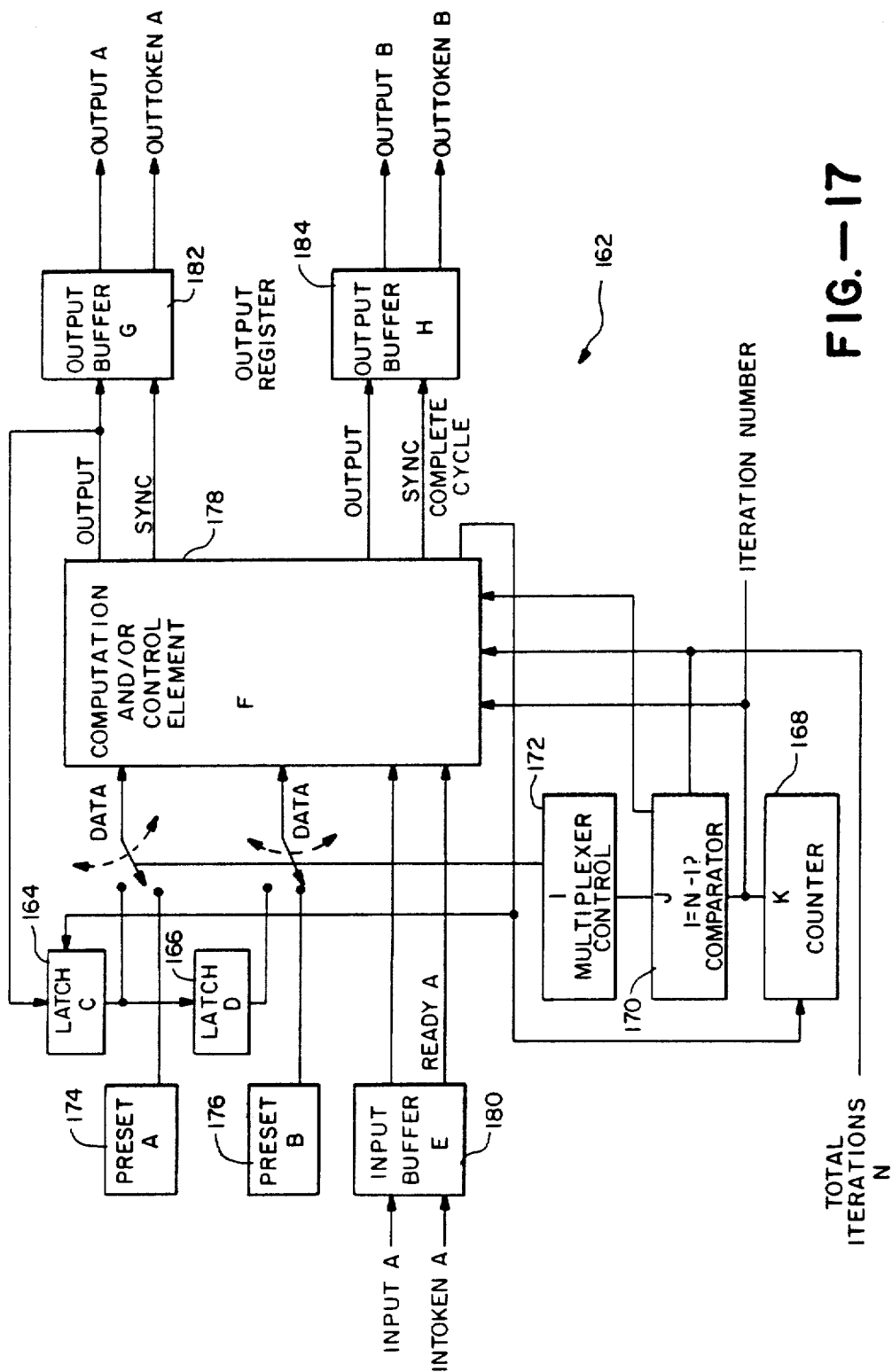
FIG. 17 shows an illustrative block diagram generally corresponding to the graphical representation of an iterative loop structure including a shift register shown on the left in FIG. 12.

The drawing of FIG. 17 shows an illustrative block diagram 162 illustrating operation of an iterative loop structure including a shift register. Respective latches 164 and 166 are provided to implement the shift register. In operation, the block diagram 162 of FIG. 17 (which represents an iterative loop structure with a shift register) operates similarly to the block diagram 104 of FIG. 14 (which represents an iterative loop structure minus a shift register) except that computation inputs are provided which give the system feedback from a previous cycle.

An output provided by loop counter 168 is sensed by the comparator 170. For the first loop, the multiplexer control 172 selects preselect inputs from respective preset gates 174 and 176. For all other cycles, respective latches 164 and 166 are selected. The selected input is fed into the computation and/or control element 178. Data from input buffer 180 also is fed into the computation element 178. After each cycle, the computed output data are fed into respective output buffers 182 and 184. When the comparator 170 reaches N−1, the process is completed, and the output data can be passed to a next instrument (not shown).

The following discussion regarding data flow principles and a virtual instrument data structure diagram will assist in understanding the operation of the respective block diagram editors 22, 30 and 30' and the respective execution subsystems 24, 32 and 32' of the respective first system 20, second system 28 and the instrumentation system 56.

Figure 18:
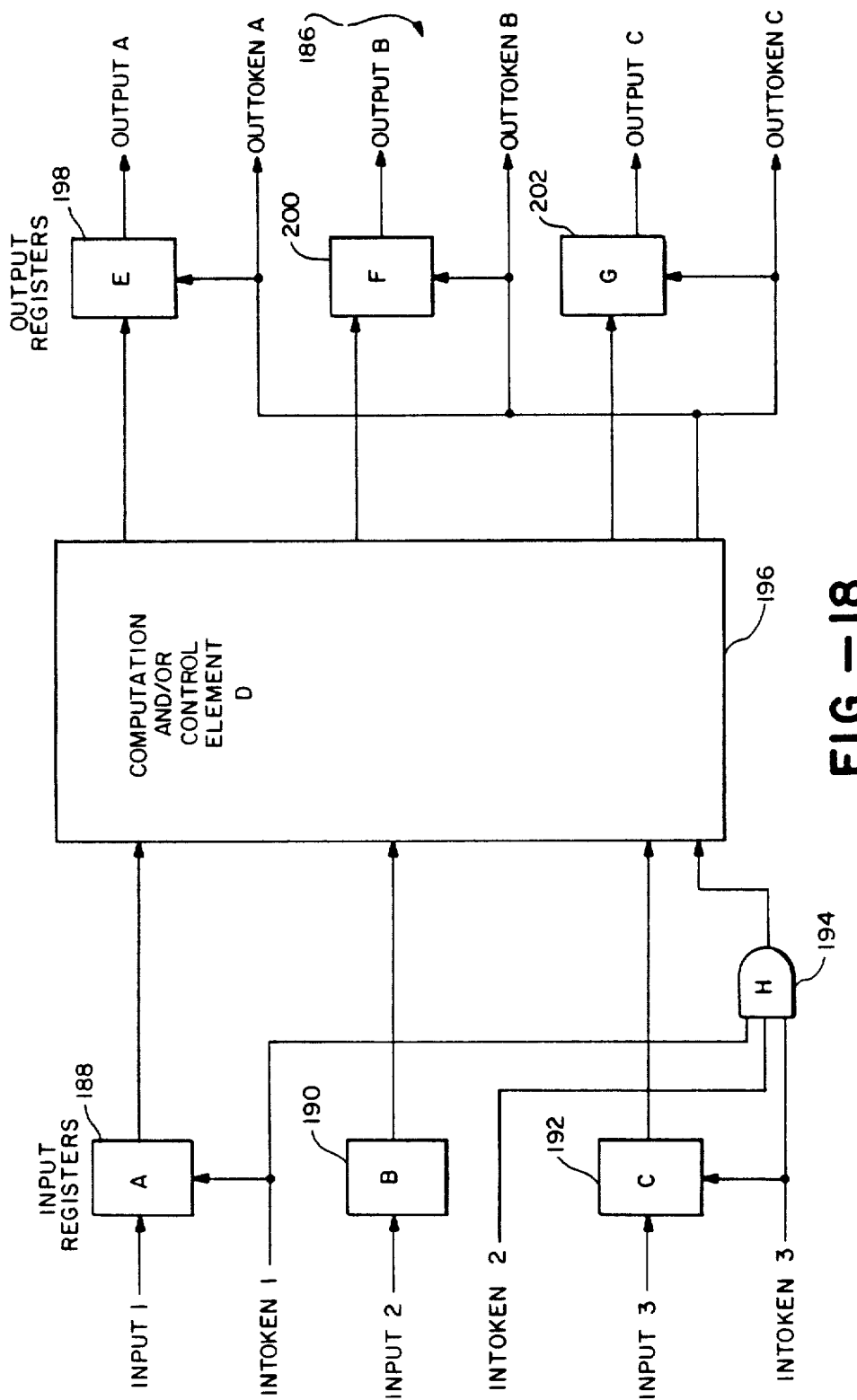
FIG. 18 shows a block diagram representing an exemplary data flow system.

Referring now to the illustrative drawings of FIG. 18, there is shown a block diagram 186 of an exemplary data flow system. The block diagram 186 includes three respective input registers 188, 190 and 192 which provide an accumulation of input data. As soon as all input data are present and output of AND gate 194 will become TRUE, and computation and/or control element 196 will begin computation. The computation element 196 will begin generating output data which are stored in respective output registers 198, 200 and 202. When all output data are available, an output token will be generated by the computation element 196 indicating that output data are available for transmission to a next system (not shown). It will be appreciated that the computation element can be a combination of more than one subsystem (not shown).

Figures 19A, 19B:
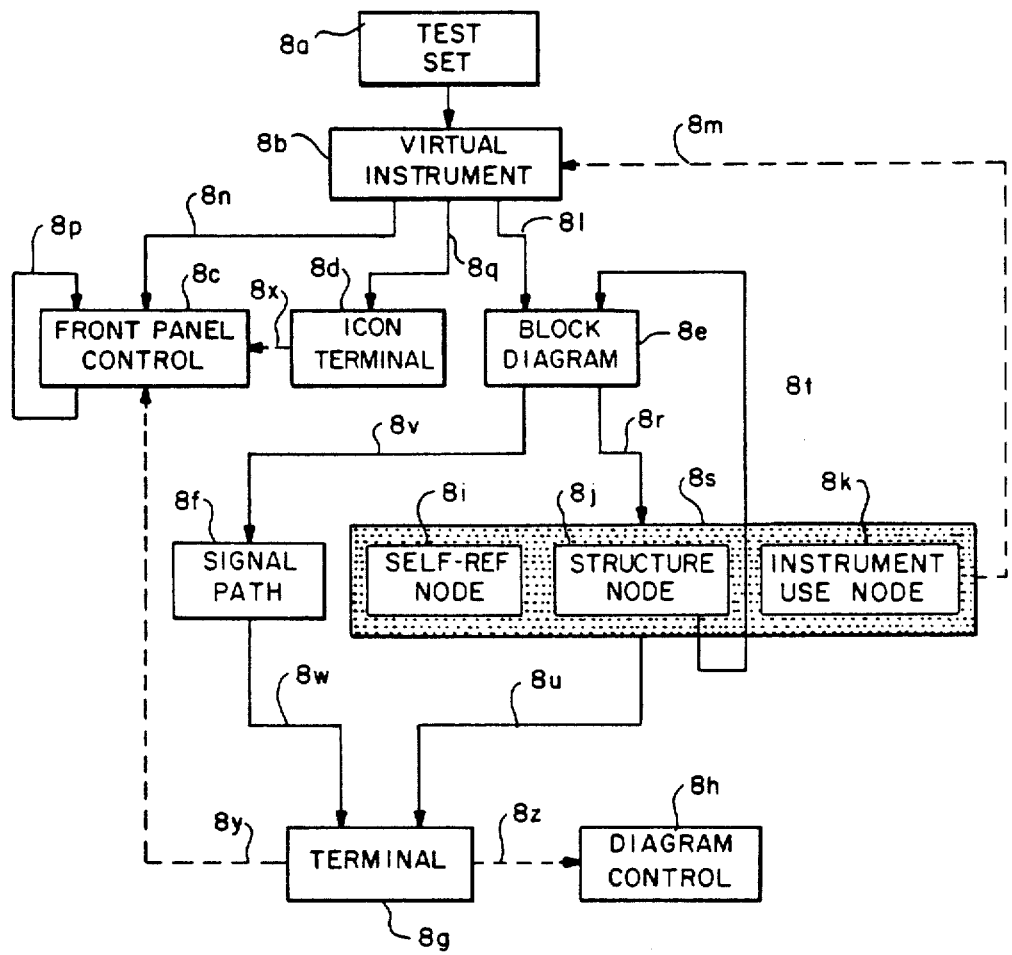

FIG. 19a illustrates a virtual instrument data structure diagram. The first system 20 of FIG. 1, the second system 28 of FIG. 2, and the instrumentation system 56 of FIG. 4 each utilize the principles set forth in the data structure diagram of FIG. 19a. It will be appreciated that implementation of a system utilizing a data structure such as that diagrammed in the diagram of FIG. 19a advantageously permits the implementation of an extended data flow system like that illustrated in FIG. 18.

Furthermore, it will be appreciated that implementation of the data structure like that of the diagram of FIG. 19a advantageously permits the implementation of a system in which execution instructions can be constructed in a graphical fashion. More particularly, execution instructions can be constructed by constructing a visual display in which at least one input variable produces at least output variable according to a displayed procedure. Furthermore, the execution instructions are constructed such that, when a value is assigned to a particular input variable, a value for a corresponding output variable is produced substantially according to the procedure illustrated in the visual display. Additionally, the execution instructions can be constructed in response to the construction of a block diagram comprising the graphical display. Thus, a user need only construct an appropriate visual display in order to construct the execution instructions.

Moreover, implementation of data flow principles by using a data structure such as that shown in the diagram of FIG. 19a advantageously permit the use of parallel processing which increases the speed with which the execution of execution instructions can be accomplished.

More particularly, FIG. 19a shows a system representation of a virtual instrument. Boxes 8a–8k, indicate conceptual objects in the system that have well-defined properties. Objects 8i, 8j and 8k are grouped into shaded box 8s and share some properties and form a class of objects.

As indicated in FIG. 19b which represents a legend applicable to the illustration of FIG. 19a, a solid line with an arrow is used to indicate a potential one-to-many relationship, i.e., the source object contains zero or more destination objects (e.g., a vehicle containing zero or more wheels). A wiggly line with an arrow is used to indicate a potential one-to-one relationship, i.e., the source object may reference zero or one destination object (e.g., a library book may or may not have a borrower).

Line 8n indicates that a virtual instrument 8b contains a front panel with a multiplicity of controls 8c. A control may be of clustered type in which case it contains a multiplicity of subcontrols as indicated by line 8p. Line 8q indicates that a virtual instrument contains an icon with a multiplicity of terminals 8d. Line 8l indicates that virtual instruments also contains a multiplicity of block diagrams 8e.

In the system of the present invention, a virtual instrument either contains one diagram or none. Builtin virtual instruments representing primitive computations have no diagrams. Line 8r indicates that a block diagram contains a multiplicity of objects of the node class. A block diagram contains exactly one self reference node 8i, and an arbitrary number of structure nodes 8j or instrument use nodes 8k. Line 8t indicates that a structure node contains a multiplicity of subdiagrams.

A sequence structure or a conditional structure contains one or more sub-diagrams, and an iterative loop structure or indefinite loop structure contains exactly one subdiagram. Line 8m indicates that an instrument use node is used to reference another virtual instrument. The instrument use node may reference a virtual instrument in real-time; or it may reference previous data acquired by the virtual instrument. Line 8u indicates that each object of the node class contains a multiplicity of terminals 8g. Line 8v indicates that a block diagram also contains a multiplicity of signal paths 8f. Each signal path contains a multiplicity of terminals as indicated by line 8w. There is at most one terminal per signal path that is designated as the source of the signal. Each terminal contained in a signal path also is contained in a node. However, there may be terminals in nodes which are not in signal paths. The terminals in a signal path are typically in different nodes. Lines 8y and 8z indicate that each terminal may reference a front panel control or a block diagram control (e.g., a constant). A terminal references exactly one control, and it is either on the front panel or on the block diagram.

FIGS. 20a–l illustrate computer screen displays during each successive step in a construction of an exemplary block diagram using a block diagram editor such as that of FIGS. 2 or 4. (It should be appreciated that the block diagram editor of FIG. 1 operates in a similar fashion; except that it does not include an icon editor or a front panel editor for user-constructed front panel).

More particularly, in FIG. 20a, a control knob is placed in the front panel, and its associated terminal automatically appears in the block diagram. The system representation shows the virtual instrument with a diagram containing a self reference node, and a terminal in the self reference node which references the front panel control.

In FIG. 20b, a control graph indicator type is placed in the front panel, and its associated terminal automatically appears in the block diagram in the same position relative to the other terminal as the graph is to the knob. This makes it possible to distinguish the terminal even without supplementing the graphics with text labels.

In FIG. 20c, a constant with value 20 is placed in the block diagram, and is reflected in the system representation by another terminal and control attached to the self reference node.

In FIG. 20d, an icon referring to a built-in virtual instrument is placed in the block diagram. (An alternative view of the block diagram could show the icon terminals instead of the icon itself). The system representation shows another node of instrument use type in the virtual instrument diagram and three terminals and controls corresponding to the terminals and controls the referenced virtual instrument.

Figure 20E:
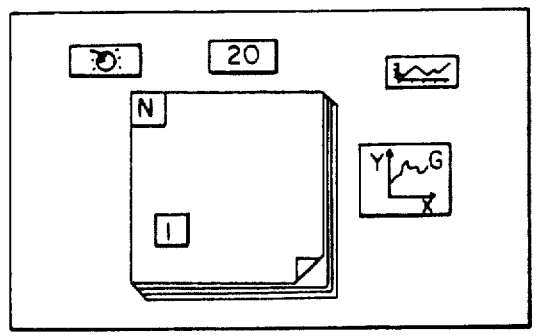

In FIG. 20e, an iterative loop structure is placed in the block diagram. The system representation shows the structure node in the diagram along with terminals and controls for the loop variables. Note that the iteration number is accessible only from within the loop; while the iteration limit is available inside and outside the loop as evidenced by the two terminals which reference it, one in the structure node and the other in the self-reference node of the diagram within the structure node.

Figure 20F:
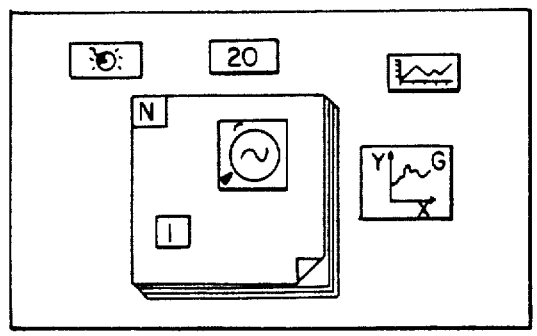

In FIG. 20f, an icon referencing another built-in virtual instrument is placed inside the iterative loop structure.

Figure 20G:
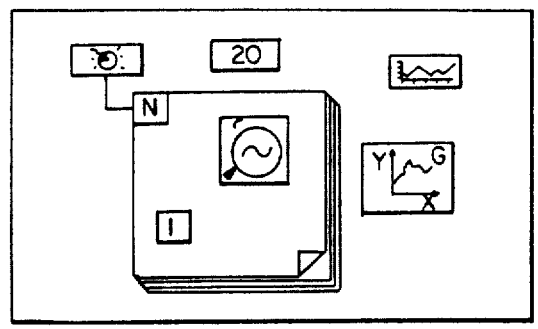

In FIG. 20g, a wire is connected from the terminal associated with the front panel knob to the loop limit terminal of the loop structure. The front panel knob terminal is determined to be the signal source.

Figure 20H:
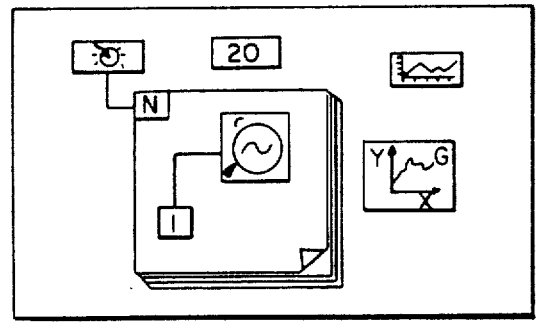

In FIG. 20h, a wire is connected from the iteration number terminal to a terminal on the virtual instrument inside the loop. This signal path lies completely within the loop structure subdiagram. The system representation shows the signal path with the iteration number terminal and the terminal on the instrument use node. The iteration number terminal is determined to be the signal source.

Figure 20I:
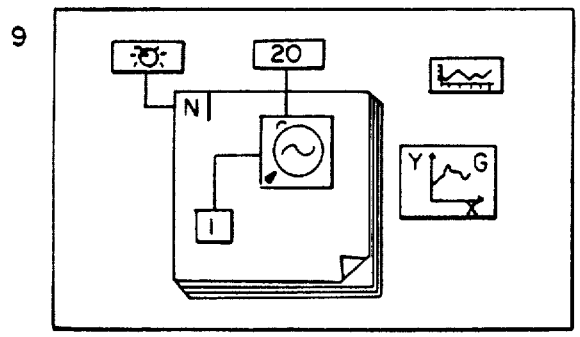

In FIG. 20i, the constant is wired to a terminal of the virtual instrument within the loop. In this case, the wire crosses the structure border so that a pair of terminals and a control are created, and the wire is split into two signal paths, one outside the loop structure and one inside. The constant is determined to be the source terminal of the outside signal, and the inside terminal at the border is determined to be the source of the inside signal.

Figure 20J:
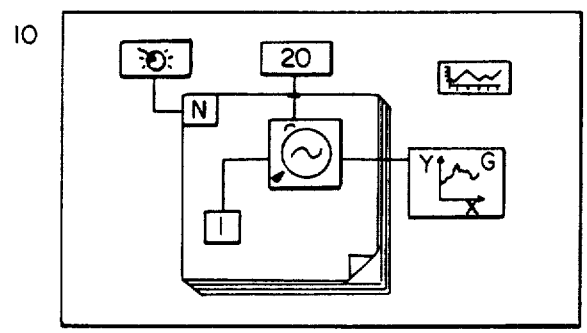

In FIG. 20j, a wire is drawn from the virtual instrument inside the loop to the virtual instrument outside the loop. This wire crosses the border so it is split into two signal paths. The wire on the outside is thicker because it represents an array signal path (as will be explained more fully below).

Figure 20K:
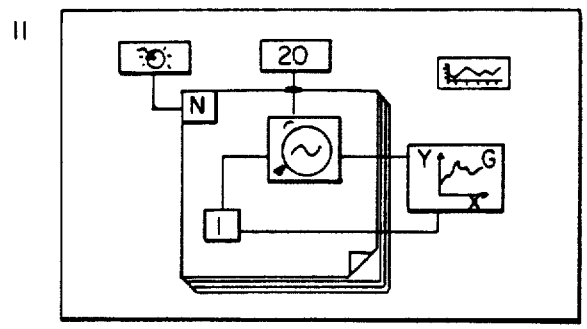

In FIG. 20k, the iteration number terminal is connected to a terminal on the outside virtual instrument. The wire crosses the border so that it is split into two signal paths. The inside signal path is joined to the existing signal path originating at the iteration number terminal again the wire on the outside is thicker.

Figure 20L:
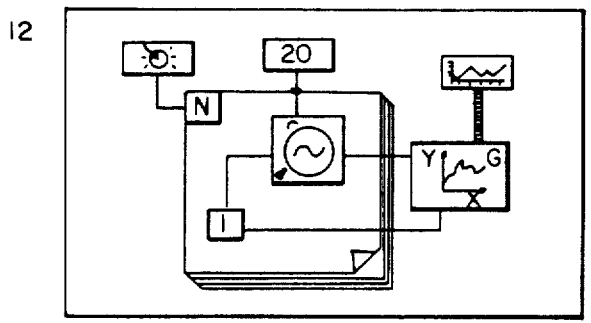

In FIG. 20l, the output of the virtual instrument outside the loop is connected to the terminal associated with the front panel graph. The wire pattern indicates that it represents a cluster signal path (as will be explained more fully below).

The following description describes the operation of the execution subsystems 24, 32 and 32' of the respective first system 20, second system 28 and the instrumentation system 56.

The first step in the execution of a virtual instrument is accomplished by executing its block diagram. The first step in the execution of a block diagram is accomplished by scanning the terminals contained in the diagram's self-reference node. For each terminal which is the source of a signal, the data token is moved from the control reference by the terminal to the terminal itself. The second step in the execution of a diagram is to initialize the token short-count of each node in the diagram to the number of input signals to that node. The third step in the execution of a diagram is to propagate signals from the self-reference node. Propagation of signals from a node is accomplished by scanning all of the node's terminals. For each terminal that is source of a signal the data token on the terminal is copied to each destination terminal of the signal path. Each token placed on a destination terminal causes the short-count of the node containing the terminal to be decremented. If it becomes zero in the process, then that node is scheduled to execute.

The first step in the execution of a node is accomplished by copying the tokens from the node's terminals to the reference controls. The second step depends upon the type of node. For an instrument use node that references a real-time virtual instrument, the next execution step is to copy the tokens from the node's controls to the virtual instrument's controls and to execute the virtual instrument. For an instrument use node that references previously stored data of a virtual instrument, the tokens from the appropriate data record are read in and placed on the node's terminals. For a sequence structure node, the next step is to execute the first subdiagram. For a conditional structure node, the next step is to execute the subdiagram indicated by the value of the token on the selected control. For an iterative or indefinite loop structure node, the next step is to set the value of the token on the iteration number control to zero and to execute the subdiagram. For a self-reference node, the next step is to perform the next step in the execution of the node or the virtual instrument which contains the diagram that contains the self-reference node.

The third step in the execution of a node also depends upon the type of node. For an instrument use node or a conditional structure node the output data tokens are propagated along the signal paths. For a sequence structure node, the next subdiagram is executed, if one exists, and if not, the output tokens are propagated. For a loop structure node, the shift registers are clocked (the data is shifted), the iteration numbers incremented, and the subdiagram is reexecuted, if appropriate; otherwise the output tokens are propagated.

The second step in the execution of the virtual instrument is to log the tokens on the front panel controls if data logging is enabled. The third step in the execution of the virtual instrument is to copy the tokens from the virtual instrument's indicators to the instrument use node's output terminals and to schedule the instrument use node to execute its next step. The third step of virtual instrument execution is performed only if the virtual instrument was executed in response to an instrument use node request. If the virtual instrument was executed interactively, there is no third step.

Figure 21:
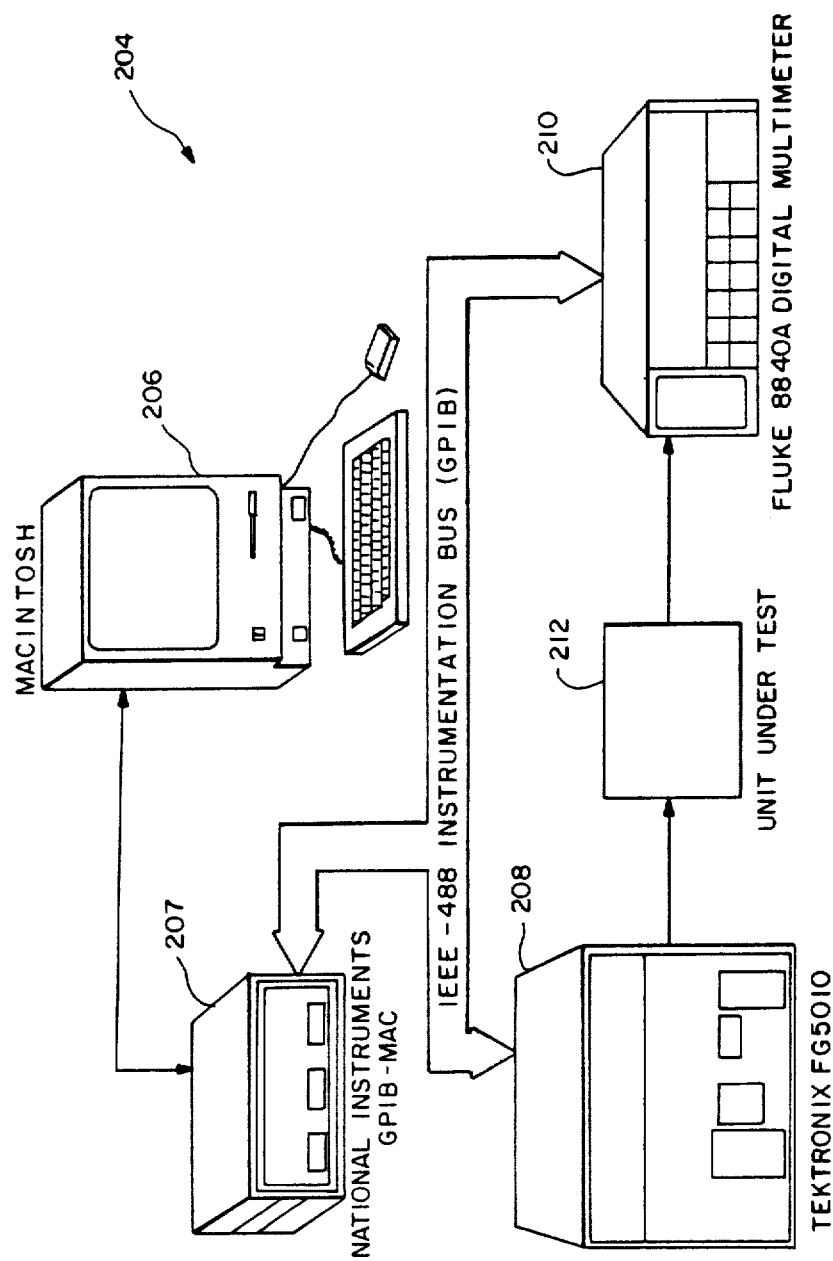
FIG. 21 is a drawing of an illustrative hardware instrumentation system of the present invention.

FIG. 21 shows an illustrative hardware configuration of an instrumentation system 204 according to the present invention. The system 204 includes a Macintosh computer 206 with an interface to a GPIB (general purpose instrument bus) 207, a Tektronix 5010 Function generator 208, a Fluke 8840A digital multimeter 210, and a unit under test 212 all coupled as shown. The traditional approach to automating this measurement would be to create a program in a computer language such as BASIC to interact with the test instruments 208 and 210 to collect, format, and display in real time the measured values pertaining to the unit under test 212.

Figure 22:
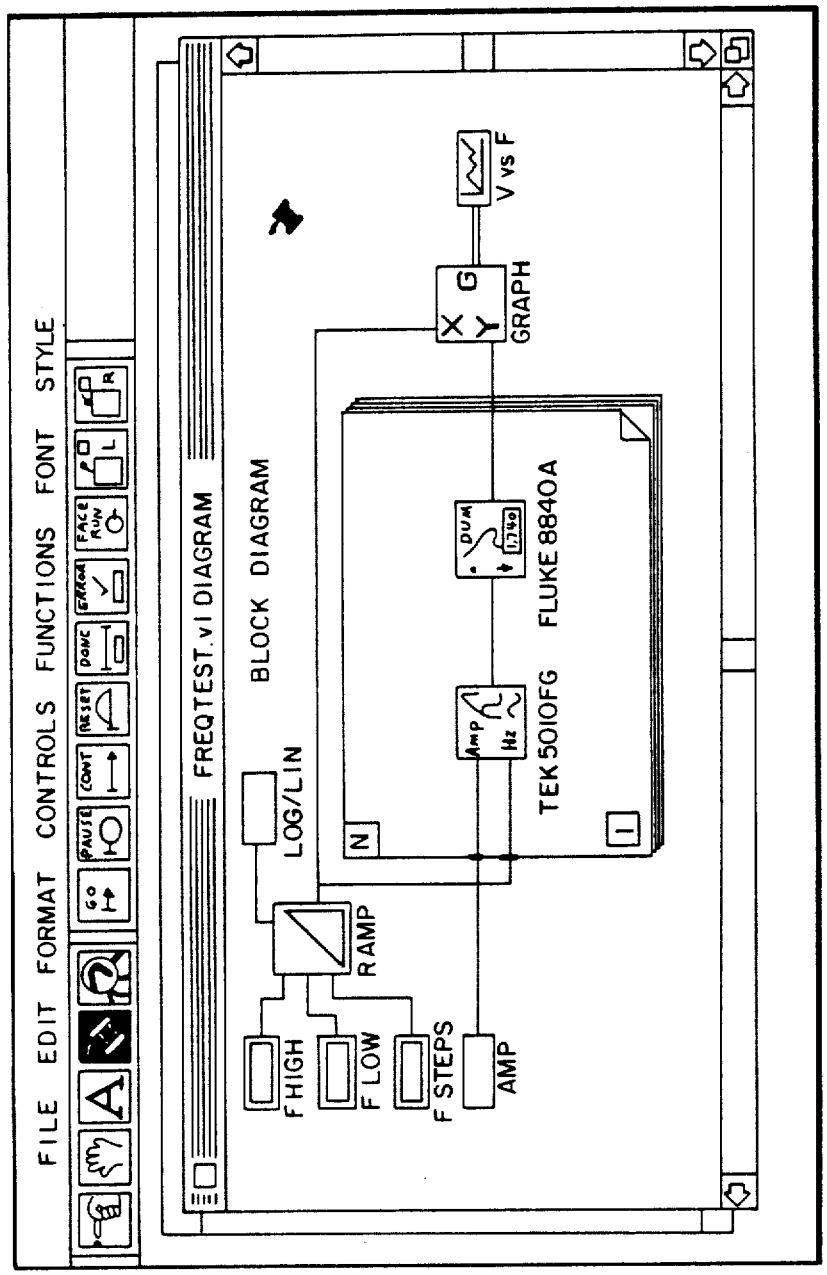
FIG. 22 is a drawing representing a block diagram according to the present invention as displayed on a computer console to model the illustrative hardware system of FIG. 21.

FIG. 22 shows a drawing of a computer-generated display of a completed block diagram for the design example of FIG. 21. This block diagram is the graphical program representing the instrument's operation. It shows the interconnections between the elements of the instrument, the signal paths, and the relationship to other virtual instruments. At the upper left of the diagram, four front panel input controls are shown connected to a "Ramp" icon. This icon is built-in function which takes input minimum and maximum values, number of steps, and a flag to indicate linear or log steps, and produces as output an array of sample points, in this case the frequencies of interest. The output is a bold one, which indicates that the data type is an array.

The large rectangular region in the center of the diagram is an iteration loop structure. The diagram placed inside this region will be executed multiple times: for i=0 to N−1. The inputs to the iteration loop are amplitude and the array of frequencies, shown on the left. The amplitude remains the same data type as it crosses the loop boundary. The array, however, as shown by the change in line type, is automatically indexed as it crosses the boundary to provide one array element per iteration. Since there is no connection to the loop-count (the N at the upper left corner), the length of the input array is used by default as the number of iterations.

Inside the iteration loop are two virtual instrument icons. The first takes as input an amplitude and a frequency and performs the appropriate IEEE-488 operations to set the function generator 208 of FIG. 21. The second performs the appropriate IEEE-488 operations to obtain a voltage measurement from the multimeter 210 of FIG. 21. The dotted line indicates that there is no data flow, but ensures that they execute sequentially. These two icons represent simple virtual instruments that are easily designed using built-in high level IEEE-488 functions to communicate with the multimeter 210.

Each iteration of the iteration loop produces one voltage measurement. This results in an array of values, as shown by the line change as it exits the loop at the right. The graph function takes this array and the array of frequencies as input and produces as output the data structure for the front panel graph indicator. Note the self-documenting effect of the graphical language, with the iteration loop structure contributing to the readability of the program.

With the front panel and block diagram complete, the instrument is ready to be used. The instrument is operated from the front panel. To execute the instrument, the user simply configures the input controls and "clicks" the GO button on the top of the screen (as will be appreciated from the description below).

OPERATION OF THE PREFERRED EMBODIMENTS

The presently preferred embodiments of the invention are implemented in software. A copy of a program listing for the presently preferred embodiments is filed as an Appendix to this patent application. The following description explains the operation of the presently preferred embodiment as implemented using either an Apple Macintosh Plus Computer or an Apple Macintosh Computer. The explanation is intended to be illustrative and not exhaustive and uses specific examples to explain the principles of operation of the preferred embodiments. It will be appreciated that the principles of operation explained below will serve as a basis for the heuristic learning process necessary to fully appreciate and practice the full scope of the present invention. Thus, it is not intended that the scope and content of protection afforded to the present invention be limited in any way by the following explanation.

The following explanation explains how to use the implemented functions of the preferred embodiments. A walk through of the display menus is provided first, with working functions described. This presentation is followed by a walk through of an example application program that computes Fibonacci numbers.

To start, double click on PROTO icon. The PROTO icon is illustrated in FIG. 23a.

The opening screen is shown in FIG. 23b. This screen is the front panel window on which controls can be placed. The tools and controls below the menu bar will be described later.

Figure 24:
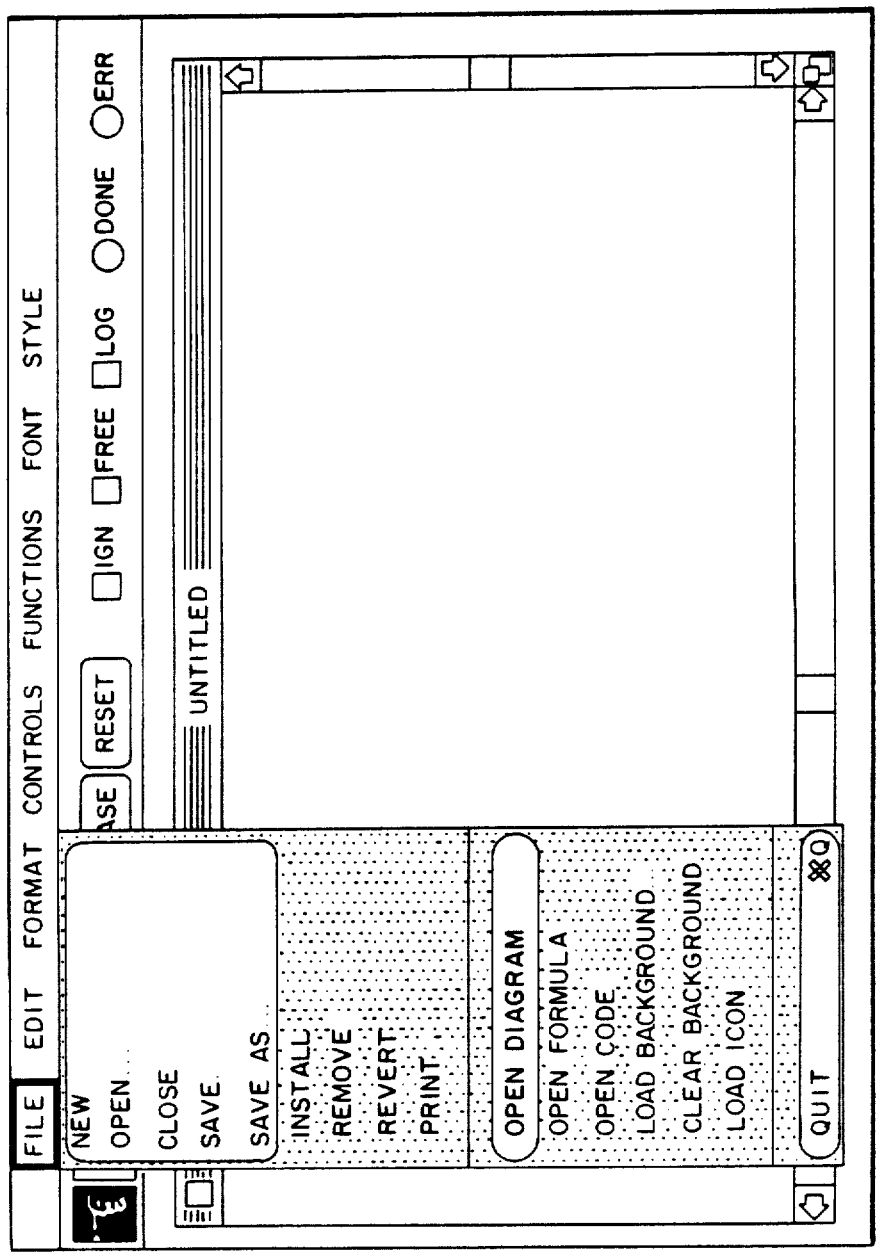
FIG. 24 illustrates the FILE menu (Items in clear surrounds can be used and stippled items do not yet work)

FIG. 24 shows the contents of the FILE menu. In this and subsequent screen pictures, items in clear surrounds can be selected. Stippled items do not yet work. The NEW, OPEN, CLOSE, SAVE and SAVE AS . . . items work as in any other MacIntosh program that follows Apple's user-interface guidelines. NEW opens a new instrument, OPEN brings up a dialog box with existing instruments' names, CLOSE closes the current instrument, SAVE saves the instrument with the current file name, and SAVE AS . . . saves a copy of the current instrument under the user-specified instrument name. OPEN DIAGRAM opens the block diagram window. Its use will be describe later. QUIT exits from PROTO and returns the user to the Finder.

Figure 25:
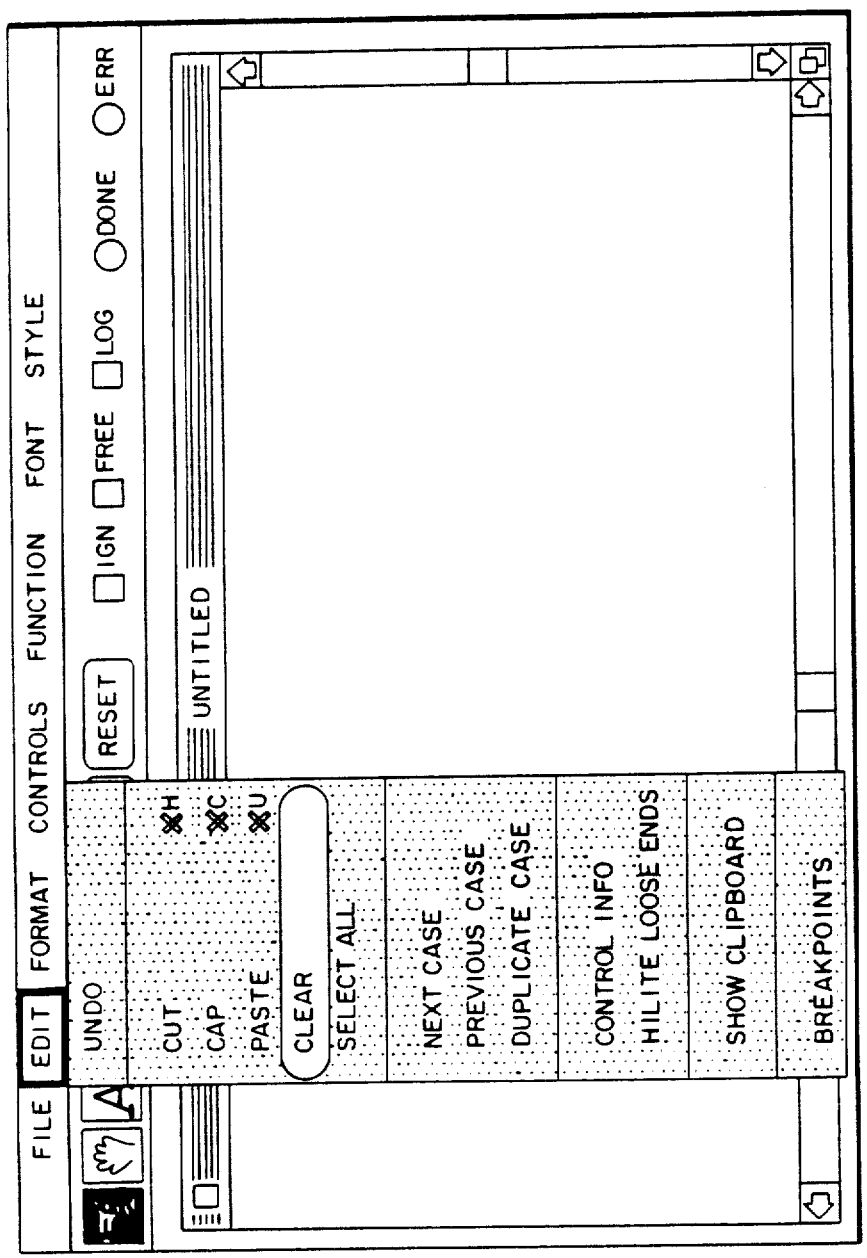
FIG. 25 illustrates the EDIT menu.

FIG. 25 shows the EDIT menu selections. This one is easy. Only CLEAR works. CLEAR is useful for removing items from the active window, e.g., selected wires and structures from the block diagram window, or controls from the front panel window.

Figure 26:
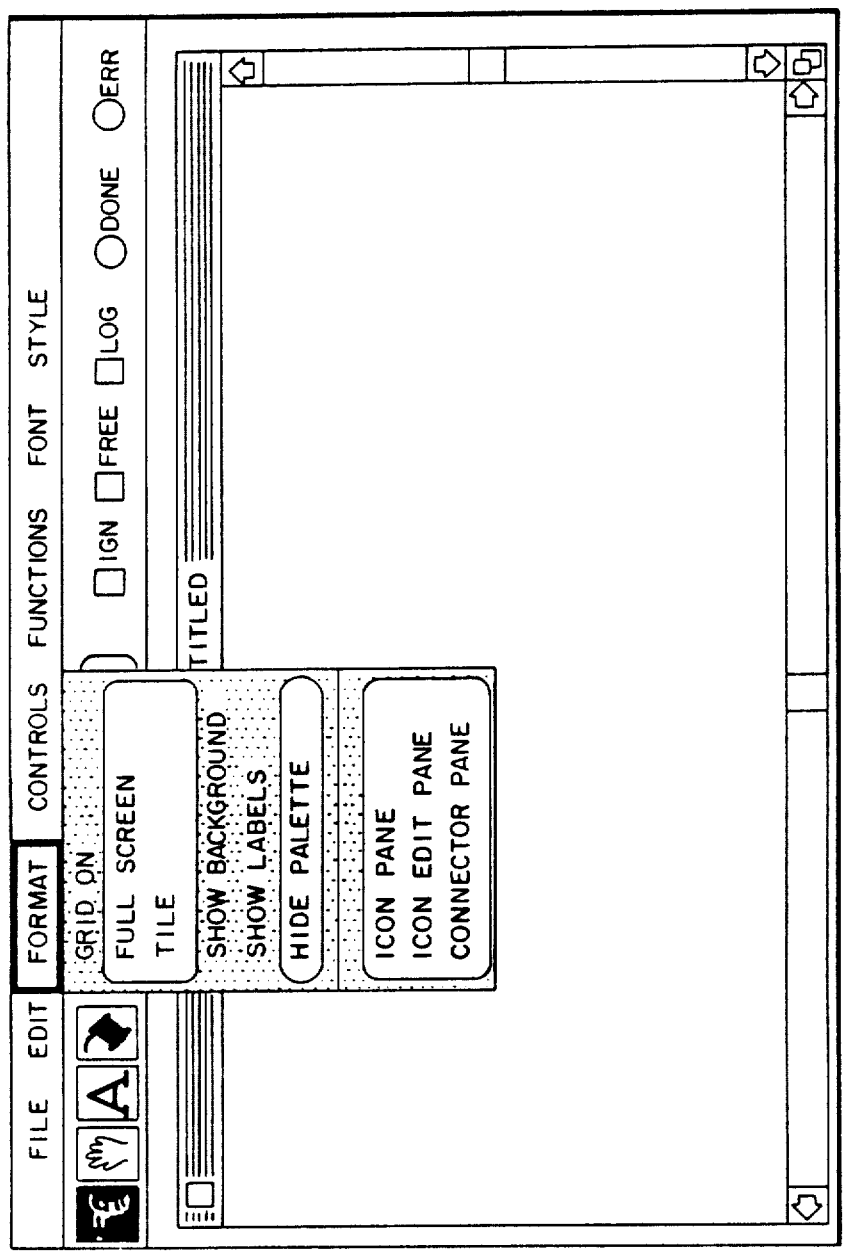
FIG. 26 illustrates the FORMAT menu.

FIG. 26 shows the FORMAT menu. The FORMAT menu has five working items. The first two FULL SCREEN and TILE alter the screen display. The FULL SCREEN options produces over-lapping windows. The TILE option produces non-overlapping windows. Both the FULL SCREEN and TILE selections can be reverted by selecting them again. The TILE option is dimmed if a block diagram window is not open.

Figure 27:
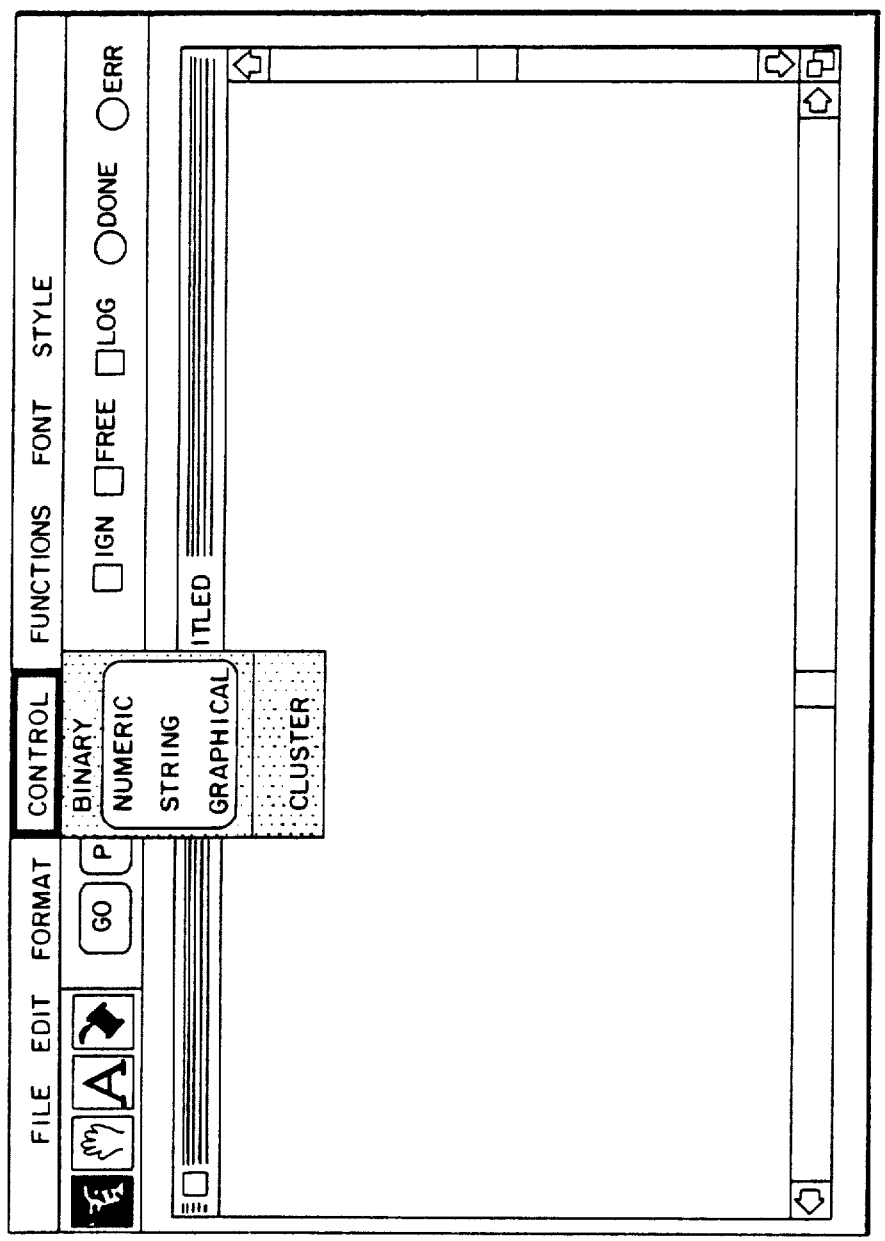
FIG. 27 illustrates the CONTROL menu from the front panel window.

FIG. 27 shows the contents of the CONTROL menu. The CONTROL menu is only available when the front panel window is active. The NUMERIC, STRING and GRAPHICAL items all work to some degree. Choosing the NUMERIC item brings up the dialog box shown in FIG. 28. This box offers the user many choices, however, only a few are implemented at this time. The small glyphs half-way down the left side of the box offer the choice of display style. clicking on the chosen glyphs produces a reverse-video display of that pictograph. MINIMUM, MAXIMUM and DEFAULT work by selecting their adjacent frames and filling in the desired values. Arrays can be specified by choosing the number of dimensions and inserting that number into the frame to the left of ARRAY DIMENSIONS. The number of elements in each array dimension is then specified by entering appropriate values into the dimension frames numbered 1 to 8. Selecting the INDICATOR ONLY box makes the control a passive indicator on the front panel. Selecting SHOW DIGITAL READOUT provides a digital readout of the value of the control. The current value of the control can be altered by adjusting the control itself or by altering the value in the digital read out by selecting and entering values from the keyboard.

Note the CONTROL menu is dimmed when the block diagram window is the active window. It is made available by making the front panel window the active window.

FIG. 29 shows the dialog box for the STRING control. String controls can be filled with values for use as controls or indicators. This capability is useful for sending command or address strings for writing to and reading from a GPIB.

FIG. 30 shows the dialog box for the GRAPHICAL control. This control is used to display graphs. It must be used with the INDICATOR ONLY box selected.

The FUNCTIONS menu name is dimmed when the front panel window is active. It becomes available when the block diagram window is made the active window.

Figure 31:
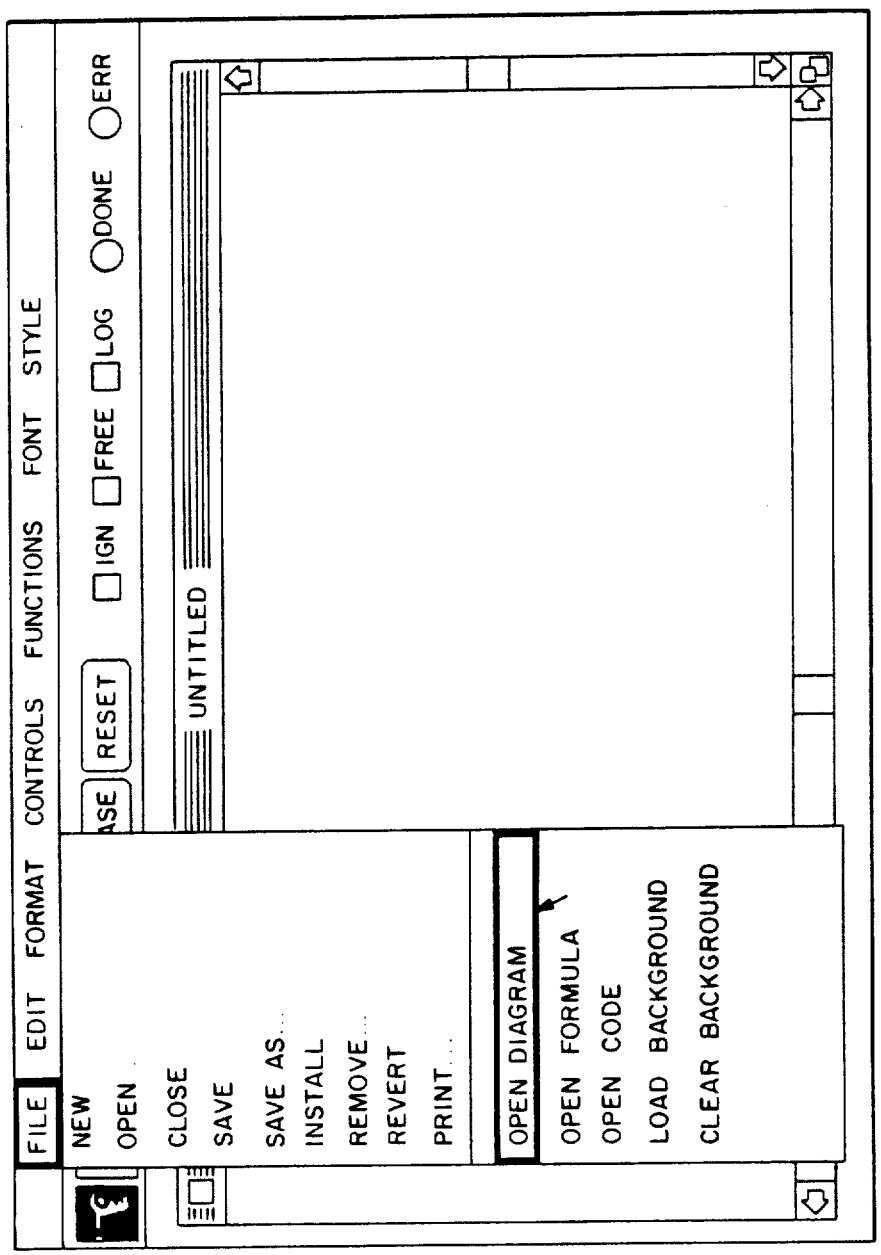
FIG. 31 illustrates an OPEN DIAGRAM selection from the FILE menu of the active front panel window pens and makes active a block diagram window.
Figure 32:
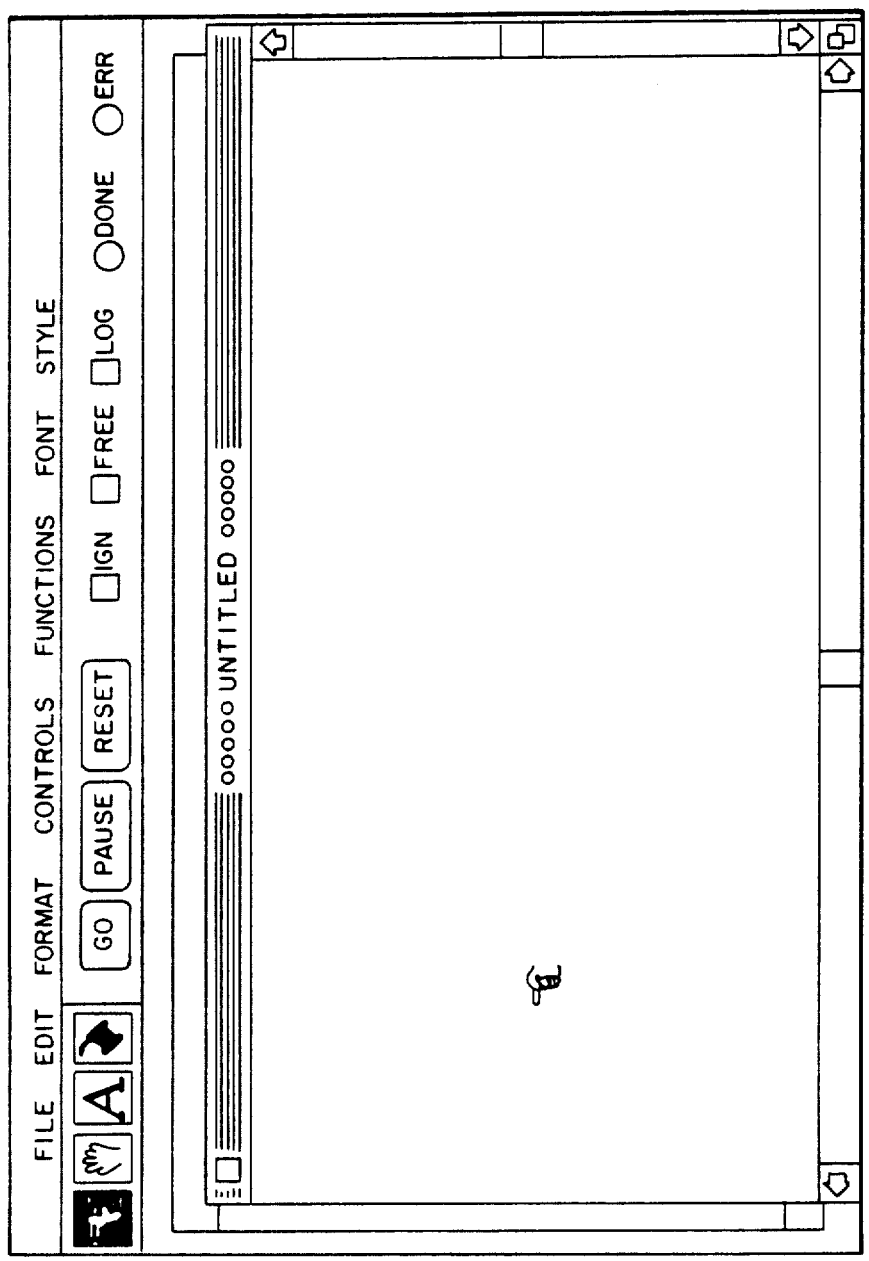
FIG. 32 illustrates employ, active Block-Diagram window created by choosing OPEN DIAGRAM from the FILE menu.

FIG. 31 shows the FILE menu displayed from the front panel window and the OPEN DIAGRAM item selected. Selecting this item opens a block diagram window. FIG. 32 shows the screen for a new block diagram window.

Notice that the untitled block diagram window is distinguishable from an untitled front panel window by the presence of the black bullets (···) in the title bar and the dimming of the CONTROL menu name. A block diagram is created by choosing items from the FUNCTIONS menu. FIG. 33 shows the contents of the Functions menu. Only a subset of functions from the items SPECIAL, ARITHMETIC, COMPARATIVE, INPUT-OUTPUT are working. Single functions are also available from STRING, SIGNAL PROCESS and CURVE FIT. The working functions from each of the menu options will be described in turn.

The functions available from the SPECIAL option of FUNCTIONS menu include STRUCTURES, SPECIAL ITEMS, and CONSTANTS. Each of the available functions is described below.

Structures

To remedy shortcomings of the conventional data flow, which makes it substantially unusable as a programming language, the present invention includes graphical operators. These structures implement in a data flow environment what typical structured programming control do.

Sequence Structure

The sequence structure in its simplest form serves to divide the data flow diagram into two subdiagrams, the inside of the structure and the outside of the structure. The outside diagram behaves exactly as if the sequence structure and its contents were replaced by an icon with hot spots for each line crossing the structure border.

FIG. 34 shows a 3D view of a three diagram sequence; however, to minimize screen space, only one diagram at a time is visible. Inside the structure border are multiple diagrams which execute in sequence. This sequence is indicated by the numeral in the upper left corner. When the first diagram in the sequence completes execution, the next one beings. The process is repeated until all the diagrams in the sequence have been executed.

Each diagram in the sequence uses a subset of the incoming arcs and produces a subset of the outgoing arcs (the outgoing subsets must be mutually exclusive to avoid arc fan in, but the incoming subsets are arbitrary). Constants may be used within any of the diagrams without any constraints. Variables used within a diagram are strictly local to the sequence structure and may be assigned only once. Variables can be used multiple times in the diagrams following the diagram where the variable was defined.

The sequence structure does not begin execution until all the incoming arcs have data available, and none of the outgoing arcs produce data until all the diagrams have completed execution. There may be at most one arc that terminates at the sequence structure border itself, acting as a trigger for the sequence (it is just one more input which must be present for the sequence to begin). An arc originating at the sequence structure border may be used as a ready signal indicating that the sequence has completed execution.

Interactive Loop ("for" loop) Structure

The iterative loop structure is similar to the sequence structure in that it partitions the data flow graphic into two pieces. The interior diagram represents the body of the loop and is similar to a sequence structure with N identical diagrams (FIG. 35). Arcs crossing the border of an iteration loop structure typically have a transformation applied. Incoming arcs are indexed in the most significant dimension so that the data inside the structure has dimensionality one less than outside. Outgoing arcs have the reverse transformation performed.

All arcs crossing the border must have the same size for the indexed dimension. It is possible to disable the indexing in which case an incoming arc behaves as if it were a constant available to each iteration. If indexing is disabled for an outgoing arc the value is repeatedly overwritten and only the last value propagates out from the iteration structure (this is one difference from the way N sequence diagrams would behave). By default, the most significant dimension is the one indexed but this may change to any dimension.

There are two special variables that behave as constants within the body of the iteration loop structure: the number of iterations (N) and iteration number, or index (i).

The number of iterations to be executed is automatically set by the size of the dimension being indexed. In the event that there are no incoming arcs a scalar value must be specifically connected to this variable to specify the number of iterations. The other variable is the iteration number (ranging from 0 to N−1, as in C).

Iterations are independent and could in principle be executed in any order or completely in parallel, except in the case where a non-reentrant virtual instrument is used. In this case, the iterations behave exactly like N identical sequence diagrams.

As usual, the iteration loop does not begin execution until all the incoming arcs have data available, and no outgoing arcs have tokens generated until all iterations have completed execution. An arc originating at the iteration loop structure border may be used as a ready signal indicating that the loop has completed execution.

Case (Conditional) Selection Structure

The case (conditional) selection structure of FIG. 36 is similar to the sequence structure in its usage of screen real estate, but it differs in its handling of arcs crossing the border in that each case diagram must use all incoming arcs and generate all outgoing arcs. The usual execution rules apply (all inputs available to start, all outputs generated simultaneously after all execution completes).

There must be exactly one arc that terminates at the case selection structure border itself, acting as a selector for the case. In the simplest case a boolean valued scalar is connected to the selector to select between case 0 (false) and case 1 (true). In the general case a scalar number (or string variable, if it is specified as a discrete list of strings) is connected to the selector.

Figure 37:
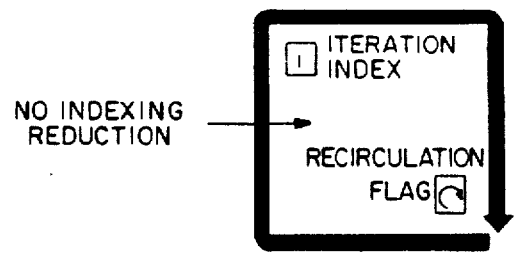
FIG. 37 shows a graphical presentation of an indefinite loop structure.

A special diagram (default case) may be specified to be used in the event that the selector does not lie in the range of specified cases. An arc originating at the case selection structure border may be used a a ready signal indicating that the selected case has completed execution. Indefinite Loop ("do-while" loop) Structure The indefinite loop structure is similar in concept to the iterative loop structure in that the interior diagram represents the body of the loop, but it differs in that arcs crossing the border of an indefinite loop structure typically do not have an indexing transformation applied. FIG. 37 shows a graphical representation of an indefinite loop structure.

There are two special variables available within the body of the indefinite loop structure. One is the iteration number which starts with a value of 0 and the other is the recirculation flag to which the value of the "while" expression is connected (if left unconnected it is equivalent to "while(true)").

Iterations are typically related so the operation of the indefinite loop is similar to an indefinite number of identical sequence diagrams. The usual execution rules apply. There may be at most one arc that terminates at the indefinite loop structure border itself, acting as a trigger for the loop (it is just one more input which must be present for the loop to begin). An arc originating at the indefinite loop structure border may be used as a ready signal indicating that the loop has completed execution.

Special Items: Shift Registers

There is one special construction which is available for use only within the loop structures. This construction is the shift register. The shift register eliminates the need for cycles in a data flow graph making the result much easier to understand and to prove correct. The shift register behaves as if it were an ordered set of two or more variables all of the same type and dimensionality.

Figure 38:
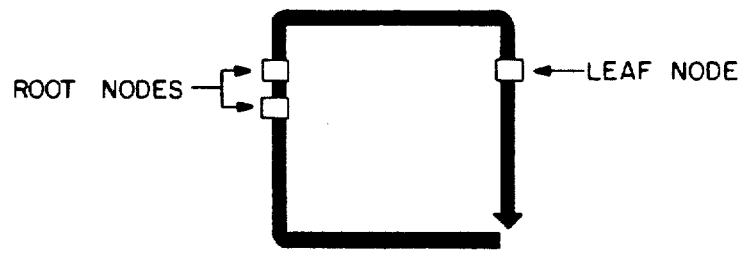
FIG. 38 shows a graphical representation of a shift register in loop.

The first one in the set must be a left node within the loop body diagram. The others must be root nodes within the loop body diagram. To include a shift register in the indefinite loop structure, one must first highlight the desired structure and then select the shift register from the functions menu item. The indefinite structure now shows two boxes on its left edge (root nodes) and one box on the right edge (leaf node). See FIG. 38.

At the conclusion of each iteration of the indefinite loop all shift registers within the body are "clocked", i.e., the value of the leaf node is placed in the first root node while the previous value of the first root node is placed in the second root node, etc.

Prior to the first iteration of the indefinite loop, root nodes of shift registers are set to false, zero, or empty string, as appropriate. These default initial values may be overridden by specifying alternative constants, or by setting the nodes using incoming arcs from arbitrary external expressions.

Using PROTO: The Fibonacci Number Problem

The best way to learn to use the presently preferred embodiment of the invention is to create a working virtual instrument. The following exercise is a standard one from introductory textbooks on computer programming: Creating a Fibonacci sequence. In place of the traditional programming languages like C or Pascal, we will use the presently preferred embodiment of the invention.

The Fibonacci sequence (1, 1, 2, 3, 5, 8, 13, 21, 34 . . . ) arises in such diverse applications as the number of petals in a daisy, the maximum time it takes to recognize a sequence of characters, and the most pleasing proportions for a rectangle. It is defined by the relations:

$$f(1)=1$$

$$f(2)=1$$

$$f(n)=F(n-1)+f(n-2) \text{ for } n>2$$

Starting with the third term, each Fibonacci number is the sum of the two previous Fibonacci numbers. In the Fibonacci instrument described below, the presently preferred embodiment is used to create a virtual instrument to generate and display a sequence of Fibonacci numbers. To accomplish this a number of features of the preferred embodiment are used including iterative-loop structure arithmetic functions, numeric and graphic controls and constants.

Getting Started

To get started, double click on the PROTO icon. You new screen should like FIG. 1. Construction of virtual instrument can start from either the Front-Panel or the block diagram windows, however, since labels for the controls are not yet implemented, it is perhaps easier to begin from the block diagram window. To reach the block diagram window pull down the FILE menu and choose OPEN DIAGRAM. This action will open an active block diagram window (see FIG. 32). You are now ready to build your virtual instrument.

Figure 39:
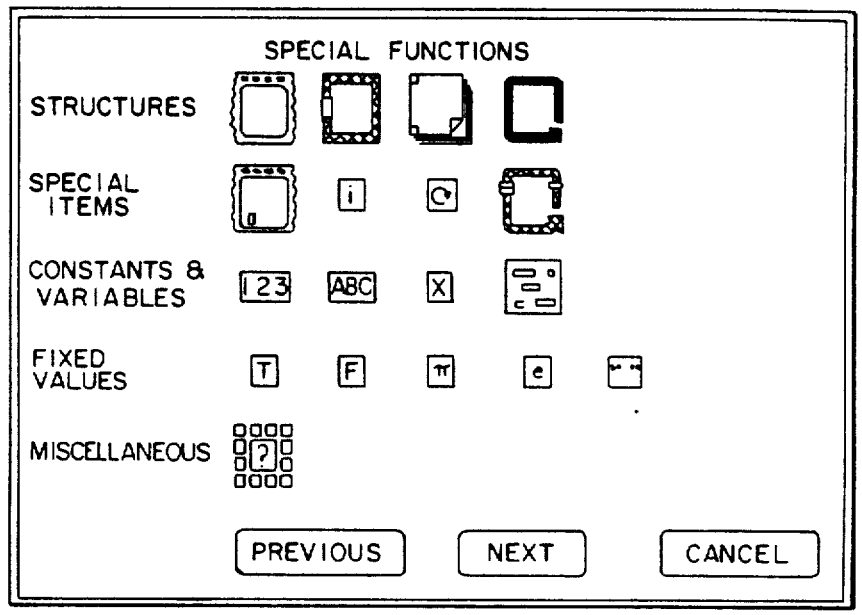
FIG. 39 illustrates a dialog box obtained by choosing SPECIAL from the FUNCTIONS menu.

Pull down the FUNCTIONS menus and choose SPECIAL. This choice will produce a dialog box with a display of functions (see FIG. 39). The four functions represented on the first line in the dialog box are described above. All four of these functions are implemented. An item is selected by placing the cursor on it and clicking. This action closes the dialog box and deposits the chosen item in your active block diagram window. FIG. 40 shows an example of a "for" loop structure layed down in the block diagram window in this manner.

Items chosen from the FUNCTIONS menu are always deposited near the center of the window, and if previous items are not moved new items may obscure old items.

Items may be selected and moved about in the active window by using the grabber glyph. Placing the cursor on the grabber glyph in the tool palette in the upper left portion of the screen just beneath the menu bar and clicking will change the cursor into the grabber when you move the mouse back down into the active-window area. The TAB key can also be used to change the tool. Pressing the TAB selects the next cursor in the palette.

Note: the "hot spot" on the grabber icon is at the base of the thumb and first finger.

Several actions, including moving objects, require that the object be "selected" before some action can be performed. To select a structure its "select regions" must be identified. The "for" loop structure object has two select regions, one along the right edge and a second along the bottom edge of the object. FIG. 41 shows the location of these regions. Positioning the grabber's hot spot in one of these regions and clicking will select the object. The case and "do-while" structures are selectable anywhere along their borders. The sequence structure is also selectable along its border except for the upper corners which perform the function of shifting forward and backward through the sequence. When selected, the object is surrounded by a moving dashed box. The object can now be moved by placing the grabber on the object and click-dragging to a new location. Releasing the mouse button will leave the object selected in its new location. Moving the cursor off the object and clicking will de-select the object.

Sometimes you may need to duplicate the structure you are working with. You could return to the FUNCTION menu, choose SPECIAL again and click on the object you want to use. There is a short-cut to duplicate objects from within the block diagram window. To duplicate the object from within the active window, use the grabber tool to select the objection to be duplicated, press the OPTION key and click-drag a copy off the original.

Note: Select can be an ambiguous term with reference to the Mac user interface. It is not synonymous with choose, rather, it is used to indicate that the object is to be "selected" by placing the cursor into a select region for that object and clicking the mouse button.

Two "for" loop structures are required for the Fibonacci instrument we are building. Use one of these two methods to duplicate a copy of the structure in your active window. Your active window should now contain two identical "for" loop structures.

It is often necessary to place objects within objects. To do this, it is helpful to be able to resize objects. The structures can all be resized in the same fashion. Place the grabber tool in the lower right-hand corner of the structure and click-drag the object to the desired size. FIG. 42 shows the proper placement of the grabber for the resize operation and the results of enlarging the original structure object.

Figure 43:
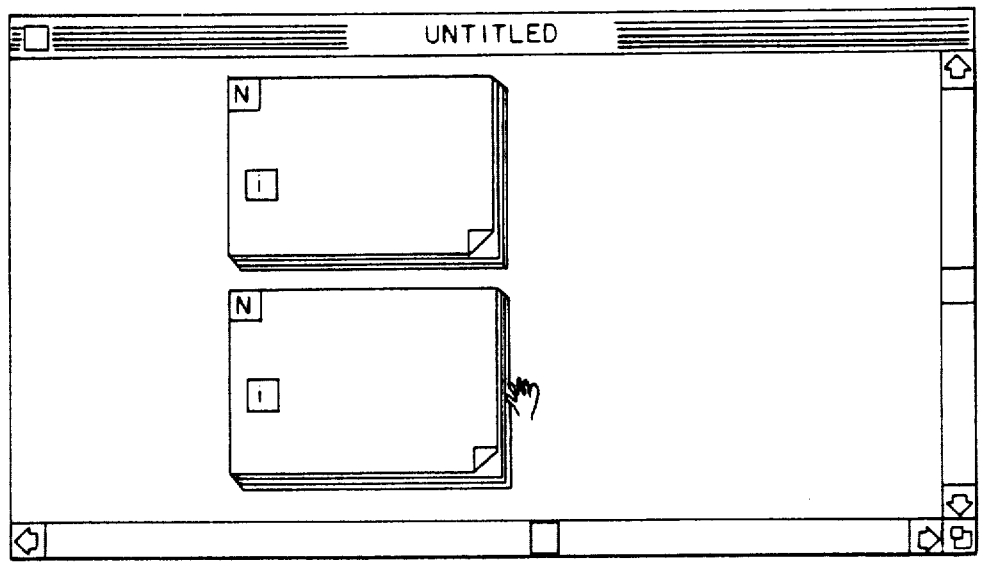
FIG. 43 shows two enlarged "for" loop structures rearranged for the Fibonacci instrument.

Additional functions are required in both loop structures for our instrument. Resize both loop structures to be about the same size of the larger objection in FIG. 42. Now reposition the two structures into locations similar to those shown in FIG. 43.

Figure 44:
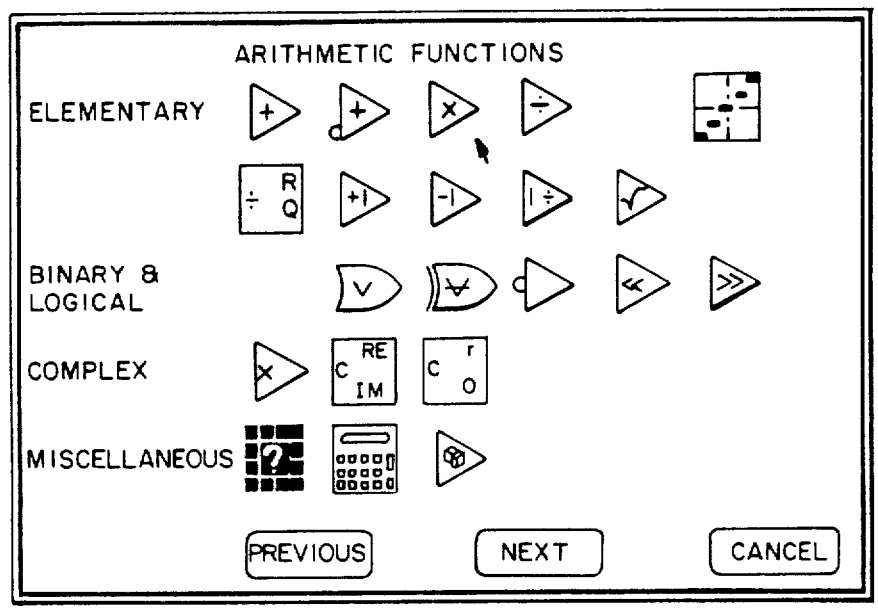
FIG. 44 shows the dialog box obtained by choosing ARITHMETIC from the FUNCTION menu.

The Fibonacci virtual instrument uses two arithmetic functions: addition and multiplication. These functions are obtained by choosing ARITHMETIC from the FUNCTIONS menu (see FIG. 33). Choosing this menu item opens the dialog box shown in FIG. 44. The functions currently implemented are: addition, subtraction, multiplication and division. Choose addition by clicking on the addition function glyph. FIG. 45 shows the result of choosing the addition function. The dialog box is closed and an object is placed near the center of the Block-Diagram window. Select this object by placing the grabber on it and clicking. The entire area of the arithmetic-function object is a select region. The selected object can now be click-dragged to a new position. Move the addition-function object to a location on the upper loop structure similar to the position shown in FIG. 46. Select a multiplication function and position it in the lower loop similar to FIG. 46.

Three more functions are needed before we move to the front panel and install some controls and indicators. First, pull down the FUNCTIONS menu again and select CURVE FIT. This choice will display the dialog box shown in FIG. 47. At this time only the linear-fit function is implemented. Choose LINEAR FIT. The object will drop approximately in the center of the screen. Click-drag the object to a position similar to the one illustrated in FIG. 48.

The next function we need is a shift register. This function must be used within a control structure, therefore a structure object must be selected before the shift register is selected from the SPECIAL menu item. Select the top loop, pull down the FUNCTION menu and select SPECIAL. From the SPECIAL dialog box choose the shift register glyph from the row of glyphs labelled: SPECIAL ITEMS (see FIG. 39). FIG. 49 shows what the loop structure looks like with the shift register function installed. Operation of the shift register function was reviewed above.

The last functions to be implemented in the block diagram window are constants. Constants are available from the FUNCTIONs menu from the menu item labelled SPECIAL. We need two constants. Choose a numeric constant glyph from the dialog box and duplicate its object in the window. FIG. 50 shows the two constant objects moved into position alongside the inputs to the shift register. Set one constant to 1 and the other to 0 by using the operator (the "pointing finger") tool and double clicking in the constant box then typing in values from the keyboard.

Now we will move to the front panel window to implement some controls and indicators. Click on the exposed edge of the front panel (see FIG. 32). The Front-panel window should come to the front with an empty window. Notice that now the FUNCTIONS option in the menu bar is dimmend, by the CONTROLS option is darkened indicating that it can be accessed. Pull down the CONTROLS menu and choose NUMERIC. The contents of the CONTROLS menu are described above.

Choose the NUMERIC option from the menu. The dialog box should look like the one in FIG. 28. Move your cursor to the area of the three display styles on the left side of the dialog box and select the center glyph representing a "pointer" control. Notice that then selected the image of the glyph will change to reverse video. Move the cursor to the box labelled MINIMUM and double click to select it. If the interior of the box does not darken move your cursor around inside the box while clicking until you find the right spot. When the interior is darken enter 1 from the keyboard. Move the cursor to the box labelled MAXIMUM and enter 20. Now move the cursor to the box labelled OK and click. This action will close the dialog box and return you to the front panel window where you should see a larger representation of the pointer control you selected from the dialog box inside a moving dashed rectangle. Controls can be moved about the front panel window just as objects were moved in the block diagram window. Notice that the behavior of the controls is more like the non-structure objects in the block diagram window: the entire control is electable, there is not a limited select region like on the structures. Click-drag the pointer control to the upper left-hand region of the Window to a position similar to the one shown in FIG. 51. This control will determine the length of the Fibonacci sequence that your instrument calculates.

Return to the CONTROLS menu and again choose the NUMERIC option. This time select the box labelled INDICATOR ONLY and choose the DIGITAL CONTROL glyph (the right-most control glyph), then click in the OK box. The front panel window should now display a rectangle within a rectangle with the interior rectangle containing a 0. This control is a passive indicator. it will be used to display intermediate was well as final values of our Fibonacci instrument. We need a second indicator display. Controls can be duplicated in the same manner as objects in the block diagram window. Use the grabber tool. First select the control to be duplicated, depress the OPTION key and click-drag a copy off of the original. Arrange these two indicators to the left of the front panel window similar to the positions shown in FIG. 52.

Figure 53:
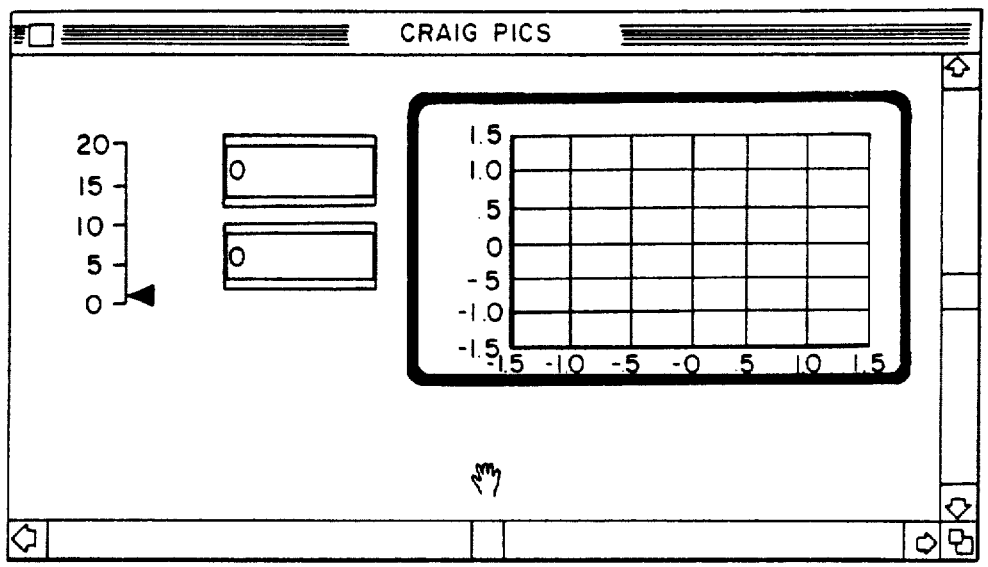
FIG. 53 shows the front panel window with graphical display repositioned to the upper right-hand corner of the window.

We need one more front panel control to complete or instrument, a graphical display. Return to the CONTROLS menu one more time and choose the GRAPHICAl option. This option will produce a dialog box like the one shown in FIG. 29. Choose INDICATOR ONLY. Do this and click the OK box to return to the front panel window. There should now be a rectangular-shaped graph with linear coordinates setting in the middle of the window. This is the graphical display control. It can be moved just like the objects in the block diagram window and the other controls on the front panel. It can also be resized, as can the other controls. The procedure for resizing is identical to the procedure used to resize objects in the block diagram: select the control and then click-drag with the grabber tool from the lower right-hand corner of the selected area. The situation with the NUMERIC controls is the same but because the fullness of the select region the area to "grab" with the grabber is less obvious, but it is the same region just interior to the lower right-hand corner of the select area. It may take a little practice to be able to reliably resize these controls. Move the graphical display to the upper right-hand corner of the window. Your screen should now look like the one shown in FIG. 53. At this point we can return to the block diagram window to "wire-up" the components of our block diagram into a working instrument that will be controlled by the front panel and display its output there as well.

Figure 54:
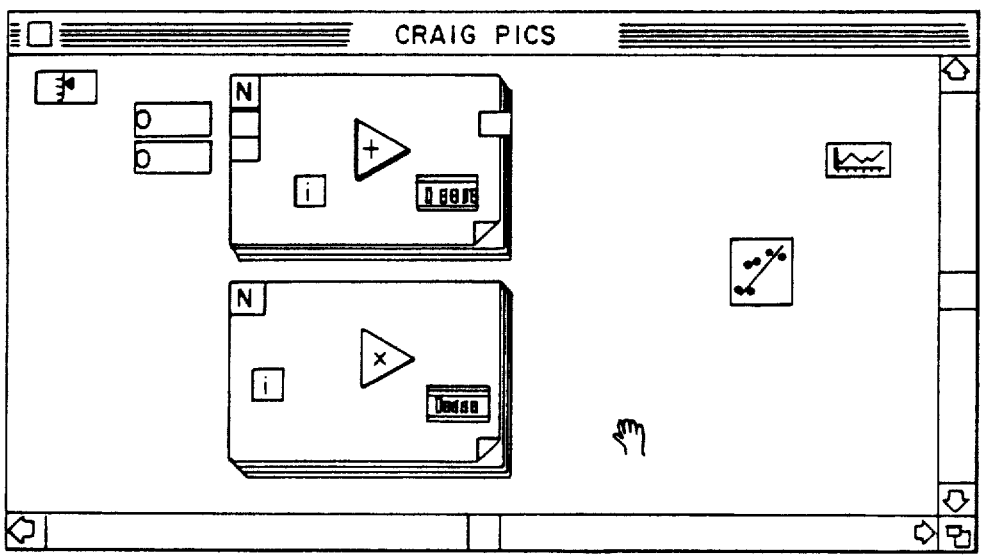
FIG. 54 shows the block diagram for the Fibonacci instrument with components in position ready for wiring.

You can return to the block diagram window either by clicking on the exposed edge of that window or by choosing OPEN DIAGRAM from the FILE menu. The first think you will notice is that your block diagram has changed. There are now four new objects in the block diagram window that were not there when we left. These block diagram representations of the front panel controls are called "terminals". These objects can be moved about the block diagram just like the original block diagram elements. Notice that with the exception of the constants, each of these elements bears a resemblance to the control laid down on the front panel. The constants are distinguished by their numerical contents representing the values they hold. When a control is "selected on the front panel, its terminal equivalent on the block diagram is "high-lighted", and vice-versa. Before we begin wiring up the block diagram we need to move the control terminals into closer proximity to their points of action. Using the grabber tool, click-drag each of the control terminals into positions similar to those shown in FIG. 54. We are now ready to begin to wire the elements into a working instrument. Note: If you original positioning of the block diagram objects differed significantly from our example, now is the time to rearrange your block diagram so that it more closely resembles FIG. 54. Eventually it should be relative easy to move about pieces of a wired diagram, but at present this is not possible.

Figure 55:
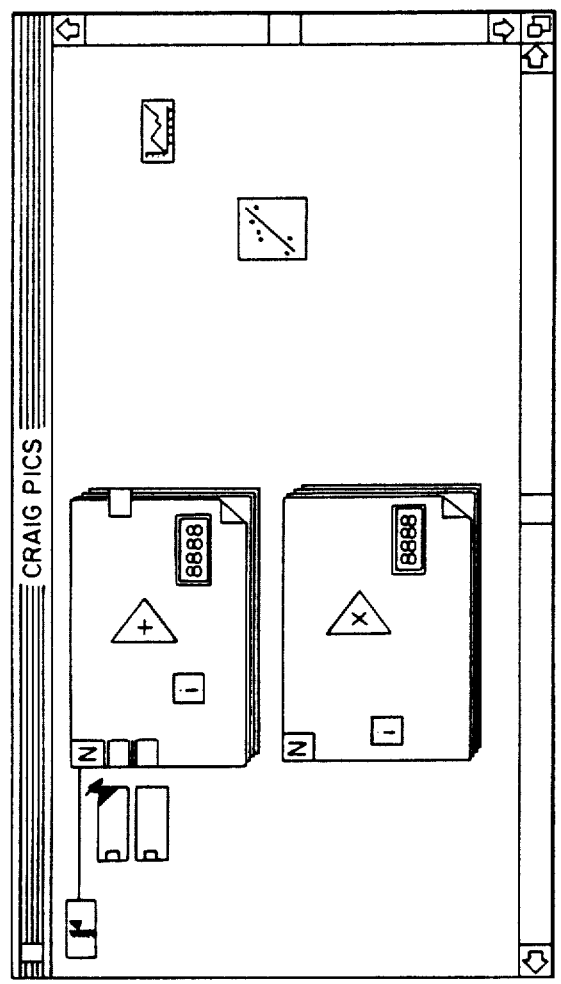
FIG. 55 illustrates that a connection is established between the slide-pointer control and the iteration variable box of the loop structure using the wiring tool.
Figure 59:
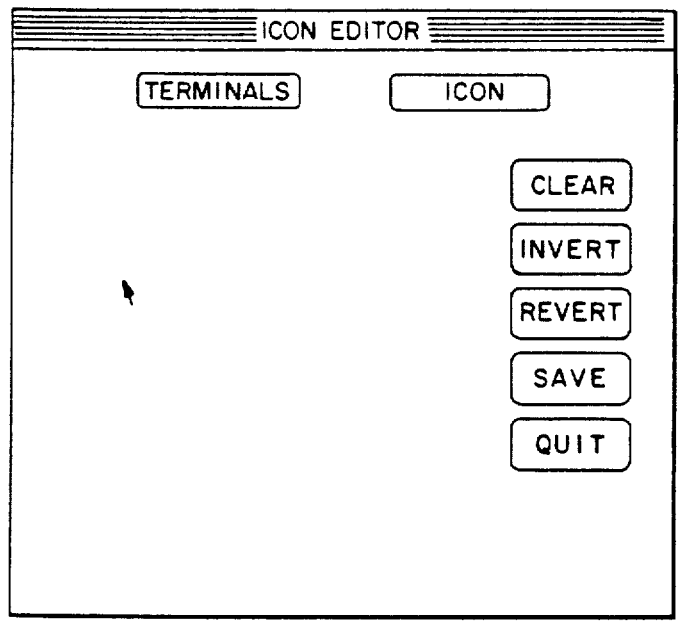
FIG. 59 is an illustration of the ICON EDITOR dialog box obtained by selecting the ICON EDIT PANE option from the FORMAT menu in the front panel window.

To connect component in the block diagram you must use the wiring tool. This tool is represented in the tool palette in the upper left-hand corner of the block diagram window by the wire-roll glyph. The hot spot on this took is the end of the unrolled stretch of wire. Move the cursor to the tool palette and click to select the connector, when you move the cursor back into the active-window area your cursor will now be the connector tool. Connections are established between block diagram components by clicking in a hot spot of one element and pulling the flickering line to a hot spot of component to which you want to connect. FIG. 55 shows the connection between the slide-pointer control used to set number of iterations in the loop and the iteration-variable box in the loop (labelled N). The "wire" is represented by a flickering line during the connecting operation. Clicking in a hot spot of the terminal component will change the wire to a non-flickering representation of the connection. The interior of objects, or object elements, represented by heavy black borders are "hot" anywhere within their borders. Other objects, for example, the LINEAR FIT object, have localized hot spots representing specific inputs and outputs. FIG. 56 shows the arrangement of hot spots for all available functions.

Connecting wires can be "forced" to turn corners where the user wants them to for purposes of neatness and legibility of the diagram. A single click while dragging a wire outside of a structure or other object, will allow the user to change direction at that point by 90°. Pulling the wire again will allow the user to continue toward their target connection. Try using this technique to connect the pointer control to the iteration variable box on the lower loop structure.

Often it is necessary to erase and redraw lines. To do this, use the grabber tool to select the line segment to be removed. Remember where the grabber hot spot is located (at the junction of the thumb and first finger) when trying to select wires. With the line segment selected, pull down the EDIT menu and choose CLEAR. This action will erase only the selected line segment. Successive pieces of the line must be removed individually repetitions of this sequence of actions. Tiny pieces of line segment may be difficult to select. Sometimes line segments successfully selected and cleared appear to remain on the block diagram. Trial-and-error is the name of the game here. Drawing replacement lines is identical to rawing new lines.

FIG. 57 shows the Fibonacci virtual instrument completely wired. Notice that the representations of the wires vary when they exit from various structures and functions.

These changes reflect the data type being represented. FIG. 58 shows the data types used by the preferred embodiment and their representations in the block diagram. Notice that the data type output from the LINEAR CURVE function in FIG. 57 is a structure. This structure consists of two arrays representing the two functions to be graphed. One function is the connected data points, the second the linear fit calculated by the LINEAR CURVE function.

You are now ready to return to the control panel and operate your instrument. Return to the front panel by finding the edge of the hidden window and clicking to bring it to the front. The front panel window has not changed and should still appear as it did in FIG. 53. To operate the front panel choose the operator tool from the tool palette. The operator tool is the left-most glyph in the palette, with the appearance of a finger about to press a button. This tool's hot spot is at the end of the pointed finger. Use this tool to move the pointer on the pointer control to some value between 1 and 20. Bring the pointed finger into proximity with the pointer on the control, click and drag the pointer to a new location. This action changes the value of the number of iterations, N, to be performed by the upper control loop in the block diagram to which it is connected. To the right of the tool palette, above the front panel window, but below the menu bar are several controls (see FIG. 23). Only GO is currently operable, but this is all you need to set your instrument into motion. Use the operator tool to select the button and watch the indicators and graph. The top indicator represents the current value of the Fibonacci number generated in the top loop and the bottom indicator displays the square of the index used to increment the loop. At the end of the loop a graph is displayed that contains two functions, the dark line is the connected data points representing the relation between a Fibonacci number and the square of its index in the sequence. The grey line represents the linear fit performed by the LINEAR CURVE function.

You now have a working instrument, the construction of which has used many, but not all of the working features of the current prototype of the preferred embodiment.

To help you in your further exploration of the system, two sections follow which describe the use of the tools in more detail, and provide some hints for using the sequence and "for" loop structures. These appendices and FIG. 56 are probably useful as "cheat sheets" for the new user after the first walk-through with the Fibonacci virtual instrument.

First Additional Explanation Section

OPERATE TOOL: Use this tool to operate the controls on the front panel or set constants on the block diagram.
Set or change control values
  DOUBLE-CLICK in control to select region for typing in value
Begin execution
  CLICK in log or free box
Set or change constants on block diagram
  DOUBLE-CLICK in control to select region for typing in value
Duplicate control, indicator, constants or structures
  select object, then OPTION-CLICK and DRAG copy
Clear object from front panel or Block Diagram
  select object, then chose clear from edit menu
GRABBER: Use this tool to select regions and move or resize objects.
Select control, indicator, or non-structure object
  CLICK anywhere on control or indicator on front panel, or non-structure object on block diagram
Select structure
  CLICK on bottom or right edge of structure
Move object
  once selected, CLICK anywhere in selected region and drag
Resize object
  CLICK-AND-DRAG on lower right corner to desired shape and size (sometimes it is easier to see "corner" you are looking for if you select the object first)
WIRING TOOL: Use this tool to connect objects in the block diagram and to associate controls and indicators with terminals on the front panel.
Connect objects on the block diagram
  CLICK on first object, draw wire to second object and CLICK
  CLICK to make 90° turn in wire
Choose Term Pane Pattern
  drop TermPane (Format menu)
  OPTION-COMMAND-CLICK to go to next pattern
Associate control or indicator and terminal with chosen pattern visible in Term Pane,
  CLICK on control then CLICK on terminal
Check association of control and terminal
  CLICK on control (associated terminal will be hilighted)
Disassociate control or indicator and terminal
  OPTION-CLICK on control to be disassociated

ALL TOOLS

Select new tool
  CLICK on tool
Select menu item
  CLICK on menu bar and drag down menu
Drop Control, function or structure
  within dialog boxes, any tool may be used
Move windows
  CLICK-AND-DRAG on title bar of window
Title windows
  DOUBLE-Click on title bar of one of the windows
Resize window to full screen
  DOUBLE-CLICK on title bar of window
Scroll windows
  CLICK on arrows, or inside scroll bars
Resize windows
  CLICK-AND-DRAG on grow-box in lower right corner of window Second Additional Explanation Section Sequence Structure: Express explicit time dependencies, i.e., execute block diagram in frame 0, then frame 1, then frame 2.
For best results, follow this sequence:
(1) Determine how may frames you want
  the first frame, 0, is given when you drop the structure to make a new frame COMMAND-CLICK with the grabber in the upper right corner and the frame number will increment do this for each frame desired-before filling any frames (2) Build block diagram in each frame select frame to work on by CLICKING with the grabber in the upper left corner (3) A wire coming into a sequence can be used in any of the frames in the sequence by wiring to the dark rectangle at the border.

(4) Wires leaving a sequence can only come from one source.

"FOR" LOOP STRUCTURE: Execute block diagram within loop N times.

Some hints:

(1) To force the number of iterations connect a numeric control to the box in the upper left corner of the structure containing an N, otherwise the loop will iterate ARRAYSIZE times (2) If new element from an array is used at each iteration, the array must be outside of the loop. The number of iterations will be set by the number of elements in the array (unless overridden by setting N?). Notice the array wire outside of the loop changes to a scalar wire inside the loop.

(3) The index (boxed i) in the structure is for your use, but need not be wired up (4) When building an array by producing a value at each iteration, the array is an indicator outside of the loop. Notice the scalar wire inside the loop, and array wire outside the loop structure.

(5) To view intermediate values at run-time, place a scalar indicator inside the loop and connect it to the wire carrying the value of interest before the wire leaves the structure.

CASE (CONDITIONAL) SELECTION STRUCTURE: Executes the block diagram chosen by the selector.

(1) Same as sequence (2) Same as sequence (3) A wire coming in (same as sequence)

(4) All wires leaving a sequence must have sources (be wired) in every frame of the sequence.

(5) The little box on the left-hand border is the selector box. At present, only numbers can be wired to it.

"WHILE" LOOP STRUCTURE: Execute diagram within loop until test becomes false.

Some hints:

(1) The little box with the Q in it should receive a boolean. When the input boolean is FALSE the loop will terminate. If it is not wired the loop will be infinite!

(2) The diagram in the "while" loop will always execute at least once.

(3) The index (boxed i) in the structure is for the user's use, but it need not be wired up.

(4) Arrays are not presently indexed when entering a while loop.

(5) Same as "for" loop.

Creating and Using Hierarchical Instruments

The capability of the preferred embodiments to use previously implemented virtual instruments within new instruments is a fundamental and powerful feature of the system. This capability allows the user to construct a hierarchy of virtual instruments by including previously implemented virtual instruments as "parts" in a new instrument. To facilitae the construction of such complex instruments the user must "prepare" the instruments to be included as components in an instrument hierarchy. This preparation includes defining the connections that will exist between the "controlling" (superior?) and "Component" (inferior?) virtual instruments and designing an icon to represent the "component" virtual instrument in the block diagram of the "controlling" virtual instrument. Three items in the FORMAT menu support these features: ICON PANE, ICON EDIT PANE and CONNECTOR PANE.

Figure 60:
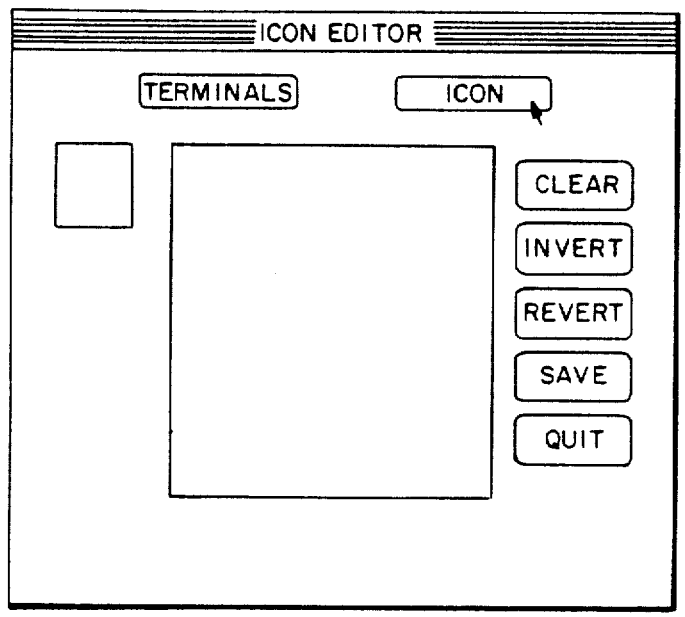
FIG. 60 is an illustration of the icon editor following selection of the ICON button.
Figure 61:
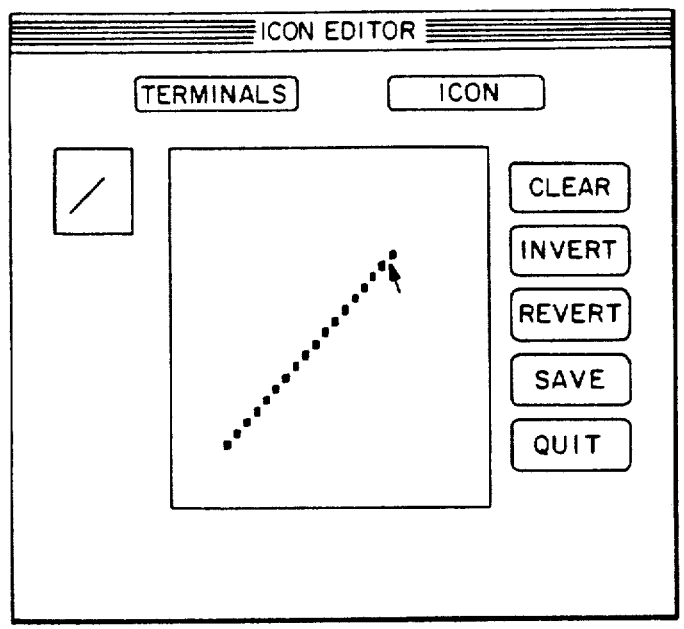
FIG. 61 is a drawing in the icon editor.

Choosing the ICON EDIT PANE option brings up the dialog box shown in FIG. 49. Clicking on the ICON button brings forth two boxes, one large and one small (see FIG. 60). The large box is the icon editing pane. Placing the cursor inside this box and clicking the mouse button produces a signal black square. Each square will appear as a single black dot on the screen in the finished icon. Click dragging inside the box produces a line of these squares (see FIG. 61). Clicking on existing squares removes them.

Operations inside this window are similar to the operation of MacPaint's FatBits mode. Actions performed in the large square are mimicked in the small square. The image in the small box is the default size of the object that will represent the instrument in the block diagram of the superior instrument. The dialog window has several additional buttons for manipulating the editing pane. The CLEAR button clears the contents of the window. The INVERT button swaps black squares for white squares (and vice-versa) across the whole editing pane. REVERT replaces the current contents of the editing window with the last saved version of the icon. SAVE saves the current contents of the editing pane. Possibly useful if you have made a number of changes in the image and are uncertain, about the remaining changes you are about to make The save version is the version returned upon choosing the REVERT button. QUIT returns the user to the front panel window.

Displaying the Instrument Icon

Figure 62:
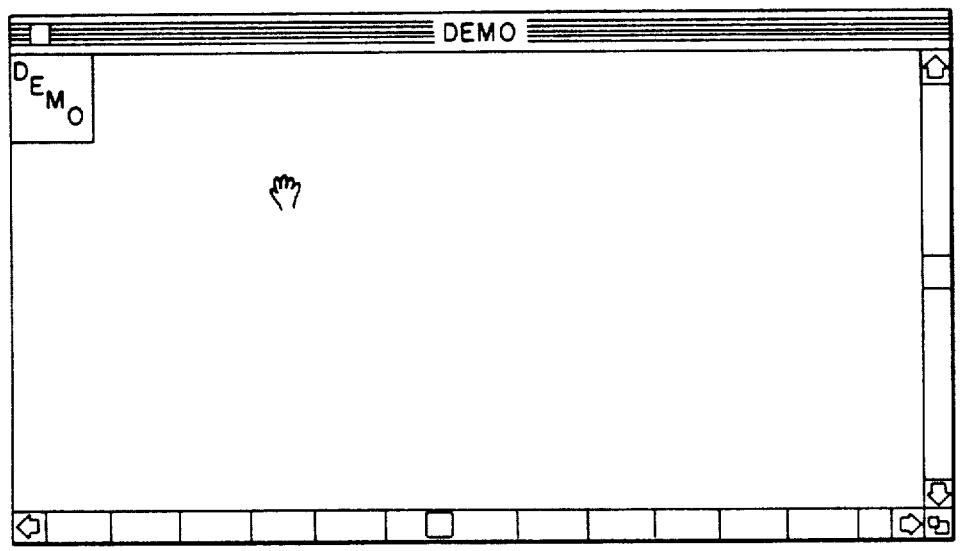
FIG. 62 is an illustration displaying the instrument icon in the front panel window.

Chosing the ICON PANE option from the FORMAT menu puts the icon, Demo here, associated with the current instrument in the upper left-hand corner of the front panel window (see FIG. 62). Choosing the same option again (now "checked" in the menu) removes the icon from the active window.

Using the Connector Pane to Establish Terminals

Creating instruments to serve as components within other virtual instruments requires that input-output connections or "terminals" be established to provide a means for transferring information between instruments. These connections are established through the mechanism of the CONNECTOR PANE.

In the front panel window, selecting the CONNECTOR PANE option from the FORMAT menu places a small rectangular pane in the upper left-hand corner of the active window (see FIG. 63). Within this pane are several sectors, or "terminals". The configuration of terminals displayed in this pane represent the pattern of "hot spots" or terminal connections thru which information can flow between this instrument and other instruments, or instrument components. There are currently eight different patterns of connector terminals available (see FIG. 64). The user can view the selection of available terminal patterns, when the wiring tool is in use, by holding down both the OPTION and COMMAND keys, clicking the mouse button. Note: the cursor does not have to be in the connector pane to shift patterns. Each click will bring up a new terminal pattern. Once the eight available patterns are displayed, continuing to click will cycle through the selection again. The pattern displayed in the connector pane is the one available for "wiring". To make an association between a terminal in the connector pane and a control (or display) select the terminal by clicking in it with the wiring tool. The selected terminal will turn black (see FIG. 65a). Move the cursor to the control to be associated with this terminal and click. The selected control will be encircled by the familiar moving dashed rectangle to indicate its selected status (see FIG. 65b). Moving the cursor off the selected control and clicking will de-select both the terminal and the control. The connected but de-selected terminal will now appear grey to show that it is connected (see FIG. 65c). Connections can be established in the opposite order also: select the control and then select the terminal. At any later time the established associations between terminals in the connector pane and controls or displays on the Front panel can be examined by clicking on either a terminal or a control. The associated elements will both appear selected.

Associations between terminals and controls can be disconnected by selecting the control, holding down the COMMAND key and clicking. All connections can be severed by holding down both the OPTION and COMMAND keys and clicking (cursor must be the wiring tool). This action bring sup the dialog box show in FIG. 66. Choose OK and all associations will be removed and a new terminal pattern can be selected.

Associations between terminals and controls can be disconnected by selecting the control, holding down the COMMAND key and clicking. All connections can be servered by holding down both the OPTION and COMMAND keys and clicking (cursor must be the wiring tool). This action rings up the dialog box shown in FIG. 66. Choose OK and all associations will be removed and a new terminal pattern can be selected.

Once you have created an icon and implemented terminal connections in the connector pane you can use this instrument as a component in another instrument. From the block diagram window, pulling down the FUNCTIONS menu and selecting the INSTRUMENTS option will bring up the familiar dialog box offering a choice of file names in a window. Select the name of the instrument you wish to use in your block diagram. The dialog box will close and the icon associated with your chose virtual instrument will appear in the block diagram window. At this point the virtual instrument object can be manipulated in exactly the same fashion as the functions you have used previously. In the next section a simple hierarchical instrument will be constructed in which two low-level instruments are operated through a controlling virtual instrument.

A Hierarchial Virtual Instrument

The simple hierarchical virtual instrument we will walk through calculates the total resistance for a parallel circuit with two resistive elements;

$$1/R_T = 1/R_1 + 1/R_2$$

Since we must perform several inversion operations to obtain $R_T$, a first instrument to construct is a simple inverter:

Note:
1. In building this hierarchial instrument it is assumed that the reader is familiar with the system as described in earlier sections of this patent application, and has successfully implemented the Fibonacci number generator.
2. To illustrate the construction of this instrument "tiled" windows are used to conserve time and space in generating the figures (see FIG. 26 re TILE option).

The first task, then, is to build a simple inverter. FIG. 67 shows the front panel and block diagram for this instrument. In the block diagram, a constant and a variable quantity are the input to a division operator. The output from the division operation is fed to an "indicator-only" control. The constant has been set to one (in the block diagram). The slide control (with digital display) in the front panel determines the value to be inverted. When these elements have been wired together, their correct function should be verified by setting the slide control in the front panel window should display the inverse of the value specified on the slide control (see FIG. 68). You are now ready to establish the terminal that will accept a value from a higher-level instrument to set the slide control's value in this instrument, and to return the calculated value displayed here to the hiher-level virtual instrument.

To obtain the connection pane in the front panel window, pull down the FORMAT menu and select CONNECTOR PANE. This action will display a connector pane in the upper left corner of the front panel window. With the wiring tool selected, "toggle" through the terminal patterns by clicking the mouse button while holding down both the OPTION and COMMAND keys until the two-terminal pattern is displayed (the left-most pane in FIG. 63). Use the wiring tool to select the left terminal and then select the slide control. The terminal will blacken and the slide control will be surrounded by the familiar moving dashed line when they are selected (see FIG. 65) for the consequences of a similar sequence of actions). Click outside the control to complete the connection. The selected terminal will turn grey and the moving dashed line will disappear. The grey terminal is now "connected" to the slide control. The indicated portion of the square connector pane corresponds to the input "hot spot" region on the instrument's to-be-built icon. Select the remaining terminal and connect it to the indicator-only control. In the same fashion as described above, this newly selected region will correspond to the output region on the instrument's icon. When both connections are complete, both terminals in the connector pane will be grey. At this time your screen display should appear similar to FIG. 64b. The next task is to create an icon to use with the inverter instrument.

Review the section on icon editing, set forth above, and create an icon similar to the one shown in FIG. 69. When your icon has been created, and saved, QUIT the icon editor. The inverter instrument is now ready to be saved. From the FILE menu select CLOSE and save the instrument with a descriptive name, like INVERTER.

Figure 71:
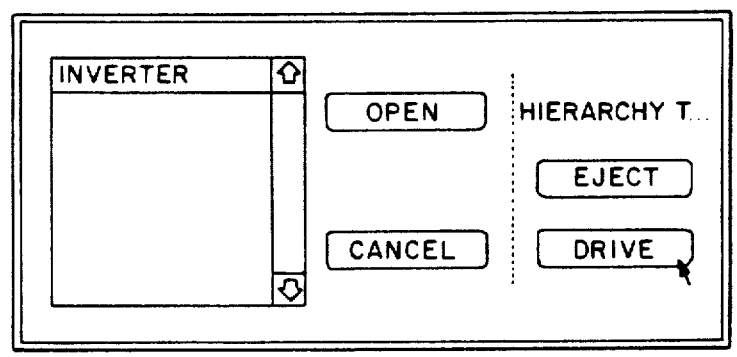
FIG. 71 is an illustration of the dialog box for selecting instrument to drop into block diagram window.

In your next instrument you will use the INVERTER instrument to calculate $1/R_T$ for two resistances in parallel. FIG. 70 shows the front panel and block diagram for an instrument to perform this calculation. At this point, only one new piece of information is necessary to construct this instrument. How to drop the new instrument into the block diagram window. Pull down the FILE menu and select NEW. Pull down the FILE menu again and select OPEN DIAGRAM. Pull down the FORMAT menu and select TILE. From within the block diagram window, pull down the FUNCTIONS MENU and select INSTRUMENTS. A dialog box similar to the one shown in FIG. 71 will appear.

Figure 72:
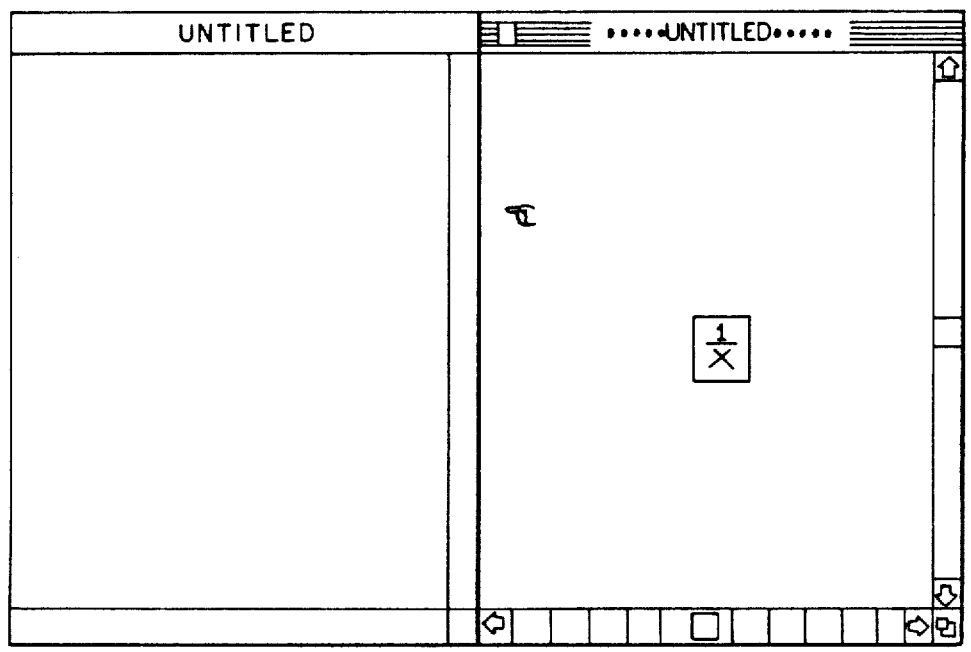
FIG. 72 is an illustration of an user-created reciprocal virtual instrument icon dropped into block diagram window.
Figure 73:
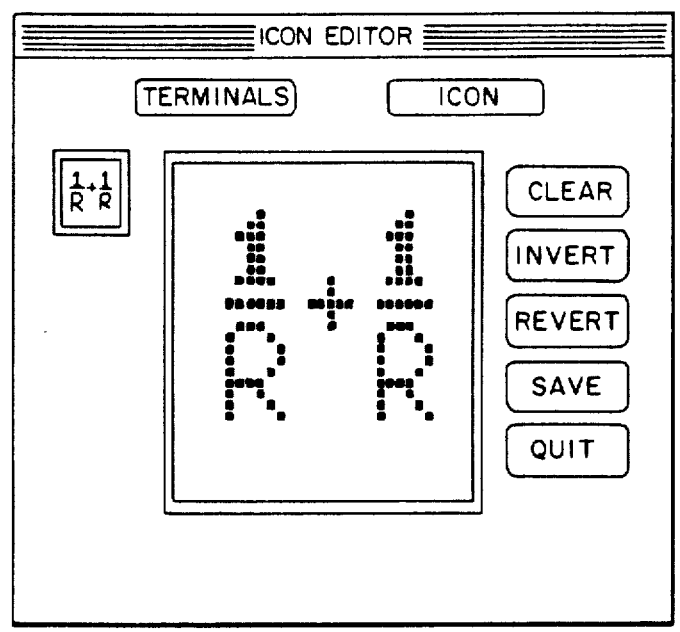
FIG. 73 is an illustration of an icon for user-created invert-and-add instrument.

Unless you have done this before, or are using someone else's system, only one instrument will be available: the INVERTER instrument you just created. Select this instrument by double clicking on the instrument name (or single clicking on the name and then single clicking on the OPEN button). The dialog box will disappear and your icon for the inverter instrument will appear in the block diagram window (see FIG. 72). This icon now represents an object that can be moved about in the block diagram window just like the pre-defined functions and structures you have previously used. The "hot spot" for wiring to and from the instrument are the ones you specified when you connected the terminals in the connector pane. As defined above in the connector panel, the left half of this icon's area accepts inputs to the control which it is wired and the right half provides output from the lower-level instrument's indicator-only control.

Verify that the virtual instrument correctly (see FIG. 70) displays the sum of the inverses of the two resistances set with the two front-panel controls on the present instrument. Now use the icon editor to construct an icon for this instrument. FIG. 51 shows the one used here. Finally, assign terminals to the controls and display in the connector pane. Use the 2-to-1 terminal pattern (second from the left in FIG. 64). Close and name the instrument.

Armed with the two low-level instrument you have created you are ready to implement a solution to the problem set: compute $R_T$ for two resistances wired in parallel. FIG. 74 shows the example solution to the problem. Two controls are provided to provide the two resistances to be summed and an indicator-only control is implemented to display the answer. The block diagram window shows the two quantities specified by the front panel controls as input to the invert-and-add instrument (here named ADDIOVERR, see FIG. 75). The output from this instrument is input to the inverter to yield the solution $R_T$, shown in the display of the front panel window. Use several different values for input to verify the correct operation of your instrument (see FIG. 75).

At this point you have created a hierarchical virtual instrument using native preferred embodiment functions and two user-created instruments. Hierarchical virtual instruments work. Libraries of instruments can be created and selected instruments can be used as components in new instruments. With the principles demonstrated in this exercise you should be able to carry out your assignment and create libraries of instruments that perform functions useful to you as an end-user.

CONCLUSION

The system and method of the present invention, therefore, permit the computer-aided modelling of a process using graphical techniques which generally are more easily comprehended, especially by persons who do not possess specialized skills in computer programming techniques. The use of a computer-generated image of a front panel display permits a user to easily understand how data is provided to a system being modelled and how data is provided by the system. The block diagram editor permits a user to construct a graphical representation of a procedure for producing output data from input data using icons which reference modularized procedural units. A user may use the icon editor to construct his/her own icons; or he/she may call upon a ready-made library of icons. The execution subunit executes execution instructions which are constructed in response to the graphical images produced by a user to model a process. Thus, a user can program a computer substantially by constructing a hierarchy of icons connected to one-another so as to model a process. A user, therefore, can use the system and method of the present invention to program a computer to model a process using graphical techniques which generally are easier to comprehend.

Furthermore, the system and method of the present invention advantageously can use data flow techniques. The use of the structures, illustrated in FIGS. 8–17, facilitates the use of such data flow techniques. By using such techniques, a system modelled in block diagram form can operate in a parallel fashion, since each individual icon in a hierarchy comprising such a block diagram, operates as soon as all input data provided to it are available. In addition, such structures render graphical representations of block diagrams using such data flow techniques more comprehensible to a user, and, therefore, simplify the task of using such techniques. It will be understood that the above-described embodiments and methods are merely illustrative of many possible specific embodiments and methods which can represent the principles of the invention. Numerous and varied other arrangements and methods can be readily devised in accordance with these principles without departing from the spirit and scope of the invention. Thus, the foregoing description is not intended to limit the invention which is defined by the appended claims in which:

What is claimed is:

1. A method for programming a computer system including means for displaying images to control at least one of a virtual instrument and an instrument, the method comprising the steps of:
    displaying on the screen at least one first function-icon that references at least one first control means for controlling at least one first function;
    displaying on the screen at least one iteration-icon that references iteration control means for controlling multiple iterations of data flow;
    displaying on the screen at least one first input variable-icon that references at least one first input variable;
    displaying on the screen at least one first output variable-icon that references at least one first output variable; and
    assembling on the screen a first acyclic data flow diagram including the at least one first function-icon and the at least one iteration-icon and the at least one first input variable-icon and the at least one first output variable-icon, such that the diagram displays a first procedure for producing at least one value for the at least one first output variable-icon from at least one value for the at least one first input variable-icon, and such that the at least one iteration-icon in the diagram indicates multiple iterations of the at least one first function in the course of the first procedure.

2. The method of claim 1 and further comprising the step of:
assembling on the screen a first front panel including the at least one first input variable-icon and the at least one first output variable-icon.

3. The method of claim 2 and further comprising the step of:
simultaneously displaying on the screen the first front panel and the first data flow diagram.

4. The method of claim 2 and further comprising the steps of:
assigning at least one value for each at least one first input variable-icon;
after assigning at least one value for each at least one first input variable-icon, producing at least one value for the at least one first output variable-icon from the at least one assigned value for each at least one first input variable-icon.

5. The method of claim 4 wherein said step of assigning includes the steps of:
displaying said first front panel;
setting the at least one first input variable-icon to display the at least one assigned value.

6. The method of claim 5 and further including the step of:
displaying the at least one produced value in conjunction with the at least one first output variable-icon.

7. The method of claim 4 wherein said step of producing at least one value for the at least one first output variable-icon includes using said at least one first control means to control the first function.

8. The method of claim 7 wherein said step of producing at least one value for the at least one output variable-icon includes using the iteration control means to control multiple iterations of data flow to the at least one first control means.

9. The method of claim 1 wherein said step of assembling on the screen the first diagram includes:
arranging on the screen the at least one first function-icon and the at least one iteration-icon such that in the first diagram the at least one first function-icon is displayed on the screen adjacent to the at least one iteration-icon.

10. The method of claim 1 wherein said step of assembling on the screen the first diagram includes:
arranging on the screen the at least one first function-icon and the at least one iteration-icon such that in the first diagram the at least one first function-icon is displayed on the screen substantially inside the at least one iteration-icon.

11. The method of claim 1 and further comprising the step of:
selecting the at least one first control means.

12. The method of claim 11 and further comprising the step of selecting the iteration control means.

13. The method of claim 12 wherein:
said steps of selecting the at least one first control means and selecting the at least one iteration control means are performed automatically in the course of said steps of displaying on the screen the at least one first function-icon and displaying on the screen the at least one iteration-icon and assembling on the screen the first diagram.

14. The method of claims 12 or 13 wherein said first control means and said iteration control means are substantially implemented in software.

15. The method of claim 12 and further comprising the steps of:
reserving first input variable space in memory of the computer system corresponding to the at least one first input variable-icon; and
reserving first output variable space in memory of the computer system corresponding to the selected at least one first output variable-icon.

16. The method of claim 15 wherein:
said step of reserving first input variable space is performed automatically in the course of said steps of displaying the at least one first input variable-icon and assembling on the screen the first diagram; and
said step of reserving first output variable space is performed automatically in the course of said steps of displaying the at least one first output variable-icon and assembling on the screen the first diagram.

17. The method of claim 15 wherein said step of assembling on the screen the first diagram further includes the steps of displaying on the screen at least one first input arc between the at least one first input variable-icon and at least one of the at least one first function-icon and the at least one iteration-icon; and
displaying on the screen at least one first output arc between the at least one first output variable-icon and at least one of the at least one first function-icon and the at least one iteration-icon; and further comprising the steps of:
forming first input means for moving respective input values for the at least one first input variable between the at least one first input variable space and at least one of the at least one first control means and the iteration control means.

18. The method of claim 17 wherein:
said step of forming first input means is performed automatically in the course of said step of displaying on the screen the at least one first input arc.

19. The method of claim 18 and further comprising the steps of:
assigning at least one value for each at least one first input variable-icon;
storing in the reserved first input variable space each at least one assigned value;
after said steps of assigning and storing at least one value for each at least one first input variable-icon, moving each at least one value for the at least one first input variable-icon from the reserved first input variable space to at least one of the at least one first control means and the iteration control means using the first input means;
after said steps of assigning and storing at least one value for each at least one first input variable-icon, producing at least one value for the at least one first output variable-icon using the at least one first control means to control the first function and using the iteration control means to control multiple iterations of data flow to the at least one first control means; and
storing each produced value for the at least one first output variable-icon in the reserved first output variable space.

20. The method of claim 17 wherein:

the at least one first control means and the iteration control means and the first input means are substantially implemented in software.

21. The method of claim 15 and further comprising the steps of:
assigning at least one value for each at least one first input variable-icon;
storing in the reserved first input variable space each at least one assigned value;
after said steps of assigning and storing at least one value for each at least one first input variable-icon, producing at least one value for the at least one first output variable-icon; and
storing each value for the at least one first output variable in the reserved first output variable space.

22. The method of claim 21 wherein:
said step of storing each at least one assigned value is performed automatically in the course of said step of assigning.

23. The method of claim 1 wherein said step of assembling on the screen the first diagram further includes the steps of displaying at least one first input arc between the at least one first input variable-icon and at least one of the at least one first function-icon and the at least one iteration-icon and displaying on the screen at least one first output arc between the at least one first output variable-icon and at least one of the at least one first function-icon and the at least one iteration-icon.

24. A method for programming a computer system including display means for displaying images to control at least one of a virtual instrument and an instrument, the method comprising the steps of:
displaying on the screen at least one first function-icon that references at least one first control means for controlling at least one first function;
displaying on the screen at least one second function-icon that references at least one second control means for controlling at least one second function;
displaying on the screen at least one conditional-icon that references conditional control means for controlling conditional branching of data flow;
displaying on the screen at least one first input variable-icon that references at least one first input variable;
displaying on the screen at least one first output variable-icon that references at least one first output variable; and
assembling on the screen a first acyclic data flow diagram including the at least one first function-icon and the at least one second function-icon and the at least one conditional-icon and the at least one first input variable-icon and the at least one first output variable-icon, such that the diagram displays a first procedure for producing at least one value for the at least one first output variable-icon from at least one value for the at least one first input variable-icon, and such that the at least one conditional-icon in the diagram indicates a conditional branching of data flow to at least one of the at least one first function and the at least one second function in the course of the first procedure.

25. The method of claim 24 and further comprising the step of:
assembling on the screen a first front panel including the at least one first input variable-icon and the at least one first output variable-icon.

26. The method of claim 25 and further comprising the steps of:
assigning at least one value for each at least one first input variable-icon;
after assigning at least one value for each at least one first input variable-icon, producing at least one value for the at least one first output variable-icon from the at least one assigned value for each at least one first input variable-icon.

27. The method of claim 26 wherein said step of assigning includes the steps of:
displaying said first front panel;
setting the at least one first input variable-icon to display the at least one assigned value.

28. The method of claim 27 and further including the step of:
displaying the at least one produced value in conjunction with the at least one first output variable-icon.

29. The method of claim 26 wherein said step of producing at least one value for the at least one first output variable-icon includes at least one of:
using said at least one first control means to control the first function; and
using the at least one second control means to control the second function.

30. The method of claim 29 wherein said step of producing at least one value for the at least one output variable-icon includes using the conditional control means to control conditional branching data flow to at least one of the at least one first control means and the at least one second control means in the course of the first procedure.

31. The method of claim 25 and further comprising the step of:
simultaneously displaying on the screen the first front panel and the first data flow diagram.

32. The method of claim 24 wherein said step of assembling on the screen the first diagram includes:
arranging on the screen the at least one first function-icon and the at least one second function-icon and the at least one conditional-icon such that in the first diagram the at least one first function-icon is displayed on the screen adjacent to the at least one conditional-icon and the at least one second function-icon is displayed on the screen adjacent to the at least one conditional-icon.

33. The method of claim 24 wherein said step of assembling on the screen the first diagram includes:
arranging on the screen the at least one first function-icon and the at least one second function-icon and the at least one conditional-icon such that in the first diagram the at least one first function-icon is displayed on the screen substantially inside the at least one conditional-icon and the at least one second function-icon is displayed on the screen substantially inside the at least one conditional-icon.

34. The method of claim 33 and further comprising the steps of:
reserving first input variable space in memory of the computer system corresponding to the at least one fist input variable-icon; and
reserving first output variable space in memory of the computer system corresponding to the at least one first output variable-icon.

35. The method of claim 34 wherein:
said step of reserving first input variable space is performed automatically in the course of said steps of displaying the at least one first input variable-icon and assembling on the screen the first diagram; and said step of reserving first output variable space is performed automatically in the course of said steps of displaying the at least one first output variable-icon and assembling on the screen the first diagram.

36. The method of claim 34 and further comprising the steps of:
assigning at least one value for each at least one first input variable-icon;
storing in the reserved first input variable space each at least one assigned value;
after said steps of assigning and storing at least one value for each at least one first input variable-icon, producing at least one value for the at least one first output variable-icon; and
storing each produced value for the at least one first output variable in the reserved first output variable space.

37. The method of claim 36 wherein:
said step of storing each at least one assigned value is performed automatically in the course of said step of assigning.

38. The method of claim 34 wherein said step of assembling on the screen the first diagram further includes the steps of displaying on the screen at least one first input arc between the at least one first input variable-icon and at least one of the at least one first function-icon and the at least one second function-icon and the at least one conditional-icon; and
displaying on the screen at least one first output arc between the at least one first output variable-icon and at least one of the at least one first function-icon and the at least one second function-icon and the at least one conditional-icon; and further comprising the steps of:
forming first input means for moving respective input values for the at least one first input variable between the at least one first input variable space and at least one of the at least one first control means and the at least one second control means and the conditional control means.

39. The method of claim 38 wherein:
said step of forming first input means is performed automatically in the course of said step of displaying on the screen the at least one first input arc.

40. The method of claim 38 wherein:
the at least one first control means and the at least one second control means and the conditional control means and the first input means are substantially implemented in software.

41. The method of claim 38 and further comprising the steps of:
assigning at least one value for each at least one first input variable-icon;
storing in the reserved first input variable space each at least one assigned value;
after said steps of assigning and storing at least one value for each at least one first input variable-icon, moving each at least one value for the at least one first input variable-icon from the reserved first input variable space to at least one of the at least one first control means the at least one second control means and the conditional control means using the first input means;
after said steps of assigning and storing at least one value for each at least one first input variable-icon, producing at least one value for the at least one first output variable-icon using at least one of a step using the at least one first control means to control the first function and a step of using the at least one second control means to control the second function;
after said steps of assigning and storing at least one value for each at least one first input variable-icon, using the conditional control means to control conditional branching of data flow to at least one of the at least one first control means and the at least one second control means; and
storing each produced value for the at least one first output variable-icon in the reserved first output variable space.

42. The method of claim 24 wherein said step of assembling on the screen the first diagram further includes the steps of displaying at least one first input arc between the at least one first input variable-icon and at least one of the at least one conditional-icon and the at least one first function-icon and the at least one second function-icon and displaying on the screen at least one first output arc between the at least one first output variable-icon and at least one of the at least one conditional-icon and the at least one first function-icon and the at least one second function-icon.

43. The method of claim 24 and further comprising the step of:
selecting the at least one first control means and the at least one second control means.

44. The method of claim 43 and further comprising the step of selecting the conditional control means.

45. The method of claim 44 wherein:
said steps of selecting the at least one first control means and selecting the at least one second control means and selecting the at least one conditional control means are performed automatically in the course of said steps of displaying on the screen the at least one first function-icon and displaying on the screen the at least one second function-icon and displaying on the screen the at least one conditional-icon and assembling on the screen the first diagram.

46. The method of claims 44 or 45 wherein said first control means and said second control means and said conditional control means are substantially implemented in software.

47. A method for programming a computer system including means for displaying images to control at least one of a virtual instrument and an instrument, the method comprising the steps of:
displaying on the screen at least one first function-icon that references at least one first control means for controlling at least one first function;
displaying on the screen at least one second function-icon that references at least one second control means for controlling at least one second function;
displaying on the screen at least one sequence-icon that references sequence control means for controlling sequencing of data flow;
displaying on the screen at least one first input variable-icon that references at least one first input variable;
displaying on the screen at least one first output variable-icon that references at least one first output variable; and
assembling on the screen a first acyclic data flow diagram including the at least one first function-icon and the at least one second function-icon and the at least one sequence-icon and the at least one first input variable-icon and the at least one first output variable-icon, such that the diagram displays a first procedure for producing at least one value for the at least one first output variable-icon from at least one value for the at least one first input variable-icon and such that the at least one sequence-icon in the diagram indicates a sequencing of the at least one first function and the at least one second function in the course of the first procedure.

48. The method of claim 47 and further comprising the step of:
 assembling on the screen a first front panel including the at least one first input variable-icon and the at least one first output variable-icon.

49. The method of claim 48 and further comprising the step of:
 simultaneously displaying on the screen the first front panel and the first data flow diagram.

50. The method of claim 48 and further comprising the steps of:
 assigning at least one value for each at least one first input variable-icon;
 after assigning at least one value for each at least one first input variable-icon, producing at least one value for the at least one first output variable-icon from the at least one value for each at least one first input variable-icon.

51. The method of claim 50 wherein said step of assigning includes the steps of:
 displaying said first front panel;
 setting the at least one first input variable-icon to display the at least one assigned value.

52. The method of claim 51 and further including the step of:
 displaying the at least one produced value in conjunction with the at least one first output variable-icon.

53. The method of claim 51 wherein said step of producing at least one value for the at least one first output variable-icon includes the steps of using the at least one first control means to control the first function and using the at least one second control means to control the second function.

54. The method of claim 53 wherein said step of producing at least one value for the at least one output variable-icon includes using the sequence control means to control sequencing of data flow to the at least one first control means and the second control means.

55. The method of claim 47 wherein said step of assembling on the screen the first diagram includes:
 arranging on the screen the at least one first function-icon and the at least one second function-icon and the at least one sequence-icon such that in the first diagram the at least one first function-icon is displayed on the screen adjacent to the at least one sequence-icon and the at least one second function-icon is displayed on the screen adjacent to the at least one sequence-icon.

56. The method of claim 47 wherein said step of assembling on the screen the first diagram includes:
 arranging on the screen the at least one first function-icon and the at least one second function-icon and the at least one sequence-icon such that in the first diagram the at least one first function-icon is displayed on the screen substantially inside the at least one sequence-icon and the at least one second function-icon is displayed on the screen substantially inside the at least one sequence-icon.

57. The method of claim 47 and further comprising the steps of:
 selecting the at least one first control means and the at least one second control means.

58. The method of claim 57 and further comprising the step of selecting the sequence control means.

59. The method of claim 58 wherein:
 said steps of selecting the at least one first control means and selecting the at least one second control means and selecting the at least one sequence control means are performed automatically in the course of said steps of displaying on the screen the at least one first function-icon and displaying on the screen the at least one second function-icon and displaying on the screen the at least one sequence-icon and assembling on the screen the first diagram.

60. The method of claims 58 or 59 wherein said first control means and said second control means and said sequence control means are substantially implemented in software.

61. The method of claim 58 and further comprising the steps of:
 reserving first input variable space in memory of the computer system corresponding to the selected at least one first input variable-icon; and
 reserving first output variable space in memory of the computer system corresponding to the selected at least one first output variable-icon.

62. The method of claim 61 wherein:
 said step of reserving first input variable space is performed automatically in the course of said steps of displaying the at least one first input variable-icon and assembling on the screen the first diagram; and
 said step of reserving first output variable space is performed automatically in the course of said steps of displaying the at least one first output variable-icon and assembling on the screen the first diagram.

63. The method of claim 62 wherein said step of assembling on the screen the first diagram further includes the steps of displaying on the screen at least one first input arc between the at least one first input variable-icon and at least one of the at least one first function-icon and the at least one second function-icon and the at least one sequence-icon; and
 displaying on the screen at least one first output arc between the at least one first output variable-icon and at least one of the at least one first function-icon and the at least one second function-icon and the at least one sequence-icon; and further comprising the steps of:
 forming first input means for moving respective input values for the at least one first input variable between the at least one first input variable space and at least one of the at least one first control means and the at least one second control means and the at least one sequence control means.

64. The method of claim 63 wherein:
 said step of forming first input means is performed automatically in the course of said step of displaying on the screen the at least one first input arc.

65. The method of claim 64 wherein:
 the at least one first control means and the at least one sequence control means and the first input means are substantially implemented in software.

66. The method of claim 63 and further comprising the steps of:

assigning at least one value for each at least one first input variable-icon;

storing in the reserved first input variable space each at least one assigned value;

after said steps of assigning and storing at least one value for each at least one first input variable-icon, moving each at least one value for the at least one first input variable-icon from the reserved first input variable space to at least one of the at least one first control means and the at least one second control means and the sequence control means using the first input means;

after said steps of assigning and storing at least one value for each at least one first input variable-icon, producing at least one value for the at least one first output variable-icon using the at least one first control means to control the first function and using the at least one second control means to control the second function and using the sequence control means to control sequencing of data flow to the at least one first control means and the at least one second control means; and storing each produced value for the at least one first output variable-icon in the reserved first output variable space.

67. The method of claim 61 and further comprising the steps of:

assigning at least one value for each at least one first input variable-icon;

storing in the reserved first input variable space each at least one assigned value;

after said steps of assigning and storing at least one value for each at least one first input variable-icon, producing at least one value for the at least one first output variable-icon; and storing each produced value for the at least one first output variable in the reserved first output variable space.

68. The method of claim 67 wherein:

said step of storing each at least one assigned value is performed automatically in the course of said step of assigning.

69. The method of claim 47 wherein said step of assembling on the screen the first diagram further includes the steps of displaying at least one first input arc between the at least one first input variable-icon and at least one of the at least one first function-icon and the at least one second function-icon and the at least one sequence-icon and displaying on the screen at least one first output arc between the at least one first output variable-icon and at least one of the at least one first function-icon and the at least one second function-icon and the at least one sequence-icon.

70. A method for programming a computer system including display means for displaying images to control at least one of a virtual instrument and an instrument, the method comprising the steps of:

displaying on the screen at least one first function-icon that references at least one first control means for controlling at least one first function;

displaying on the screen at least one iteration-icon that references iteration control means for controlling multiple iterations of data flow;

displaying on the screen at least one feedback-icon that references feedback control means for controlling feedback of data;

displaying on the screen at least one first input variable-icon that references at least one first input variable;

displaying on the screen at least one first output variable-icon that references at least one first output variable;

assembling on the screen at least one first acyclic data flow diagram including the at least one first function-icon and the at least one iteration-icon and the at least one feedback-icon and the at least one first input variable-icon and the at least one first output variable icon, such that the diagram displays a first procedure for producing at least one value for the at least one first output variable-icon from at least one value for the at least one first input variable-icon and such that the at least one iteration-icon in the diagram indicates multiple iterations of the at least one first function and such that the at least one feedback-icon in the diagram indicates that in the course of the multiple iterations, at least one value for the at least one first output variable-icon produced in at least one iteration of the at least one first function is used in a subsequent iteration of the at least one first function to produce at least one subsequent value for the at least one first output variable-icon.

71. The method of claim 70 and further comprising the step of:

assembling on the screen a first front panel including the at least one first input variable-icon and the at least one first output variable-icon.

72. The method of claim 71 and further comprising the step of:

simultaneously displaying on the screen the first front panel and the first data flow diagram.

73. A method for programming a computer system including display means for displaying images to control at least one of a virtual instrument and an instrument, the method comprising the steps of:

providing a function class of respective function-icons that respectively reference respective control means for controlling respective functions;

providing a scheduling class of respective scheduling-icons that respectively reference scheduling control means for scheduling of data flow, wherein the class of respective scheduling icons includes, (i) an iteration-icon that references iteration control means for controlling multiple iterations of data flow, and (ii) a conditional-icon that references conditional control means for controlling conditional branching of data flow;

providing a variable class of respective variable-icons that respectively reference respective variables, selecting at least one first function-icon from the function class, the selected at least one first function-icon referencing at least one first control means;

selecting at least one scheduling-icon from the scheduling class, the selected at least one scheduling-icon referencing at least one scheduling control means;

selecting at least one first input variable-icon from the variable class;

selecting at least one first output variable-icon from the variable class; and assembling on the screen a first acyclic data flow diagram including the selected at least one first function-icon and the selected at least one scheduling-icon and the at least one first input variable-icon and the at least one first output variable-icon, such that the diagram displays a first procedure for producing at least one value for the at least one first output variable-icon from at least one value for the at least one first input variable-icon and such that the selected scheduling-icon in the diagram indicates scheduling of the at least one first function in the course of the first procedure.

74. The method of claim 73 and further comprising the step of:
  assembling on the screen a first front panel including the at least one first input variable-icon and the at least one first output variable-icon.

75. The method of claim 74 and further comprising the step of:
  simultaneously displaying on the screen the first front panel and the first data flow diagram.

76. The method of claim 74 and further comprising the steps of:
  assigning at least one value for each at least one first input variable-icon;
  after assigning at least one value for each at least one first input variable-icon, producing at least one value for the at least one first output variable-icon from the at least one assigned value for each at least one first input variable-icon.

77. The method of claim 76 wherein said step of assigning includes the steps of:
  displaying said first front panel;
  setting the at least one first input variable-icon to display the at least one assigned value.

78. The method of claim 77 and further including the step of:
  displaying the at least one produced value in conjunction with the at least one first output variable-icon.

79. The method of claim 76 wherein said step of producing at least one value for the at least one first output variable-icon includes using said at least one first control means to control the first function.

80. The method of claim 79 wherein said step of producing at least one value for the at least one output variable-icon includes using the scheduling control means to control scheduling of data flow to the at least one first control means.

81. The method of claim 73 wherein said step of assembling on the screen the first diagram includes:
  arranging on the screen the at least one first function-icon and the at least one scheduling-icon such that in the first diagram the at least one first function-icon is displayed on the screen adjacent to the at least one scheduling-icon.

82. The method of claim 73 wherein said step of assembling on the screen the first diagram includes:
  arranging on the screen the at least one first function-icon and the at least one scheduling-icon such that in the first diagram the at least one first function-icon is displayed on the screen substantially inside the at least one scheduling-icon.

83. The method of claim 73 and further comprising the step of:
  selecting the at least one first control means.

84. The method of claim 83 and further comprising the step of selecting the at least one scheduling control means.

85. The method of claim 84 wherein:
  said steps of selecting the at least one first control means and selecting the at least one scheduling control means are performed automatically in the course of said steps of displaying on the screen the at least one first function-icon and displaying on the screen the at least one scheduling-icon and assembling on the screen the first diagram.

86. The method of claims 84 or 85 wherein said first control means and said scheduling control means are substantially implemented in software.

87. The method of claim 84 and further comprising the steps of:
  reserving first input variable space in memory of the computer system corresponding to the selected at least one first input variable-icon; and
  reserving first output variable space in memory of the computer system corresponding to the selected at least one first output variable-icon.

88. The method of claim 87 wherein:
  said step of reserving first input variable space is performed automatically in the course of said steps of displaying the at least one first input variable-icon and assembling on the screen the first diagram; and
  said step of reserving first output variable space is performed automatically in the course of said steps of displaying the at least one first output variable-icon and assembling on the screen the first diagram.

89. The method of claim 87 wherein said step of assembling on the screen the first diagram further includes the steps of displaying on the screen at least one first input arc between the at least one first input variable-icon and at least one of the at least one first function-icon and the at least one scheduling-icon; and
  displaying on the screen at least one first output arc between the at least one first output variable-icon and at least one of the at least one first function-icon and the at least one scheduling-icon; and further comprising the steps of:
  forming first input means for moving respective input values for the at least one first input variable between the at least one first input variable space and at least one of the at least one first control means and the scheduling control means.

90. The method of claim 89 wherein:
  said step of forming first input means is performed automatically in the course of said step of displaying on the screen the at least one first input arc.

91. The method of claim 89 wherein:
  the at least one first control means and the scheduling control means and the first input means are substantially implemented in software.

92. The method of claim 89 and further comprising the steps of:
  assigning at least one value for each at least one first input variable-icon;
  storing in the reserved first input variable space each at least one assigned value;
  after said steps of assigning and storing at least one value for each at least one first input variable-icon, moving each at least one value for the at least one first input variable-icon from the reserved first input variable space to at least one of the at least one first control means and the scheduling control means using the first input means;
  after said steps of assigning and storing at least one value for each at least one first input variable-icon, producing at least one value for the at least one first output variable-icon using the at least one first control means to control the first function and using the scheduling control means to control scheduling data flow to the at least one first control means; and storing each value for the at least one first output variable-icon in the reserved first output variable space.

93. The method of claim 87 and further comprising the steps of:
assigning at least one value for each at least one first input variable-icon;
storing in the reserved first input variable space each at least one assigned value;
after said steps of assigning and storing at least one value for each at least one first input variable-icon, producing at least one value for the at least one first output variable-icon; and
storing each value for the at least one first output variable in the reserved first output variable space.

94. The method of claim 93 wherein:
said step of storing each at least one assigned value is performed automatically in the course of said step of assigning.

95. The method of claim 73 wherein said step of assembling on the screen the first diagram further includes the steps of displaying at least one first input arc between the at least one first input variable-icon and at least one of the at least one first function-icon and the at least one scheduling-icon and displaying on the screen at least one first output arc between the at least one first output variable-icon and at least one of the at least one first function-icon and the at least one scheduling-icon.

96. The method of claim 73 wherein said step of providing a scheduling class includes providing in the scheduling class:
(iii) a feedback-icon that references feedback control means for controlling feedback of data.

97. The method of claim 73 wherein said step of providing a scheduling class includes providing in the scheduling class:
(iv) a sequence-icon that references sequencing control means for controlling sequencing of data flow.

98. A method for programming a computer system including means for displaying images on a screen to control at least one of a virtual instrument and an instrument, the method comprising the steps of:
providing a class of respective function-icons that reference respective control means for controlling respective functions;
selecting from the class of function-icons at least one first function-icon that references at least one first control means for controlling a first function;
providing a class of respective variable-icons wherein each respective variable-icon references a respective variable;
selecting at least one first input variable-icon from the class of variable-icons;
selecting at least one first output variable-icon from the class of variable-icons;
assembling on the screen a first front panel including the at least one first input variable-icon and the at least one first output variable-icon; and
assembling on the screen a first data flow diagram including the at least one first function-icon and the at least one first input variable-icon and the at least one first output variable-icon, wherein the first diagram displays a first procedure for producing at least one value for the at least one first output variable-icon from at least one value for the at least one first input variable-icon.

99. The method of claim 98 and further comprising the step of:
in the course of said step of assembling on the screen said front panel, displaying on the screen the at least one first input variable-icon and the at least one first output variable-icon.

100. The method of claim 98 and further comprising the step of:
in the course of said step of assembling on the screen said first data flow diagram, displaying on the screen the at least one first function-icon and the at least one first input variable-icon and the at least one first output variable-icon.

101. The method of claim 98 and further comprising the step of:
simultaneously displaying on the screen the first front panel and the first data flow diagram 102. The method of claim 98 and further comprising the steps of:
assembling on the screen a first user-defined-function-icon that displays on the screen a reference to the first diagram;
selecting from the class of function-icons at least one second function-icon that references at least one second control means for controlling a second function;
selecting at least one second input variable-icon from the class of variable-icons;
selecting at least one second output variable-icon from the class of variable-icons;
assembling on the screen a second front panel including the at least one second input variable-icon and the at least one second output variable-icon; and
assembling on the screen a second data flow diagram including the first user-defined-function-icon and the at least one second function-icon and the at least one second input variable-icon and the at least one second output variable-icon, wherein the second diagram displays a second procedure for producing at least one value for the at least one second output variable-icon from at least one value for the at least one second input variable-icon;
whereby a hierarchy of diagrams is produced in which the first diagram is referenced by the first user-defined-function-icon in the second diagram.

103. The method of claim 102 and further comprising the steps of:
assembling on the screen a second user-defined-function-icon that displays on the screen a reference to the second diagram;
selecting from the class of function-icons at least one third function-icon that references at least one third control means for controlling a third function;
selecting at least one third input variable-icon from the class of variable-icons;
selecting at least one third output variable-icon from the class of variable-icons;
assembling on the screen a third front panel including the at least one third input variable-icon and the at least one third output variable-icon; and
assembling on the screen a third data flow diagram including the second user-defined-function-icon and the at least one third function-icon and the at least one third input variable-icon and the at least one third output variable-icon, wherein the third diagram displays a third procedure for producing at least one value for the at least one third output variable-icon from at least one value for the at least one third input variable-icon;

whereby a hierarchy of diagrams is produced in which the first diagram is referenced by the first user-defined-function-icon in the second diagram and the second diagram is referenced by the second user-defined-function-icon in the third diagram.

104. The method of claim 103 and further comprising the steps of:

assembling on the screen a third user-defined-function-icon that displays on the screen a reference to the third diagram;

selecting from the class of function-icons at least one fourth function-icon that references at least one fourth control means for controlling a fourth function;

selecting at least one fourth input variable-icon from the class of variable-icons;

selecting at least one fourth output variable-icon from the class of variable-icons;

assembling on the screen a fourth front panel including the at least one fourth input variable-icon and the at least one fourth output variable-icon; and assembling on the screen a fourth data flow diagram including the third user-defined-function-icon and the at least one fourth function-icon and the at least one fourth input variable-icon and the at least one fourth output variable-icon, wherein the fourth diagram displays a fourth procedure for producing at least one value for at least one fourth output variable-icon from at least one value for the at least one fourth input variable-icon;

whereby a hierarchy of diagrams is produced in which the first diagram is referenced by the first user-defined-function-icon in the second diagram and the second diagram is referenced by the second user-defined-function-icon in the third diagram and the third diagram is referenced by the third user-defined-function-icon in the fourth diagram.

105. The method of claim 104 and further comprising the steps of:

assembling on the screen an (n−1)th user-defined-function-icon that displays on the screen a reference to an (n−1)th data flow diagram, wherein n is an integer and n≧5;

selecting at least one nth function-icon from the class of function-icons;

selecting at least one nth input variable-icon from the class of variable-icons;

selecting at least one nth output variable-icon from the class of variable-icons;

assembling on the screen an nth front panel including the at least one nth input variable-icon and the at least one nth output variable-icon, and assembling on the screen an nth data flow diagram including the (n−1)th user-defined-function-icon and the at least one nth function-icon and the at least one nth input variable-icon and the at least one nth output variable-icon, wherein the nth diagram displays an nth procedure for producing at least one value for the at least one nth output variable-icon from at least one value for the at least one nth input variable-icon;

whereby a hierarchy of diagrams is produced in which the (n−1)th diagram is referenced by the (n−1)th user-defined-function-icon in the nth diagram.

106. The method of claim 102 wherein said step of assembling on the screen a first user-defined-function-icon includes the steps of:

displaying on the screen at least one panel-pattern-icon from a set of respective panel-pattern-icons wherein each respective panel-pattern-icon references a distinct arrangement of panels;

selecting a first panel-pattern-icon from the set of panel-pattern-icons;

displaying on the screen the first panel-pattern-icon and the at least one first input variable-icon;

displaying on the screen the first panel-pattern-icon and the at least one first output variable-icon;

defining an association between at least one first input panel of the first panel-pattern-icon and the at least one first input variable-icon; and defining an association between at least one first output panel of the first panel-pattern-icon and the at least one first output variable-icon.

107. The method of claim 106 and further comprising the step of:

in the course of said step of defining an association between the at least one first input panel of the first panel-pattern-icon and the at least one first input variable-icon, displaying the defined association between the at least one first input panel of the first panel-pattern--icon and the at least one first input variable-icon; and in the course of said step of defining an association between the at least first output panel of the first panel-pattern-icon and the at least one first output variable-icon, displaying the defined association between the at least one first output panel of the first panel-pattern-icon and the at least one first output variable-icon.

108. The method of claim 98 and further comprising the step of:

displaying on the the screen a first menu identifying a class of functions that respectively correspond to the function-icons of the class of function-icons.

109. The method of claim 98 and further comprising the steps of:

displaying on the screen a first menu identifying a class of functions that respectively correspond to the function-icons of the class of function-icons; and displaying on the screen a second menu identifying a class of variables that respectively correspond to the variable-icons of the class of variable-icons.

110. The method of claim 98 and further comprising the step of:

selecting the at least one first control means.

111. The method of claim 110 wherein:

said step of selecting the at least one first control means is performed automatically in the course of said steps of selecting the at least one first function-icon and assembling on the screen the first front panel and assembling on the screen the first diagram.

112. The method of claims 110 or 111 wherein said first control means is substantially implemented in software.

113. The method of claim 110 and further comprising the steps of:

reserving first input variable space in memory of the computer system corresponding to the selected at least one first input variable-icon; and reserving first output variable space in memory of the computer system corresponding to the selected at least one first output variable-icon.

114. The method of claim 113 wherein:
said step of reserving first input variable space is performed automatically in the course of said steps of selecting the at least one first input variable-icon and assembling on the screen the first front panel and assembling on the screen the first diagram; and
said step of reserving first output variable space is performed automatically in the course of said steps of selecting the at least one first output variable-icon and assembling on the screen the first front panel and assembling on the screen the first diagram.

115. The method of claim 113 wherein said step of assembling on the screen the first diagram further includes the steps of displaying on the screen at least one first input arc between the at least one first input variable-icon and the at least one first function-icon and displaying on the screen at least one first output arc between the at least one first output variable-icon and the at least one first function-icon; and further comprising the steps of:
forming first input means for moving respective input values for the at least one first input variable between the at least one first input variable space and the at least one first control means.

116. The method of claim 115 wherein:
said step of forming first input means is performed automatically in the course of said step of displaying on the screen the at least one first input arc.

117. The method of claim 115 wherein:
the at least one first control means and the first input means are substantially implemented in software.

118. The method of claim 115 and further comprising the steps of:
assigning at least one value for each at least one first input variable-icon;
storing in the reserved first input variable space each at least one assigned value;
after said steps of assigning and storing at least one value for each at least one first input variable-icon, moving each at least one value for the at least one first input variable-icon from the reserved first input variable space to the at least one first control means using the first input means;
after said steps of assigning and storing at least one value for each at least one first input variable-icon, producing at least one value for the at least one first output variable-icon using the at least one first control means to control the first function; and
storing each value for the at least one first output variable-icon in the reserved first output variable space.

119. The method of claim 113 and further comprising the steps of:
assigning at least one value for each at least one first input variable-icon;
storing in the reserved first input variable space each at least one assigned value;
after said steps of assigning and storing at least one value for each at least one first input variable-icon, producing at least one value for the at least one first output variable-icon; and
storing each value for the at least one first output variable in the reserved first output variable space.

120. The method of claim 119 wherein:
said step of storing each at least one assigned value is performed automatically in the course of said step of assigning.

121. The method of claim 98 wherein said step of assembling on the screen the first diagram further includes the steps of displaying at least one first input arc between the at least one first input variable-icon and the at least one first function-icon and displaying on the screen at least one first output arc between the at least one first output variable-icon and the at least one first function-icon.

122. The method of claim 98 and further comprising the steps of:
assigning at least one value for each at last one first input variable-icon;
after assigning at least one value for each at least one first input variable-icon, producing at least one value for the at least one first output variable-icon from the at least one value for each at least one first input variable-icon.

123. The method of claim 122 wherein said step of assigning includes the steps of:
displaying said first front panel; and
instructing the at least one first input variable-icon to display the at least one assigned value.

124. The method of claim 123 and further including the step of:
displaying the at least one produced value in conjunction with the at least one first output variable-icon.

125. The method of claim 122 wherein said step of producing at least one value for the at least one first output variable-icon includes using said at least one first control means to control the first function.

* * * * *